US010141349B2

(12) United States Patent
Ishizaki

(10) Patent No.: US 10,141,349 B2
(45) Date of Patent: Nov. 27, 2018

(54) THIN-FILM TRANSISTOR ARRAY, FABRICATION METHOD THEREFOR, IMAGE DISPLAY DEVICE AND DISPLAY METHOD

(71) Applicant: TOPPAN PRINTING CO., LTD., Taito-ku (JP)

(72) Inventor: Mamoru Ishizaki, Taito-ku (JP)

(73) Assignee: TOPPAN PRINTING CO., LTD., Taito-ku (JP)

(*) Notice: Subject to any disclaimer, the term of this patent is extended or adjusted under 35 U.S.C. 154(b) by 135 days.

(21) Appl. No.: 14/980,314

(22) Filed: Dec. 28, 2015

(65) Prior Publication Data

US 2016/0211280 A1   Jul. 21, 2016

Related U.S. Application Data

(63) Continuation of application No. PCT/JP2014/002961, filed on Jun. 3, 2014.

(30) Foreign Application Priority Data

Jun. 27, 2013 (JP) .................................. 2013-135224
Jul. 16, 2013 (JP) .................................. 2013-147561

(51) Int. Cl.
*H01L 27/12* (2006.01)
*G09G 3/34* (2006.01)
(Continued)

(52) U.S. Cl.
CPC ...... *H01L 27/1244* (2013.01); *G02F 1/13624* (2013.01); *G02F 1/136259* (2013.01);
(Continued)

(58) Field of Classification Search
CPC ........... G02F 1/13624; G02F 1/136259; G02F 1/136213; G02F 2001/136263;
(Continued)

(56) References Cited

U.S. PATENT DOCUMENTS 5,825,438 A   10/1998   Song et al.
5,946,063 A    8/1999   Izumi
(Continued)

FOREIGN PATENT DOCUMENTS

JP        63-289534 A    11/1988
JP         6-67208 A     3/1994
(Continued)

OTHER PUBLICATIONS

Extended Search Report dated Feb. 23, 2017 in European Patent Application No. 14817706.6.
International Search Report dated Aug. 26, 2014, in PCT/JP2014/002961, filed Jun. 3, 2014.

*Primary Examiner* — Christopher E Leiby
(74) *Attorney, Agent, or Firm* — Oblon, McClelland, Maier & Neustadt, L.L.P.

(57) ABSTRACT

A thin-film transistor array includes thin-film transistors each including an insulating substrate which is formed with a gate electrode, a gate wiring, a capacitor electrode and a capacitor wiring. A source electrode and a drain electrode having a gap therebetween and including a semiconductor pattern are formed, in a region overlapping with the gate electrode on the substrate via a gate insulator, with the semiconductor pattern being covered with a protective layer. Two such TFTs are independently formed for each pixel. In each pixel, two source electrodes are separately connected to two respective source wirings, and two drain electrodes are connected to an electrode of the pixel via individual drain-connecting electrodes. The array includes source-connecting electrodes each connecting between the source electrodes of the two TFTs formed for each pixel. The same drive waveform is applied to the two source wirings.

7 Claims, 36 Drawing Sheets

(51) Int. Cl.
*G09G 3/36* (2006.01)
*G02F 1/1362* (2006.01)

(52) U.S. Cl.
CPC .......... *G09G 3/344* (2013.01); *G09G 3/3688* (2013.01); *H01L 27/124* (2013.01); *H01L 27/1218* (2013.01); *H01L 27/1248* (2013.01); *H01L 27/1255* (2013.01); *H01L 27/1259* (2013.01); *G02F 1/136213* (2013.01); *G02F 2001/136263* (2013.01); *G02F 2001/136272* (2013.01); *G02F 2201/50* (2013.01); *G09G 2300/0426* (2013.01); *G09G 2300/0819* (2013.01); *G09G 2320/0204* (2013.01); *G09G 2320/0233* (2013.01); *G09G 2330/08* (2013.01)

(58) Field of Classification Search
CPC ..... G02F 2001/136272; G02F 2201/50; H01L 27/124; H01L 27/1255; H01L 27/1248; H01L 27/1244; H01L 27/1218; H01L 27/1259; G09G 3/3688; G09G 3/344; G09G 2330/08; G09G 2320/0233; G09G 2320/0204; G09G 2300/0819; G09G 2300/0426
See application file for complete search history.

(56) References Cited

U.S. PATENT DOCUMENTS

| 8,389,988 | B2* | 3/2013 | Yamazaki | H01L 27/0248 257/102 |
|---|---|---|---|---|
| 2001/0028429 | A1 | 10/2001 | Wu | |
| 2008/0002076 | A1 | 1/2008 | Yagi et al. | |
| 2008/0239189 | A1* | 10/2008 | Hatta | H01L 29/7869 349/46 |
| 2011/0227097 | A1 | 9/2011 | Tsubata et al. | |
| 2012/0001189 | A1* | 1/2012 | Matsubara | G02F 1/136286 257/59 |

FOREIGN PATENT DOCUMENTS

| JP | 7-199221 A | 8/1995 |
|---|---|---|
| JP | 9-090408 A | 4/1997 |
| JP | 10-133228 A | 5/1998 |
| JP | 2002-23132 A | 1/2002 |
| JP | 2002-350901 A | 12/2002 |
| WO | WO 2006/064832 A1 | 6/2006 |
| WO | WO 2009/078200 A1 | 6/2009 |

* cited by examiner

FIG.2
(a)
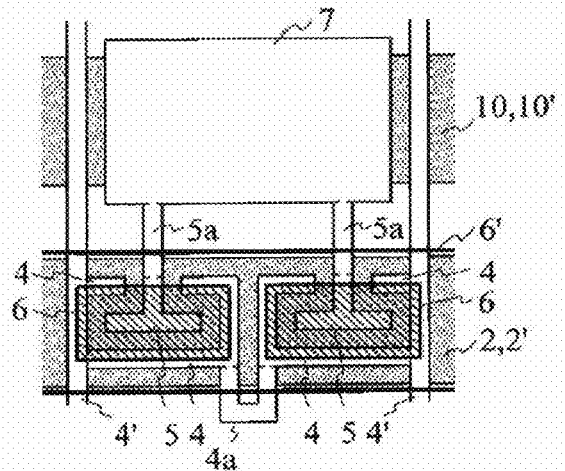
(b)
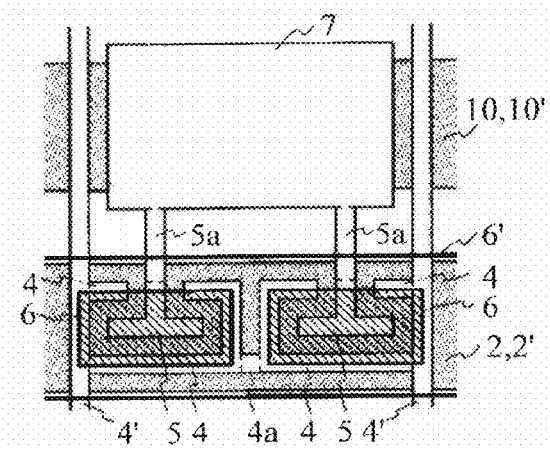
(c)
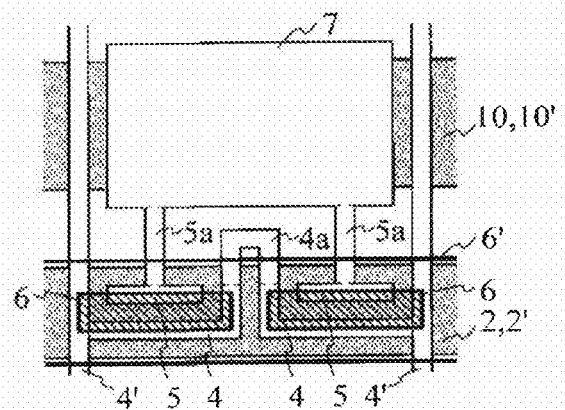

FIG.9B
(d)
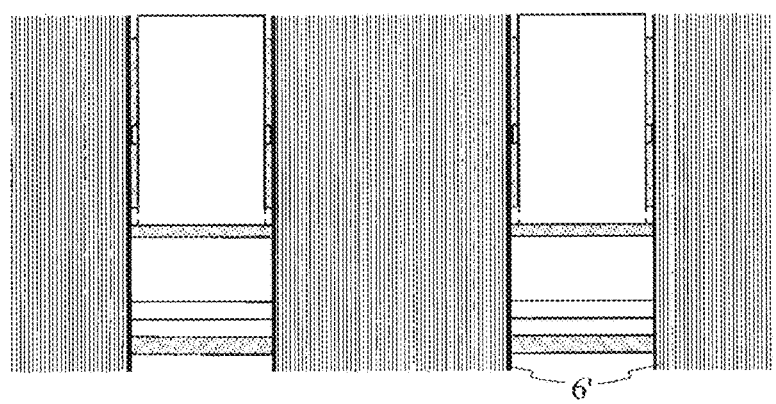
(e)
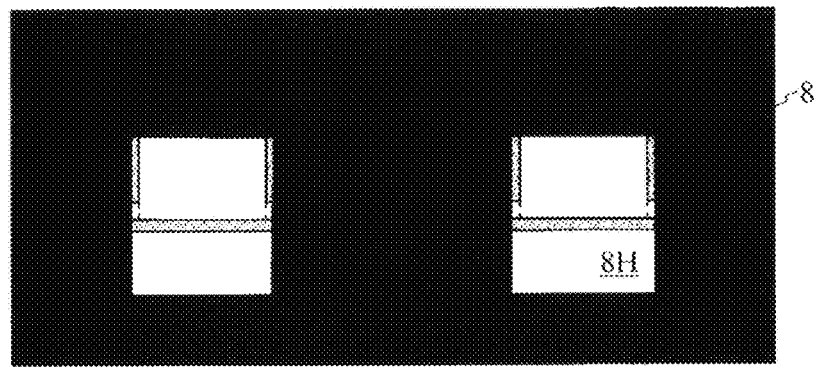
(f)
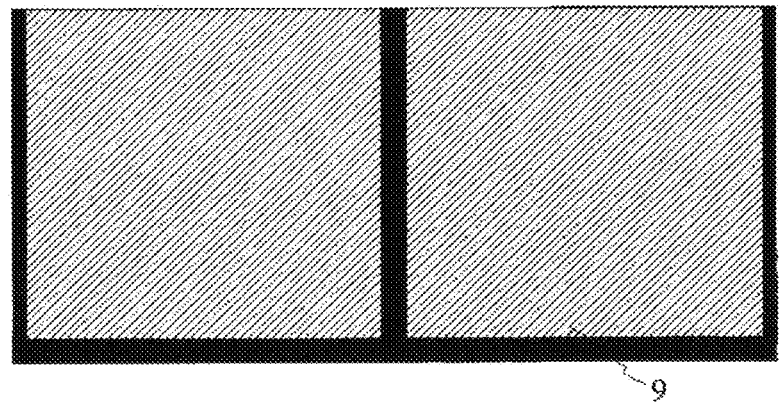

FIG.11A
(a)
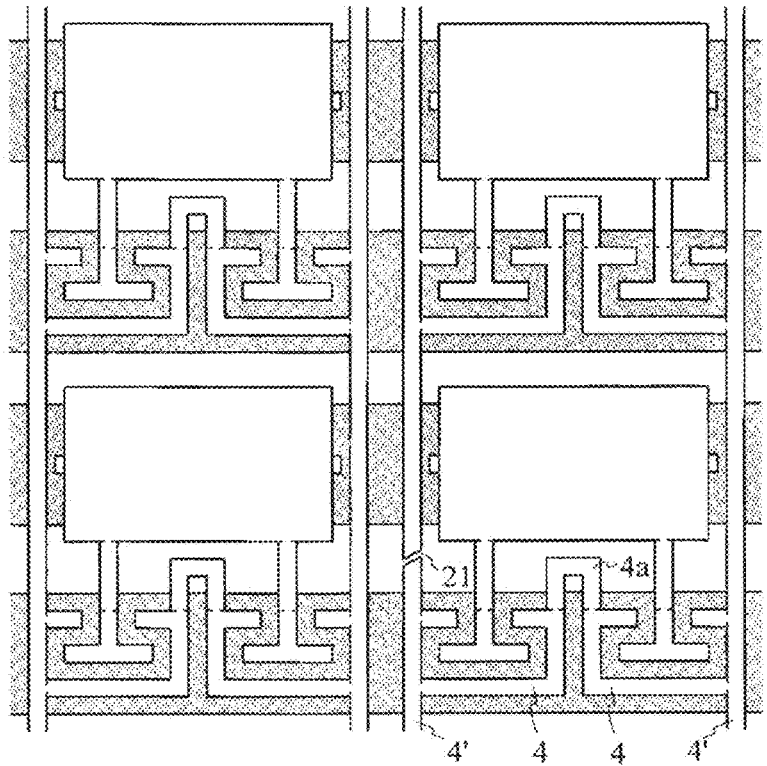
(b)
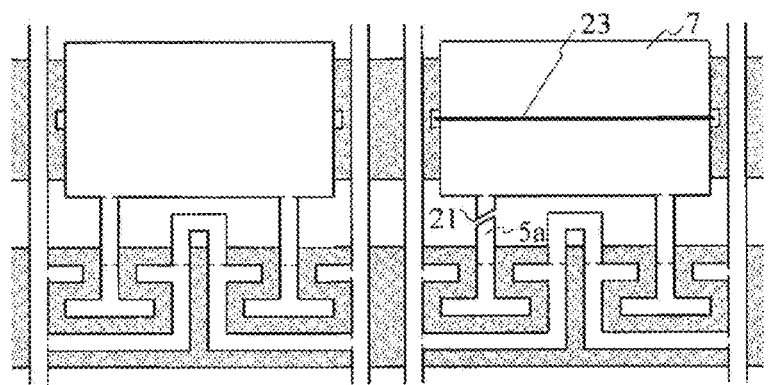

FIG.12A
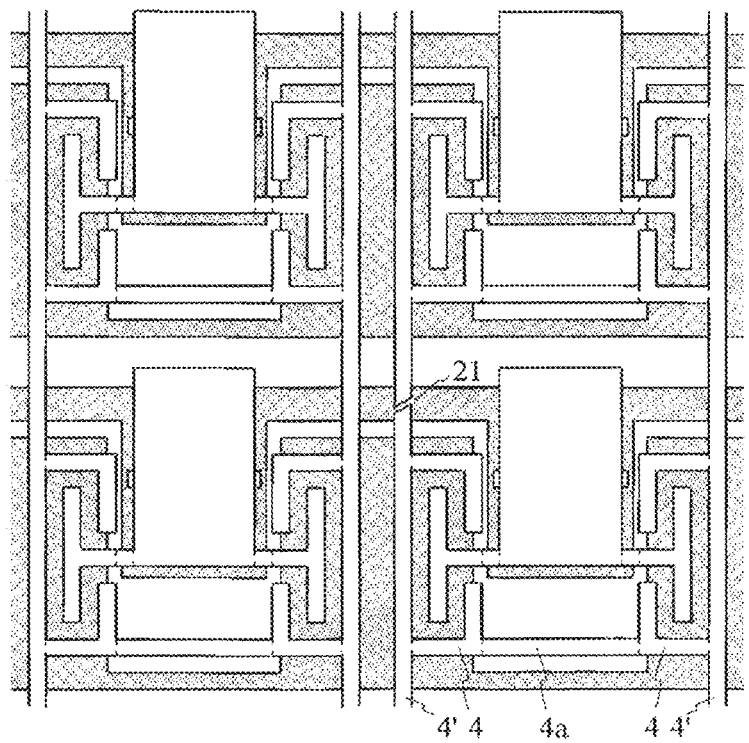
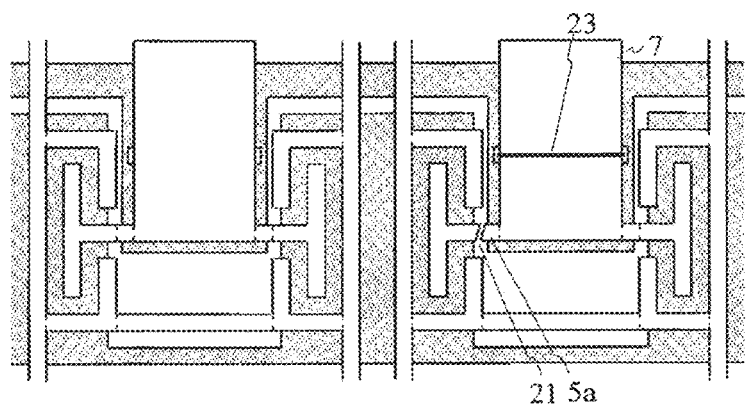

THIN-FILM TRANSISTOR ARRAY, FABRICATION METHOD THEREFOR, IMAGE DISPLAY DEVICE AND DISPLAY METHOD

CROSS-REFERENCE TO RELATED APPLICATIONS

The present application is a continuation of International Application No. PCT/JP2014/002961, filed Jun. 3, 2014, which is based upon and claims the benefits of priority to Japanese Applications No. JP2013-135224, filed Jun. 27, 2013 and No. JP2013-147561, filed Jul. 16, 2013. The entire contents of all of the above applications are incorporated herein by reference.

BACKGROUND OF THE INVENTION

Field of the Invention

The present invention relates to a thin-film transistor array and in particular to a thin-film transistor array suitable for flexible substrates or printing methods.

Discussion of the Background

Thin-film transistor (TFT) arrays of amorphous silicon (a-Si) or polysilicon (poly-Si) are fabricated on the basis of the technique of fabricating transistors or integrated circuits having semiconductors as substrates. Such TFT arrays are applied to liquid crystal displays, electrophoretic displays or the like. When a TFT, which plays the role of a switch, is turned on by a selected voltage applied to the gate wiring, a signal voltage supplied to the source wiring is applied to a pixel electrode connected to the drain. The applied voltage is retained in a storage capacitor configured by a pixel electrode, a gate insulator film and a capacitor electrode. The voltage from the capacitor wiring is applied to capacitor electrode. In the case of a TFT array, the functions of the source and the drain depend on the polarity to be applied to. Therefore, source and drain cannot be named by the characteristics of the functions. For convenience herein, one terminal is termed as a source and the other terminal is termed as a drain throughout the specification. In the present invention, the terminal connected to a wiring is referred to as a source and the terminal connected to a pixel electrode is referred to as a drain.

When thin-film transistor arrays are used as display elements, short circuits or disconnections in a wiring can cause line defects or point defects. In this regard, some methods are proposed to reduce the influence of the defects or to correct the defects.

PTL 1 discloses that cross-bridges 31 are added to the source wirings 4' to form a ladder pattern to eliminate the influence of disconnections in the source wirings 4' (FIG. 19). However, this disclosure makes no mention of how the short circuit defects are corrected.

PTL 2 discloses a transistor array that includes two TFTs per pixel (FIG. 20). When one of the two TFTs causes a short circuit between its source electrode 4 and drain electrode 5, the TFT in question is cut off by using a laser to reduce the influence of the short circuit. In this case, however, there are problems that the on-state current is reduced to half and the gate feedthrough voltage is reduced.

The problem that the on-state current is reduced to half causes no influence if the transistor array is overdesigned such that one TFT can suffice. If the transistor array is not overdesigned, the shortage of the on-state current leads to insufficient voltage.

Reducing the number of TFTs to one will also reduce the gate-drain capacity to the capacity of one TFT. Therefore, use of only one TFT reduces the gate feedthrough voltage that causes pixel potential change when the gate potential is turned off. When the gate feedthrough voltage is not negligible, the gate feedthrough voltage is required to be cancelled. To this end, the reference potential of a counter electrode is offset by an amount equivalent to the gate feedthrough voltage. However, the offset has to be performed on the premise that the gate feedthrough voltages of all the pixels are equal. With a pixel in which one of the TFTs is cut off, the gate feedthrough voltage is reduce to substantially half. Accordingly, about a half of the gate feedthrough voltage is constantly applied across the counter electrode and the pixel, creating a problem of causing a slight change in display in the case of an electrophoretic display. In the case of a liquid crystal display, there is a problem that DC components are applied to the liquid crystal and seizing is likely to occur.

Further, there is no mention of a way of coping with a short circuit or the like occurring in portions such as between a source wiring and a pixel electrode, other than a portion between a source electrode and a drain electrode.

PLT 1: JP-A-H10-133228
PLT 2: JP-A-H07-199221

SUMMARY OF THE INVENTION

According to one aspect of the present invention, a thin-film transistor array includes thin-film transistors each having a configuration in which a gate electrode, a gate wiring connected to the gate electrode, capacitor electrode, and a capacitor wiring connected to the capacitor electrode are provided on an insulating substrate, with a source electrode and a drain electrode having a gap therebetween and including a semiconductor pattern being formed, in a region overlapping with the gate electrode via a gate insulator film, the semiconductor pattern being covered with a protective layer, two such thin-film transistors being independently formed for each pixel, two source electrodes in each pixel being separately connected to two respective source wirings, two drain electrodes being connected to an electrode of the pixel via individual drain-connecting electrodes. The thin-film transistors include two thin-film transistors being independently formed for each pixel, two source electrodes in each pixel being separately connected to two respective source wirings, two drain electrodes being connected to an electrode of the pixel via individual drain-connecting electrodes. The thin-film transistor array includes source-connecting electrodes each connecting between the source electrodes of the two thin-film transistors formed for each pixel.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a plan view illustrating an example of another thin-film transistor array according to the first embodiment of the present invention;

FIG. 9B is a plan view illustrating an example of a repair process for the thin-film transistor array according to the fourth embodiment of the present invention;

FIG. 11A is a plan view illustrating an example of a repair process for the thin-film transistor array according to the third embodiment of the present invention;

FIG. 12A is a plan view illustrating an example of a repair process for the thin-film transistor array according to the fourth embodiment of the present invention;

DESCRIPTION OF THE EMBODIMENTS

Figure 1A:
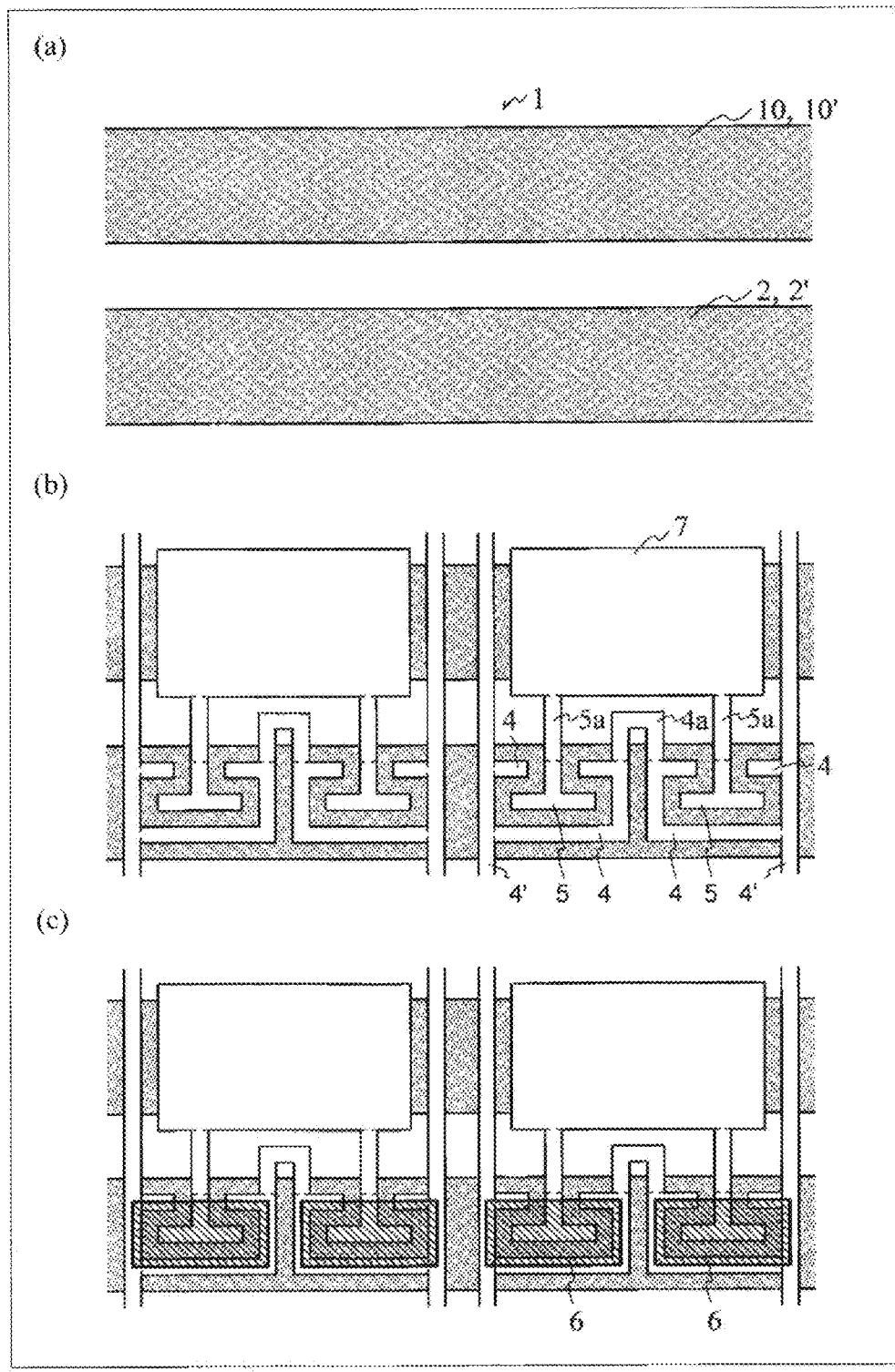
FIG. 1A is a plan view illustrating an example of a thin-film transistor array according to a first embodiment of the present invention.

The embodiments will now be described with reference to the accompanying drawings, wherein like reference numerals designate corresponding or identical elements throughout the various drawings.

With reference to the drawings, hereinafter are described several embodiments of the present invention. In the drawings referred to in the description, figures are not drawn to scale for the sake of clarity. For example, source electrodes or drain electrodes are drawn larger and pixel electrodes are drawn smaller.

First Embodiment

Referring to FIGS. 1A to 1C and FIG. 2, hereinafter is described a thin-film transistor array according to a first embodiment of the present invention. FIGS. 1A to 1C and FIG. 2 each show an example of a thin-film transistor array. The thin-film transistor array includes an insulating substrate 1 which is provided thereon with gate electrodes and gate wirings 2' connected to the respective gate electrodes 2, as well as capacitor electrodes 10, and capacitor wirings 10' connected to the respective capacitor electrodes 10, and includes a gate insulator film (not shown). In the array, each pixel includes two sets of source electrode 4 and drain electrode 5 having gaps in a region on the gate insulator film so as to overlap with the gate electrode 2 as viewed from above. Each pixel also includes a semiconductor pattern 6 at least between the gap between the source electrode 4 and the drain electrode 5. The two source electrodes 4 are individually connected to respective source wirings 4'. The two drain electrodes 5 are connected to one pixel electrode 7 via two respective drain-connecting electrodes 5a. The pixel electrode 7 overlaps with at least the capacitor electrode 10. The thin-film transistors are provided with a protective layer 6' covering at least the semiconductor patterns 6. Each transistor has a source-connecting electrode 4a for connecting between the two source electrodes 4, with the same drive waveform being applied to the two source wirings 4'.

Figure 1B:
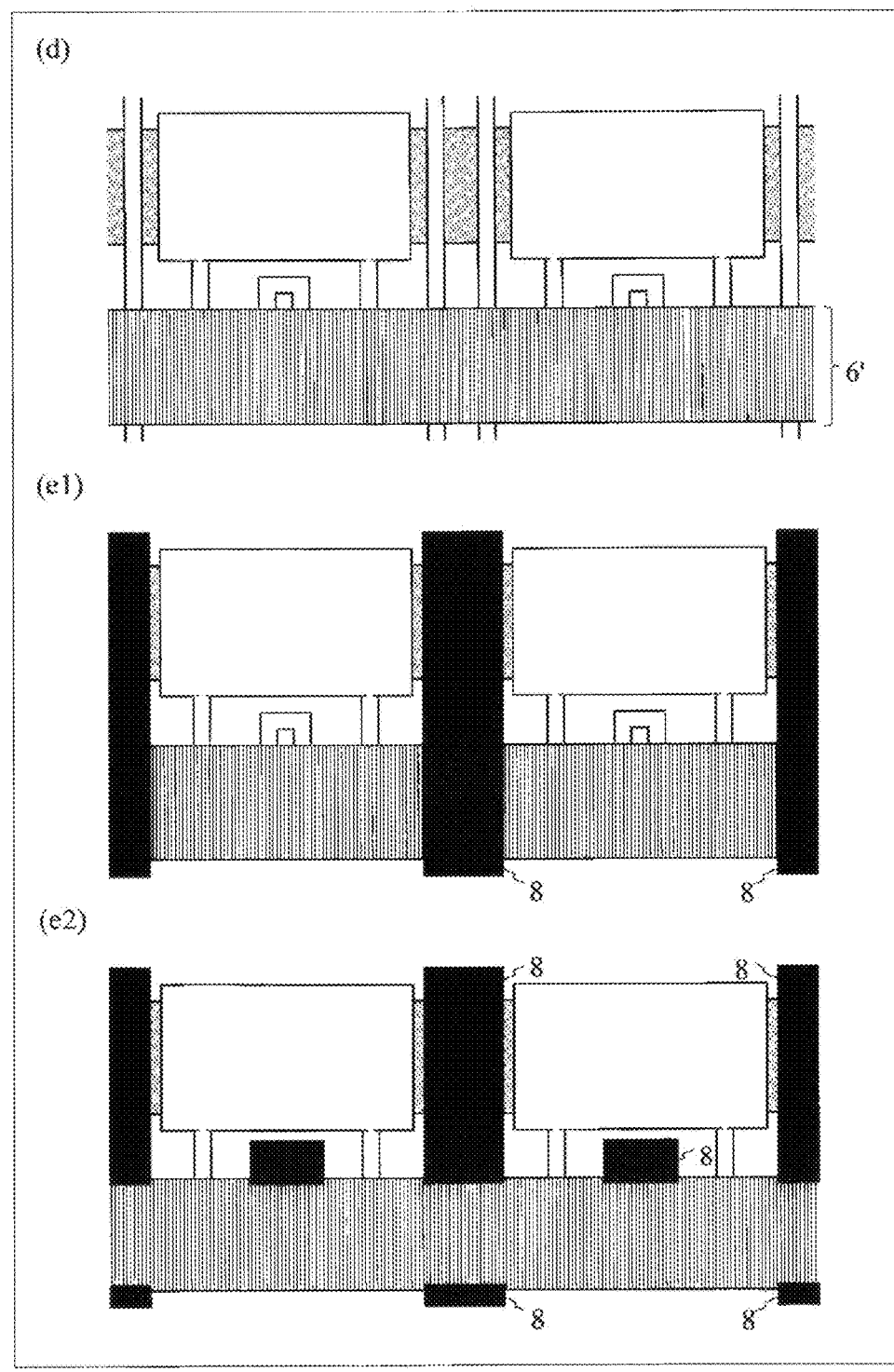
FIG. 1B is a plan view illustrating an example of the thin-film transistor array according to the first embodiment of the present invention.
Figure 1C:
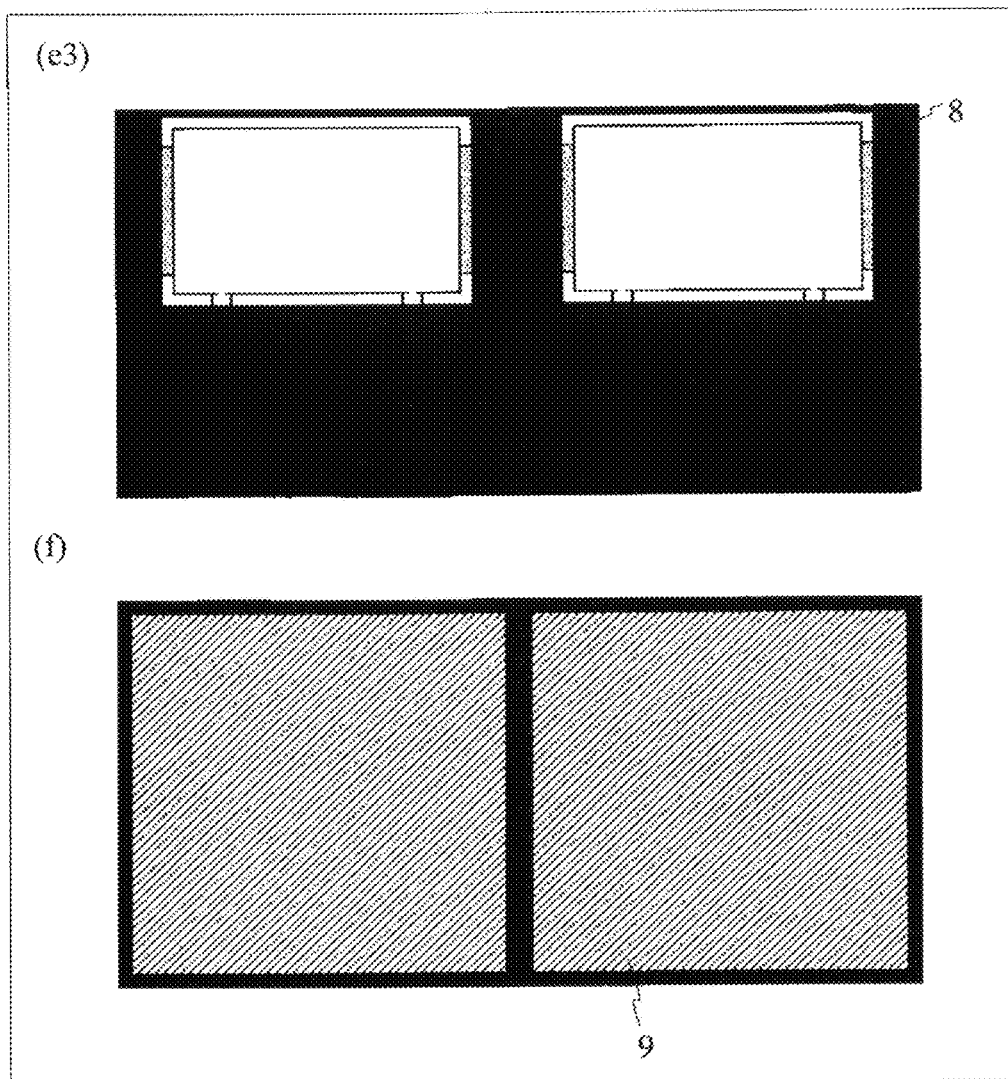
FIG. 1C is a plan view illustrating an example of the thin-film transistor array according to the first embodiment of the present invention.

FIG. 1A shows in (a) a plan view in which the gate electrode 2, the gate wiring 2', the capacitor electrode 10 and the capacitor wiring 10' are formed on the insulating substrate 1. FIG. 1A shows in (b) a plan view in which the gate insulator film (not shown) is formed on the resultant object, followed by forming thereon the source electrode 4, the source wiring 4', the source-connecting electrode 4a, the drain electrode 5, the drain-connecting electrode 5a, and the pixel electrode 7. The gate electrode 2 and the gate wiring 2' are in a common stripe pattern, while the capacitor electrode 10 and the capacitor wiring 10' are also in a common stripe pattern. The stripe pattern of the gate electrode 2 as the gate wiring 2' and the stripe pattern of the capacitor electrode 10 as the capacitor 10' can provide an advantage of not being influenced by the horizontal offset of an upper-layer pattern relative to this layer. FIG. 1A shows in (c) a plan view after formation of the semiconductor patterns 6. The semiconductor patterns 6 are arranged in a dot pattern on the gate electrode 2 as the gate wiring 2' so as to cover the gap between the source electrode 4 and the drain electrode 5. FIG. 1B shows in (d) a plan view after forming the protective layer 6'. The protective layer 6' plays a role of protecting the semiconductor patterns 6 from the components of a display medium 13 or an insulating film 8 described later. The protective layer 6' is formed covering at least the semiconductor patterns 6. Desirably, the protective layer 6' is in a stripe pattern which is continuous over a plurality of TFTs and parallel to the direction of the gate wiring 2', and has a uniform width. The stripe pattern with a uniform width can provide an advantage of not being influenced by the horizontal offset of the protective layer 6' relative to the lower-layer pattern, i.e. the source and drain electrodes 4 and 5 and the semiconductor patterns 6. FIG. 1B shows in (e1) and (e2) and FIG. 1C shows in (e3) a plan view in which the insulating film 8 is further formed. FIG. 1B shows in (e1) that the insulating film 8 is in a stripe pattern of a uniform width covering the source wiring 4'. In this case, there is an advantage of not being influenced by the vertical offset of the insulating film 8 relative to the source wiring 4' as viewed perpendicularly from above (offset in a direction parallel to the source wiring 4'). FIG. 1B shows in (e2) that the insulating film 8 is in a dot pattern covering the source wiring 4'. FIG. 1C shows in (e3) that the insulating film 8 is in a lattice pattern covering the source wiring 4' and the protective layer 6'. Desirably, the insulating film 8 covers the gate electrode 2 as the gate wiring 2' and more desirably also covers the source-connecting electrodes 4a. The insulating film 8 plays a role of preventing a voltage of the source wiring 4' or the like from adversely affecting display. As shown in FIG. 1C by (f), upper pixel electrodes 9 may be formed. The upper pixel electrodes 9 have a space therebetween which is smaller than the width of the protective layer 6' or the width of the insulating film 8 to exert an effect of increasing an area ratio (opening ratio) of a region effective for display in a pixel pitch.

Referring to FIGS. 5A to 5D, measures against disconnections or short circuits will be described. The thin-film transistor array of the first embodiment has the source-connecting electrodes 4a. Therefore, if a disconnection occurs in any of the source wirings 4', the source electrodes 4 and the source-connecting electrodes 4a, the source voltage can be supplied, as it is, to the source electrodes 4 after the occurrence of the disconnection.

Figure 5A:
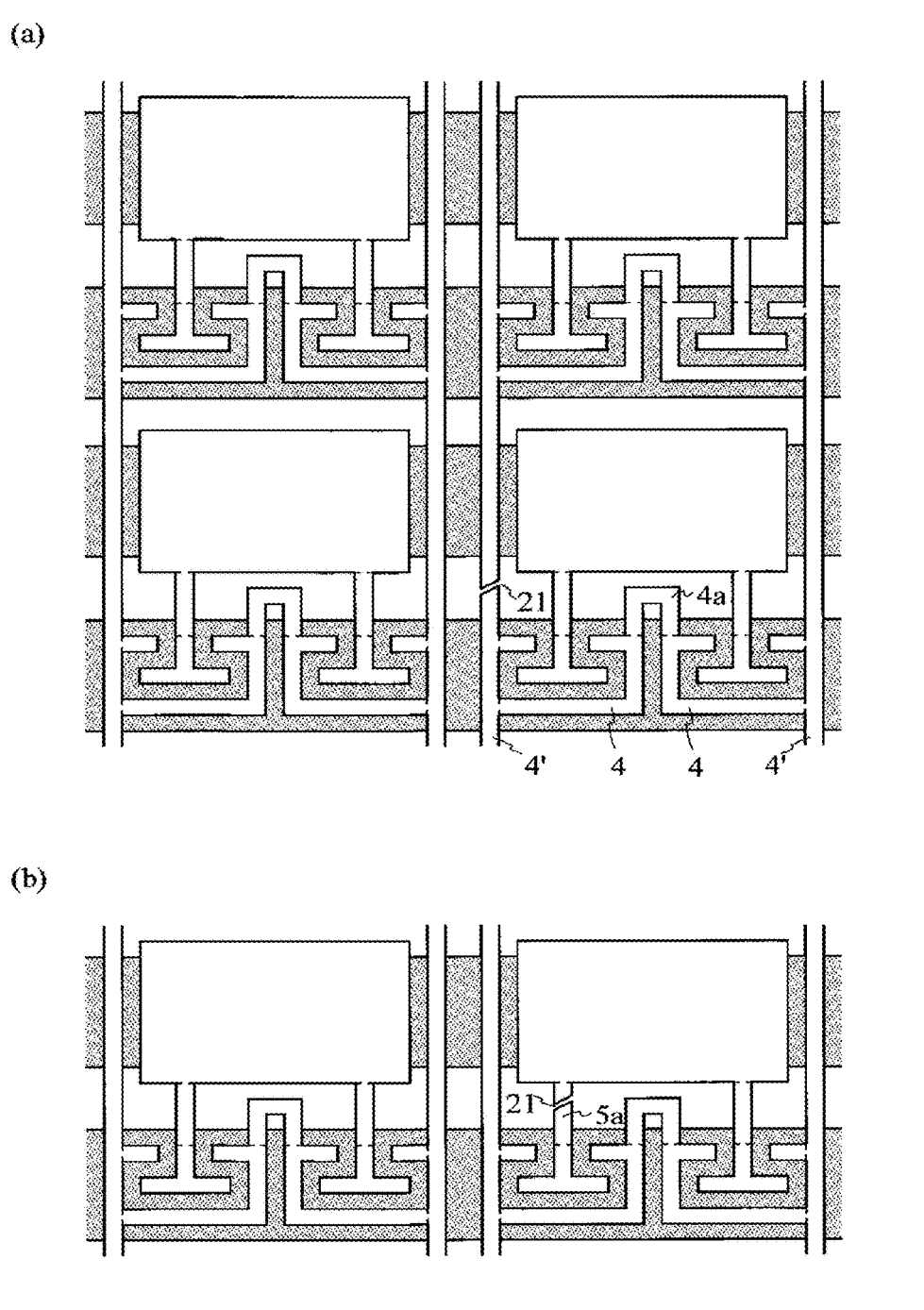
FIG. 5A is a plan view illustrating an example of a repair process for the thin-film transistor array according to the first embodiment of the present invention.

For example, when current is supplied to the source wiring 4' upward as viewed in (a) of FIG. 5A and there is a disconnection 21 in the left source wiring 4', current is supplied from immediately above the disconnection 21 through the right source wiring 4'→right source electrode 4→source-connecting electrode 4a→left source electrode 4→left source wiring 4', and thus the disconnection 21 produces no adverse effect. Since the source-connecting electrode 4a connects between the two source electrodes 4, there is no need of separately providing a cross-bridge that connects between the two source wirings 4', thereby increasing the opening rate.

Further, since one pixel has two TFTs, if a disconnection 21 occurs in one drain-connecting electrode 5a to interrupt the on-state current (see (b) of FIG. 5A) or if a disconnection occurs in the source electrode 4 or the drain electrode 5 to reduce the on-state current, the other TFT can write to.

Further, if a short circuit occurs, the undesirable consequences can be avoided by performing laser cutting. The laser cutting can be easily applied to metal because metal easily absorbs light, but cannot be easily applied to an insulating film because the insulating film does not easily absorb light. When a metal electrode is located uppermost, laser cutting can be easily performed because metal is easily evaporated. When an insulating film is located on a metal electrode, light passes through the insulating film and is irradiated to the metal electrode for evaporation from between the voids of the insulating film, although the insulating film will be damaged. Thus, laser cutting can be performed in this case as well. However, in the case of a laminate structure of metal, insulating film and metal, it is true that laser cutting can be conducted for the upper layer metal electrode, but the laser cutting in this case damages the insulating film and thus the withstand voltage across the upper metal electrode and the lower metal electrode may be impaired. Further, since the upper layer metal is easily evaporated, it is difficult to connect the upper and lower metals by laser. Since semiconductors absorb some light, laser cutting can be conducted.

Figure 5B:
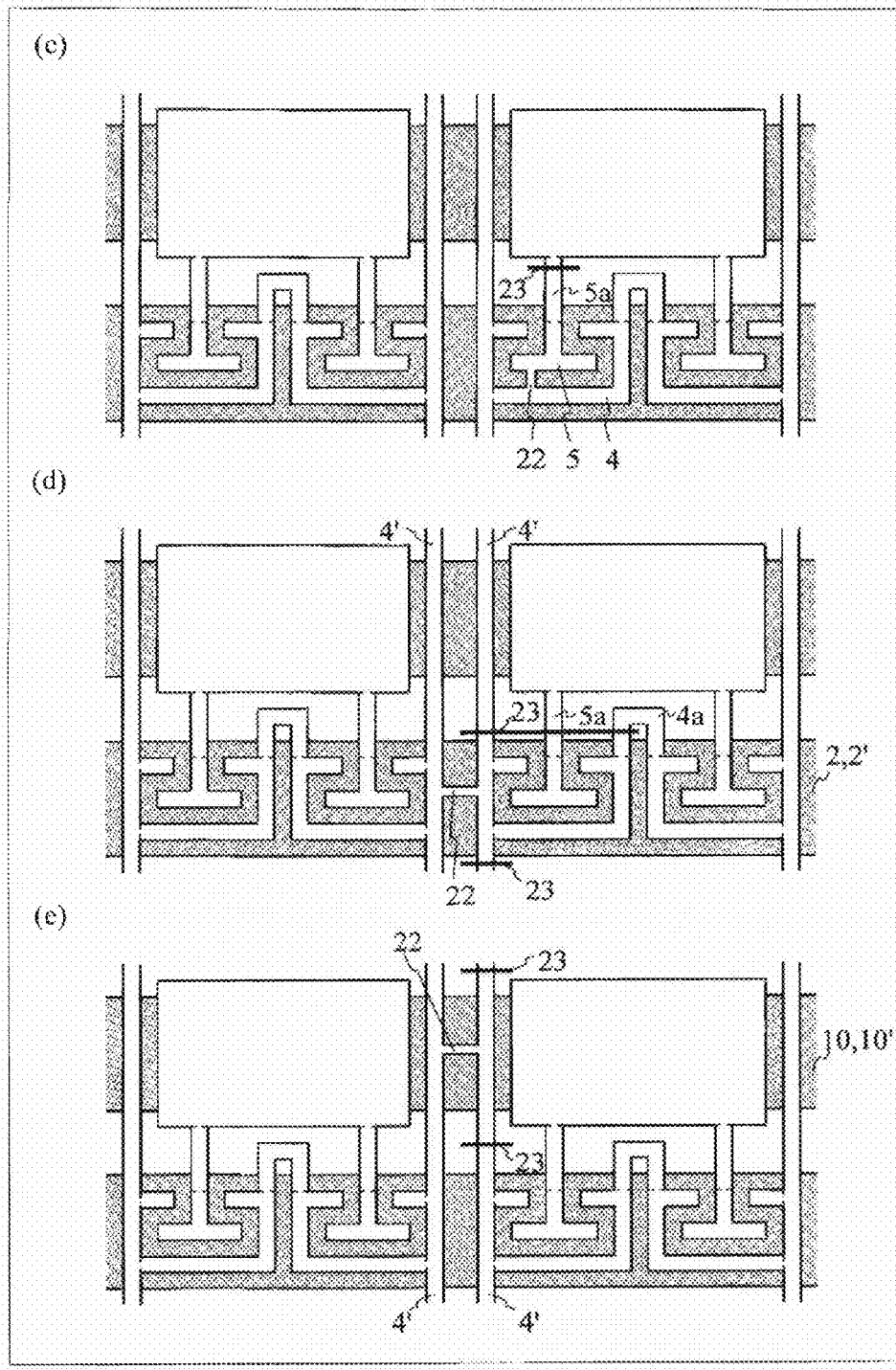
FIG. 5B is a plan view illustrating an example of a repair process for the thin-film transistor array according to the first embodiment of the present invention.

If a short circuit 22 occurs between the source electrode 4 and the drain electrode 5 (see (c) of FIG. 5B), the drain-connecting electrode 5a of the TFT is cut at a position 23 not overlapping with the gate electrode 2 as the gate wiring 2' or the capacitor electrode 10 as the capacitor wiring 10'. This can avoid a point defect that is caused when the source voltage is directly applied to the pixel electrode 7. The voltage can be applied to the pixel electrode 7 by the other TFT.

If a short circuit 22 occurs between adjacent source wirings 4' on the gate electrode 2 as the gate wiring 2' (see (d) of FIG. 5B), cutting is conducted in two upper and lower portions sandwiching the short circuited portion on the source wiring 4', and in the drain- and source-connecting electrodes 5a and 4a of the transistor located nearest the short circuited portion, at positions 23 not overlapping with the gate electrode 2 as the gate wiring 2' or the capacitor electrode 10 as the capacitor wiring 10'. The cutting only has to be conducted for at least one of the two short-circuited source wirings 4'. Thus, the source driver is prevented from being broken or the display is prevented from having a line defect.

If a short circuit 22 occurs between adjacent source wirings 4' on the capacitor electrode 10 as the capacitor wiring 10' (see (e) of FIG. 5B), cutting is conducted in two upper and lower positions sandwiching the short circuited portion on the source wiring 4', at positions 23 not overlapping with the gate electrode 2 as the gate wiring 2' or the capacitor electrode 10 as the capacitor wiring 10'. The cutting only has to be conducted for at least one of the two short-circuited source wirings 4'. Thus, the source driver is prevented from being broken or the display is prevented from having a line defect.

Figure 5C:
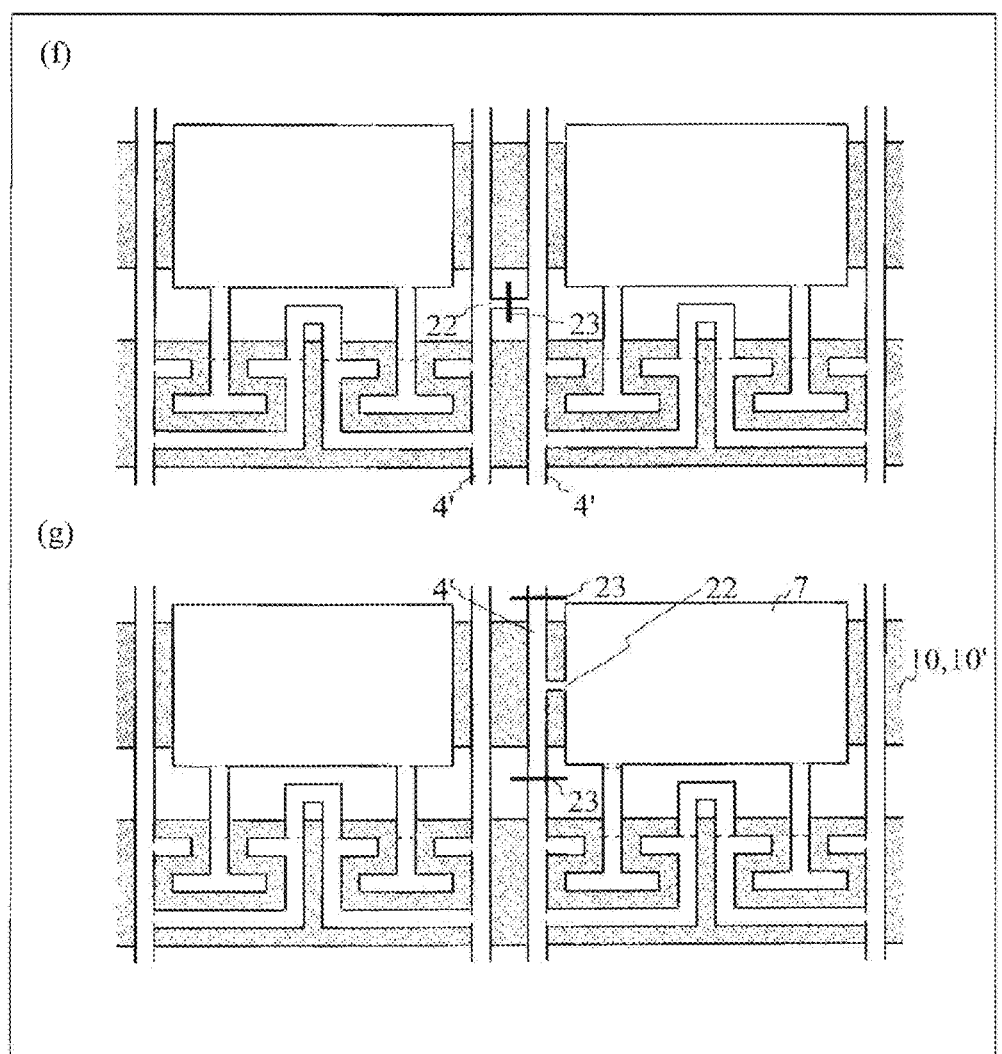
FIG. 5C is a plan view illustrating an example of a repair process for the thin-film transistor array according to the first embodiment of the present invention.

If a short circuit 22 occurs between adjacent source wirings 4' at a position not overlapping with the gate electrode 2 as the gate wiring 2' or the capacitor electrode 10 as the capacitor wiring 10' (see (f) of FIG. 5C), cutting is conducted at any position 23 in the short circuited portion. Thus, the source driver is prevented from being broken or the display is prevented from having a line defect.

If a short circuit 22 occurs between the source wiring 4' and the pixel electrode 7 on the capacitor electrode 10 as the capacitor wiring 10' (see (g) of FIG. 5C), cutting is conducted in two upper and lower portions sandwiching the short circuited portion on the source wiring 4', at positions 23 not overlapping with the gate electrode 2 as the gate wiring 2' or the capacitor electrode 10 as the capacitor wiring 10'. This can avoid a point defect that is caused when the source voltage is directly applied to the pixel electrode 7.

Figure 5D:
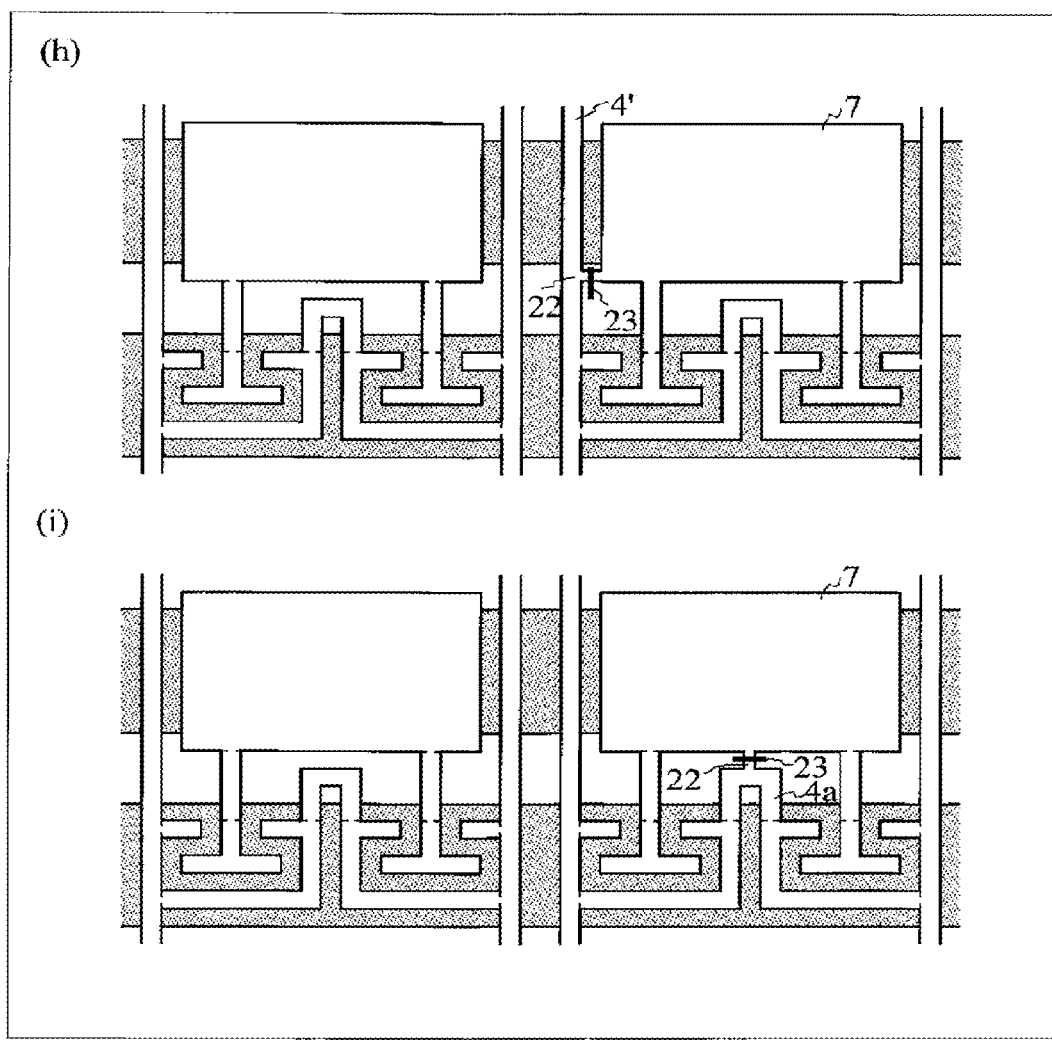
FIG. 5D is a plan view illustrating an example of a repair process for the thin-film transistor array according to the first embodiment of the present invention.

If a short circuit 22 occurs between the source wiring 4' and the pixel electrode 7 at a position not overlapping with the gate electrode 2 as the gate wiring 2' or the capacitor electrode 10 as the capacitor wiring 10' (see (h) of FIG. 5D), cutting is conducted at any position 23 in the short circuited portion. This can avoid a point defect that is caused when the source voltage is directly applied to the pixel electrode 7.

If a short circuit 22 occurs between the pixel electrode 7 and the source-connecting electrode 4a (see (i) of FIG. 5D), cutting is conducted in the short circuited portion, at a position 23 not overlapping with the gate electrode 2 as the gate wiring 2' or the capacitor electrode 10 as the capacitor wiring 10'. This can avoid a point defect that is caused when the source voltage is directly applied to the pixel electrode 7.

If a short circuit has occurred or possibly occurs between the source wiring 4' or the source electrode 4 and the gate electrode 2 as the gate wiring 2', cutting can be conducted, similar to (d) of FIG. 5B, in two upper and lower portions of the source wiring 4' and in the drain- and source-connecting electrodes 5a and 4a, at positions 23 not overlapping with the gate electrode 2 as the gate wiring 2' or the capacitor electrode 10 as the capacitor wiring 10'. Thus, the driver is prevented from being broken or the display is prevented from having a cross-line defect. However, this short circuit cannot necessarily be detected through an image inspection.

If a short circuit has occurred or possibly occurs between the source wiring 4' or the source electrode 4 and the capacitor electrode 10 as the capacitor wiring 10', cutting can be conducted, similar to (g) of FIG. 5C, in two upper and lower portions in the source wiring 4', at positions 23 not overlapping with the gate electrode 2 as the gate wiring 2' or the capacitor electrode 10 as the capacitor wiring 10'. Thus, the source driver is prevented from being broken or the display is prevented from having a line defect. However, again, this short circuit cannot necessarily be detected through an image inspection.

In FIGS. 1A to 1C, the source-connecting electrode 4a has a portion which does not overlap at all with the gate electrode 2 as the gate wiring 2'. The expression "portion which does not overlap at all" means that the portion of the source-connecting electrode 4a does not overlap at all with the gate electrode 2 as the gate wiring 2' in respect of a width direction of the portion. Thus, when the source-connecting electrode 4a is laser-cut, laser is not required to be applied to the portion overlapping with the gate electrode 2 as the gate wiring 2' and accordingly the gate-source withstand voltage is not lowered. On the other hand, if the source-connecting electrode 4a partially overlaps with the gate electrode 2 as the gate wiring 2' (see (b) of FIG. 2), laser has to be applied to the portion overlapping with the gate electrode 2 as the gate wiring 2'. As a result, in laser-cutting the source-connecting electrode 4a, the gate-source withstand voltage may be lowered.

In FIGS. 1A to 1C, the source-connecting electrode 4a is located on the same side as the drain-connecting electrode 5a is located relative to the gate electrode 2 as the gate wiring 2', when viewed perpendicularly from above. In this regard, as shown in FIG. 2 by (a), the source-connecting electrode 4a may be located on the opposite side of the drain-connecting electrode 5a relative to the gate electrode 2 as the gate wiring 2', when viewed perpendicularly from above. Further, the shapes of the source electrode 4 and the drain electrode 5 are not limited to the ones shown in FIG. 1A by (b). For example, the shapes of these electrodes may be as shown in FIG. 2 by (c). The semiconductor patterns 6 may be mutually independent dots in each TFT. Alternatively, the semiconductor patterns 6 corresponding to two TFTs connected to the same pixel electrode may form one continuous dot (not shown). In this case, one print pattern has an area larger by a factor of two or more. Accordingly, when the supply amount of a semiconductor ink is uneven, the film thickness will be uniform and thus unevenness can be reduced.

Referring to FIGS. 1A to 1C, a method for fabricating the thin-film transistor array of the first embodiment will be described. First, the gate electrode 2 as the gate wiring 2' and the capacitor electrode 10 as the capacitor wiring 10' in a stripe pattern of an even width are formed on the insulating substrate 1 (see (a) of FIG. 1A). As the insulating substrate 1, a rigid member, such as a glass substrate, may be used, or a flexible member may be used, which is made such as of polyethylene terephthalate (PET), polyethylene naphthalate (PEN), polyimide (PI), polyetherimide (PEI), or polyethersulfone (PES). Materials that can be used for the gate electrode 2, the gate wiring 2', the capacitor electrode 10 and the capacitor wiring 10' include metals, such as Al, Ag, Cu, Cr, Ni, Mo, Au and Pt, electrically conductive oxides, such as ITO, carbon, electrically conductive polymers, and the like. As the fabrication method that can be used, mention can be made of printing/baking an ink, applying overall coating, followed by photolithography, etching and resist separation, or a method of applying overall coating, followed by resist printing, etching and resist separation.

Then, a gate insulator film (not shown) is formed over the entire surface. Materials that can be used for the gate insulator film include inorganic materials, such as $SiO_2$, SiON and SiN, and organic materials, such as polyvinyl phenol (PVP) and epoxy. The fabrication method includes vacuum coating, such as sputtering or CVD, or coating/baking of a solution. No gate insulator film is provided to a voltage supply portion (not shown) which is located outside the thin-film transistor array and used for the gate wiring 2'.

Then, the source electrode 4, the source wiring 4', the source-connecting electrode 4a, the drain electrode 5, the drain-connecting electrode 5a and the pixel electrode 7 are formed (see (b) of FIG. 1A). As materials that can be used for the source electrode 4, the source wiring 4', the source-connecting electrode 4a, the drain electrode 5, the drain-connecting electrode 5a and the pixel electrode 7 include metals, such as Ag, Cu, Cr, Ni, Mo, Au, Pt and Al, electrically conductive oxides, such as ITO, carbon, electrically conductive polymers, and the like. The fabrication method may include overall coating, followed by photolithography, etching and resist separation. Desirably however, a method of printing/baking an ink is used. Printing methods that can be favorably used includes screen printing, gravure printing, flexographic printing, offset printing, or the like. In particular, gravure printing, flexographic printing or offset printing can form a pattern of not more than 20 μm width with good reproducibility.

The source electrode 4, the source wiring 4', the source-connecting electrode 4a, the drain electrode 5, the drain-connecting electrode 5a and the pixel electrode 7 are subjected to image inspection. Specifically, these electrodes and wirings are subjected to image processing to check presence of disconnections or short circuited portions. If there is a disconnection in the source wiring 4', there is no adverse effect unless the two right and left source wirings 4' are simultaneously disconnected in the same one pixel. If there is a disconnection in the drain-connecting electrode 5a, no problem will be caused in the operation unless the two drain-connecting electrodes that drive the same one pixel are simultaneously disconnected, although the driving has to be performed by 1 TFT.

Then, as a measure against short circuits, laser cutting is conducted. Laser cutting is conducted for at least the short circuit between the source electrode 4 and the drain electrode 5, the short circuit between adjacent source wirings 4', the short circuit between the source wiring 4' and the pixel electrode 7, and the short circuit between the pixel electrode 7 and the source-connecting electrode 4a in manners shown from (c) of FIG. 5B to (i) of FIG. 5D.

The step of inspection may be performed not only before the step of forming the semiconductor patterns 6 described later, but also after the step of forming the semiconductor patterns 6, or after forming the protective layer 6'. The step of laser cutting only has to be performed after the step of inspection. Specifically, laser cutting may be performed after forming the semiconductor patterns 6 or after forming the protective layer 6'. More specifically, laser cutting may be performed in any of the following sequences.

1) Inspection→Laser cutting→Semiconductors→Protective layer
2) Inspection→Semiconductors→Laser cutting→Protective layer
3) Inspection→Semiconductors→Protective layer→Laser cutting
4) Semiconductors→Inspection→Laser cutting→Protective layer
5) Semiconductors→Inspection→Protective layer→Laser cutting
6) Semiconductors→Protective layer→Inspection→Laser cutting However, normally, it is desirable that the protective layer 6' is promptly formed after forming the semiconductor patterns 6. Accordingly, any of the courses 1), 3) and 6) is desirable. The courses 1), 2) and 4), in which the protective layer 6' is provided after laser cutting, are advantageous in that the source-connecting electrode 4a can also be covered with the protective layer 6'. When inspection is difficult for such a reason as that the semiconductor patterns 6 have a lot of irregularities, any of the courses 1), 2) and 3) is desirable.

The semiconductor patterns 6 are formed before the step of inspection and the step of laser cutting, or between these steps, or after these steps (see (c) of FIG. 1A). For the semiconductor patterns 6, there can be used organic semiconductors such as polythiophenes, acene-based materials, allylamine-based materials or the like, and oxide semiconductors such as of $In_2O_3$, $Ga_2O_3$, ZnO, $SnO_2$, InGaZnO, InGaSnO, InSnZnO or the like. The fabrication method favorably is a method of printing/baking a solution by means of ink-jet printing, dispenser printing, flexographic printing, or the like.

After forming the semiconductor patterns 6, the protective layer 6' is formed (see (d) of FIG. 1B). The protective layer 6' covers at least the semiconductor patterns 6, the source electrode 4 and the drain electrode 5 and desirably covers the entire gate electrode 2 as the gate wiring 2'. When laser cutting is conducted prior to the step of forming the protective layer 6', the protective layer 6' desirably further covers the source-connecting electrode 4a. When laser cutting is conducted after forming the protective layer 6', the source-connecting electrode 4a cannot be covered with the protective layer 6'. Materials that can be used for the protective layer 6' include fluorine-containing resins, silicone-based resins, and the like. The fabrication method favorably is a method of printing/baking a solution by means of ink-jet printing, dispenser printing, screen printing, or the like.

After the step of laser cutting and after forming the protective layer 6', the insulating film 8 is formed (see (e1) and (e2) of FIG. 1B or (e3) of FIG. 1C). If the protective layer 6' also covers the source-connecting electrode 4a, the insulating film 8 only has to cover the source wiring 4'. If the protective layer 6' does not cover the source-connecting electrode 4a, it is desirable that the insulating film 8 covers the source-connecting electrode 4a. However, if the area of the source-connecting electrode 4a is small, the electrode 4a does not have to be covered with the insulating film 8 and the adverse effect in this case is small. As the insulating film 8, an organic insulating film such as of epoxy is favorably used. For forming the film, screen printing or gravure offset printing is favorably used.

Further, upper pixel electrodes 9 may be formed (see (f) of FIG. 1C). However, this is limited to the case where the source-connecting electrodes 4a are covered with the protective layer 6' or the insulating film 8. As the upper pixel electrode 9, an Ag paste or the like is favorably used. For forming the pixel electrode, screen printing or gravure offset printing is favorably used.

After the step of forming the gate electrode 2 as the gate wiring 2' and the capacitor electrode 10 as the capacitor wiring 10' but before the step of forming the gate insulator film, there may further be provided a step of inspecting for short circuits between the gate electrode 2 as the gate wiring 2' and the capacitor electrode 10 as the capacitor wiring 10', and a step of laser-cutting the short circuit.

Second Embodiment

FIGS. 3A to 3C and FIG. 4 show an example of a thin-film transistor array according to a second embodiment of the present invention. FIGS. 3A to 3C and FIG. 4 show an example of a thin-film transistor array of thin-film transistors. The thin-film transistor array includes an insulating substrate 1 which is provided thereon with gate electrodes 2 and gate wirings 2' connected to the respective gate electrodes 2, and capacitor electrodes 10, and capacitor wirings 10' connected to the respective capacitor electrode 10. In the array, each pixel includes two sets of source electrode 4 and drain electrode 5 having gaps in a region overlapping with the gate electrode 2 as viewed perpendicularly from above. Each pixel also includes semiconductor patterns 6 each provided at least in a gap between the source electrode 4 and the drain electrode 5. The two source electrodes 4 are separately connected to two respective source-connecting wirings 4'. The two drain electrodes 5 are connected to one pixel electrode 7 via two drain-connecting electrodes 5*a*. The pixel electrode 7 at least overlaps with the capacitor electrode 10. These thin-film transistors are provided with a protective layer 6' covering at least the semiconductor patterns 6. Each transistor has a source-connecting electrode 4*a* that connects between the two source electrodes 4. The same drive waveform is applied to the two source wirings 4'.

Figure 3A:
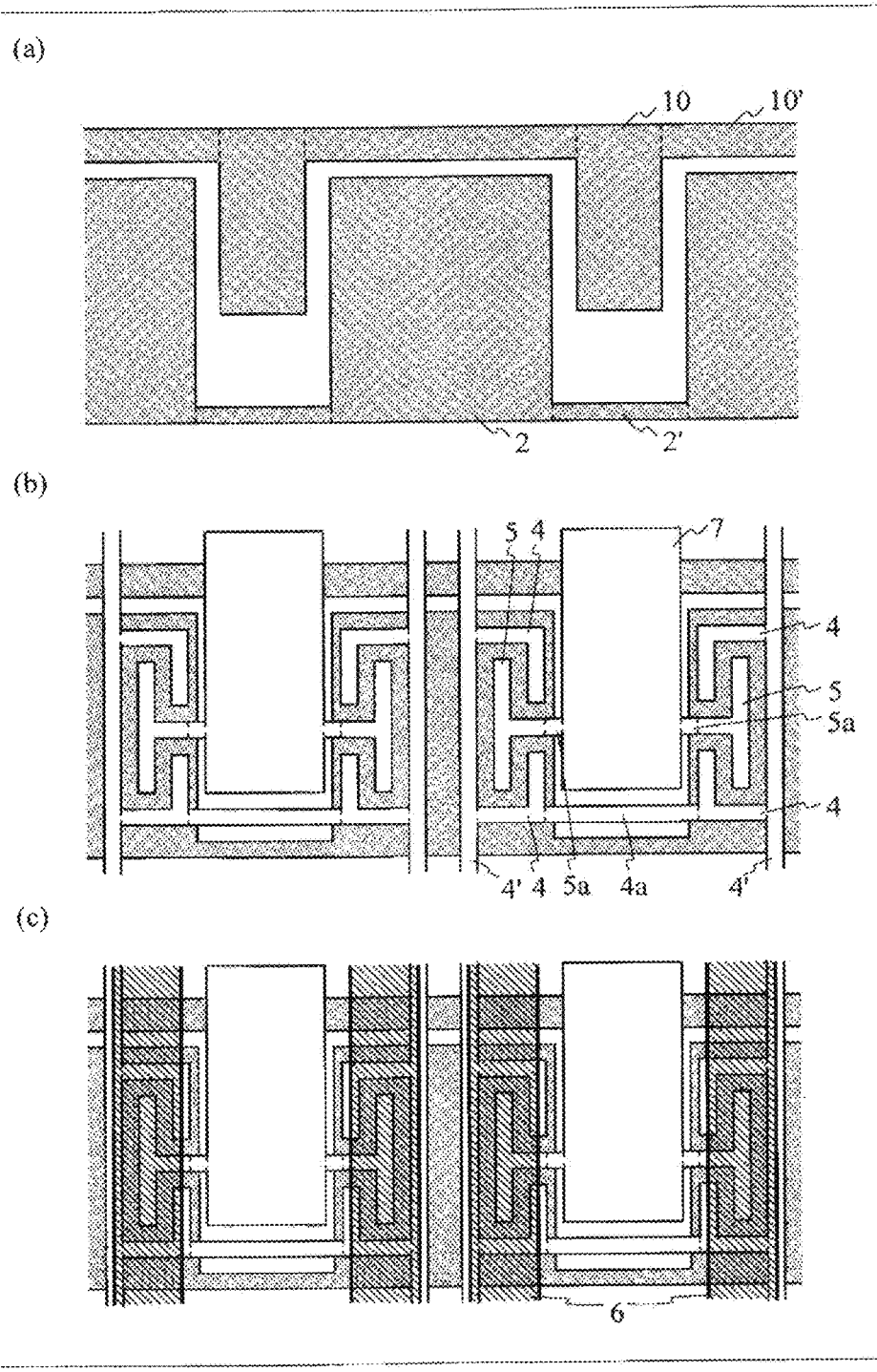
FIG. 3A is a plan view illustrating an example of a thin-film transistor array according to a second embodiment of the present invention.
Figure 3B:
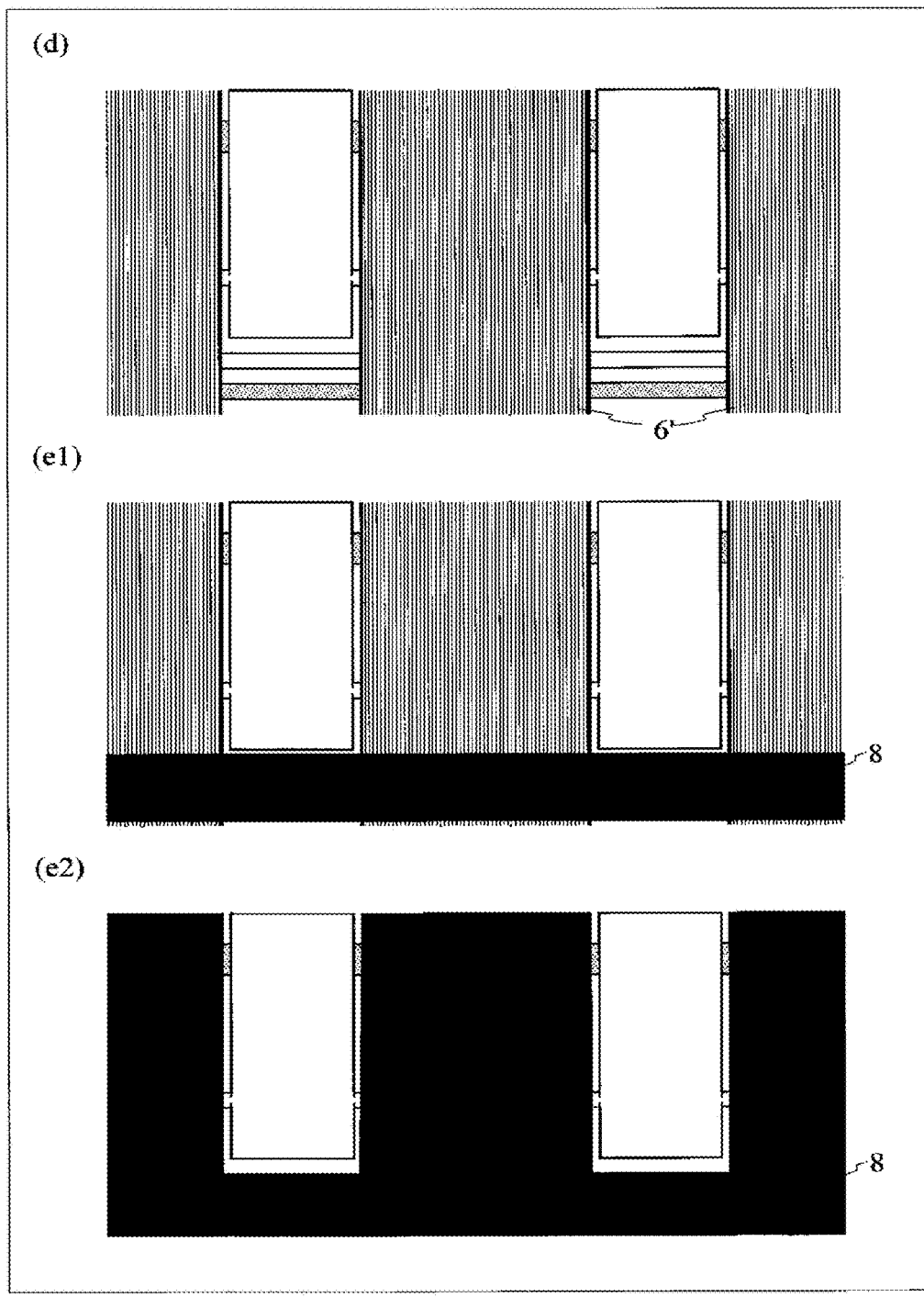
FIG. 3B is a plan view illustrating an example of the thin-film transistor array according to the second embodiment of the present invention.
Figure 3C:
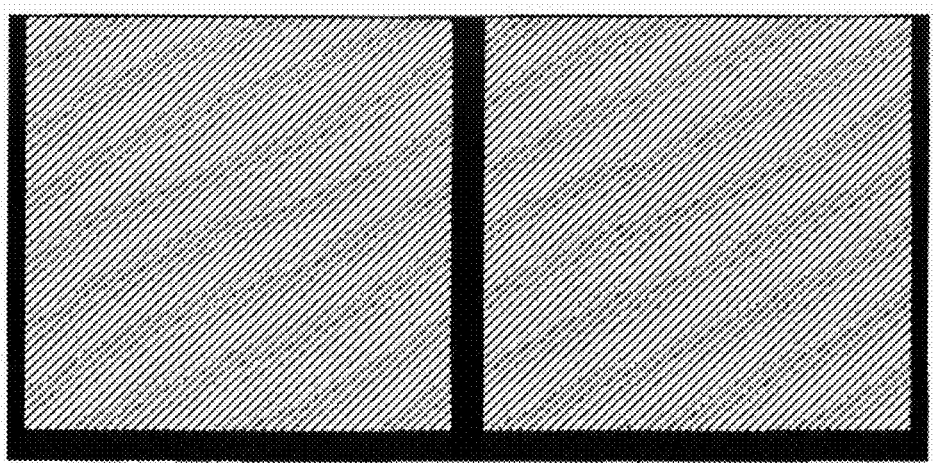
FIG. 3C is a plan view illustrating an example of the thin-film transistor array according to the second embodiment of the present invention.

FIG. 3A shows in (a) a plan view in which the gate electrode 2, the gate wiring 2', the capacitor electrode 10, and the capacitor wiring 10' are formed on the insulating substrate 1. FIG. 3A shows in (b) a plan view in which, a gate insulator film (not shown) is formed on these electrodes and wirings, followed by forming the source electrode 4, the source wiring 4', the source-connecting electrode 4*a*, the drain electrode 5, the drain-connecting electrode 5*a* and the pixel electrode 7. FIG. 3A shows in (c) a plan view after formation of the semiconductor patterns 6. The semiconductor patterns 6 can be formed into a continuous stripe pattern with an even width, over a plurality of TFTs in a direction parallel to the source wirings 4'. In this case, there is an advantage of not having an adverse effect in the event that there is a vertical offset (parallel to the source wirings 4'), as viewed in the figure, in the alignment of the semiconductor patterns 6. FIG. 3B shows in (d) a plan view after formation of the protective layer 6'. The protective layer 6' plays a role of protecting the semiconductor patterns 6 from the components of a display medium 13 or an insulating film 8 described later. The protective layer 6' is formed covering at least the semiconductor patterns 6. Desirably, the protective layer 6' is in a stripe pattern which is continuous over a plurality of TFTs and parallel to the source wirings 4' and has a uniform width. The stripe pattern with a uniform width can provide an advantage of not being influenced by the vertical offset of the protective layer 6' relative to the lower layer of the source and drain electrodes 4 and 5 and the semiconductor patterns 6. FIG. 3B shows in (e1) and (e2) plan views in which the insulating film 8 is further formed. FIG. 3B shows in (e1) the insulating film 8 in a stripe pattern with a uniform width covering the source-connecting electrode 4*a* and favorably covering the gate wiring 2' at the same time. In this case, there is an advantage that no adverse effect is caused by the horizontal offset (offset in a direction parallel to the gate wiring 2') of the insulating film 8 relative to the lower layer of the source-connecting electrode 4*a*. FIG. 3B shows in (e2) the insulating film 8 which is in a lattice pattern covering the source-connecting electrode 4*a* and the protective layer 6' and further desirably covering the gate wiring 2' as well. The insulating film 8 plays a role of preventing a voltage of the source-connecting electrode 4*a* or the gate wiring 2' or the like from adversely affecting display. As shown in FIG. 3C by (f), upper pixel electrodes 9 may be formed. The upper pixel electrodes 9 have a space therebetween which is smaller than the width of the protective layer 6' or the width of the insulating film 8 to exert an effect of increasing an area ratio (opening ratio) of a region effective for display in a pixel pitch.

Referring to FIGS. 6A to 6D, measures against disconnections or short circuits will be described. The thin-film transistor array of the second embodiment has the source-connecting electrode 4*a*. Therefore, if a disconnection occurs in any of the source wiring 4', the source electrode 4 and the source-connecting electrode 4*a*, the source voltage can be supplied, as it is, to the source electrode 4 after the occurrence of the disconnection.

Figure 6A:
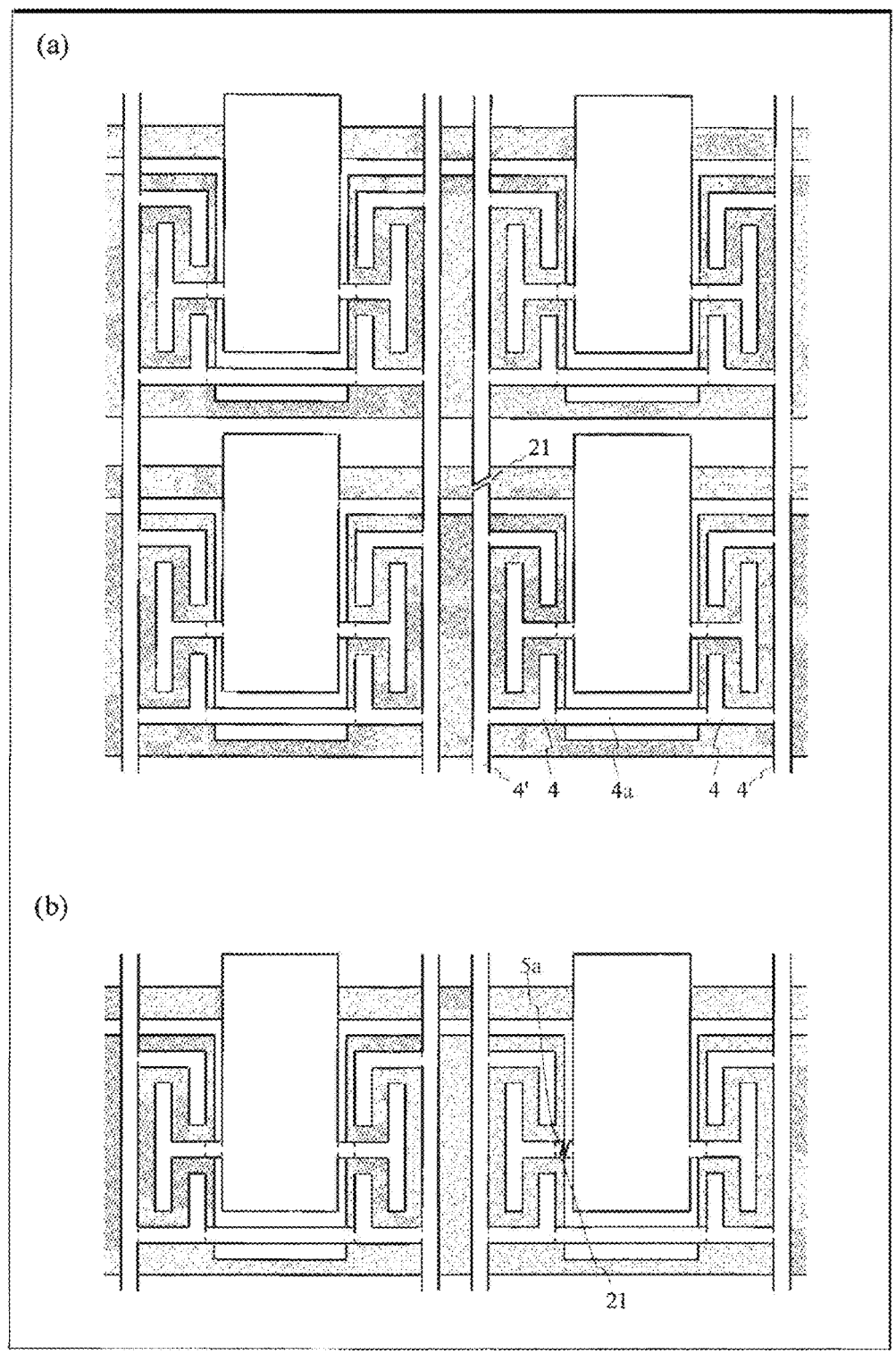
FIG. 6A is a plan view illustrating an example of a repair process for the thin-film transistor array according to the second embodiment of the present invention.

For example, when current is supplied to the source wiring 4' upward as viewed in (a) of FIG. 6A and there is a disconnection 21 in the left source wiring 4', current is supplied from immediately above the disconnection 21 through the right source wiring 4'→right source electrode 4→source-connecting electrode 4*a*→left source electrode 4→left source wiring 4', and thus the disconnection 21 produces no adverse effect. Since the source-connecting electrode 4*a* connects between the two source electrodes 4, there is no need of separately providing a redundant wiring that directly connects between the two source wirings 4', thereby increasing the opening rate.

Further, since one pixel has two TFTs, if a disconnection 21 occurs in one drain-connecting electrode 5*a* to interrupt the on-state current (see (b) of FIG. 6A) or if a disconnection occurs in the source electrode 4 or the drain electrode 5 to reduce the on-state current, the other TFT can write to.

Further, if a short circuit occurs, the adverse effect can be avoided by performing laser cutting. The laser cutting can be easily applied to metal because metal easily absorbs light, but cannot be easily applied to an insulating film because the insulating film does not easily absorb light. When a metal electrode is located uppermost, laser cutting can be easily performed because metal is easily evaporated. When an insulating film is located on a metal electrode, light passes through the insulating film and is irradiated to the metal electrode for evaporation from between the voids of the insulating film, although the insulating film will be damaged. Thus, laser cutting can be performed in this case as well. However, in the case of a laminate structure of metal, insulating film and metal, it is true that laser cutting can be conducted for the upper layer metal electrode, but the laser cutting in this case damages the insulating film and thus the withstand voltage across the upper metal electrode and the lower metal electrode may be impaired. Further, since the upper layer metal is easily evaporated, it is difficult to connect the upper and lower metals by using a laser. Since semiconductors absorb some light, laser cutting can be conducted.

Figure 6B:
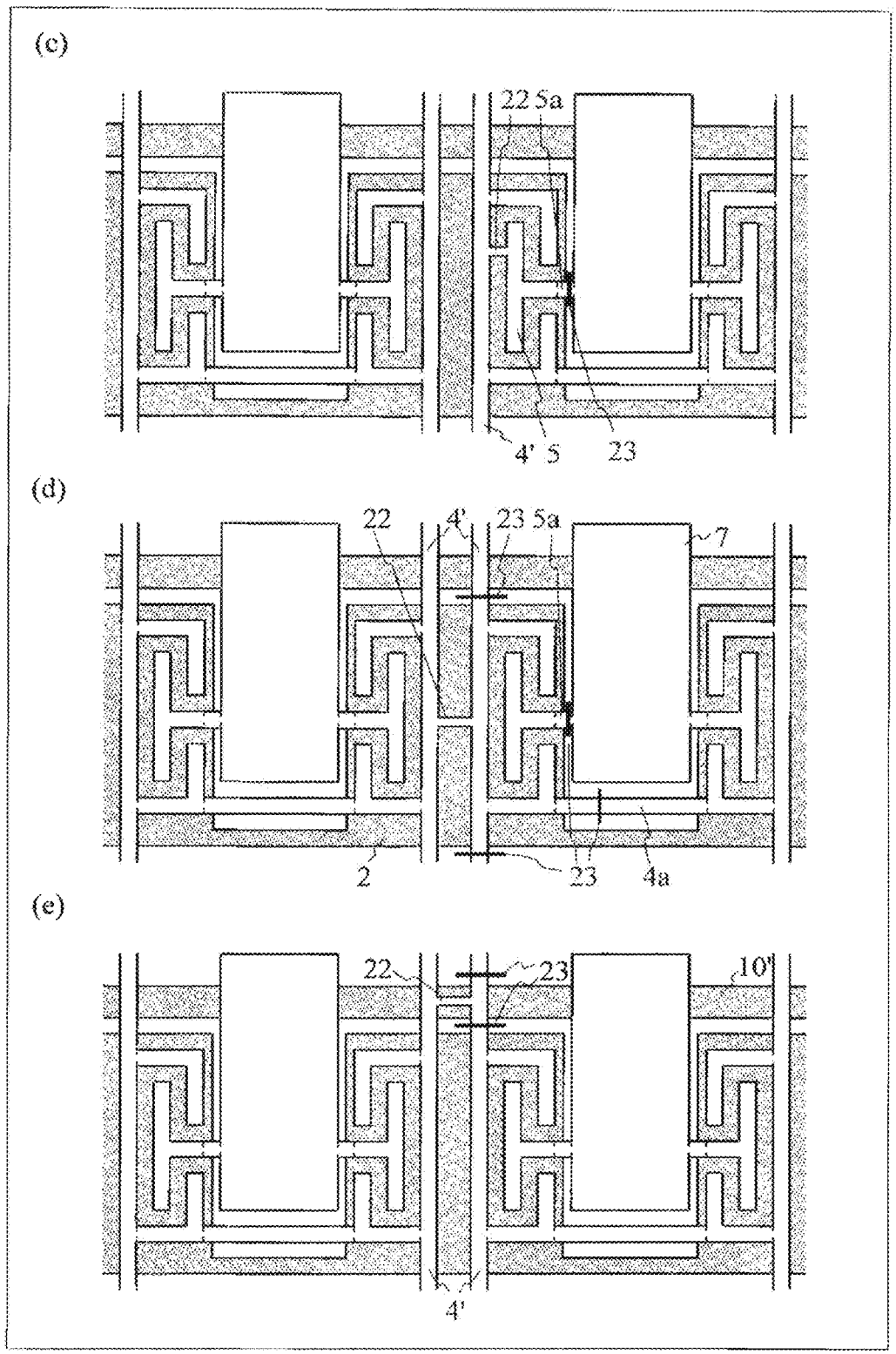
FIG. 6B is a plan view illustrating an example of a repair process for the thin-film transistor array according to the second embodiment of the present invention.

If a short circuit 22 occurs between the source wiring 4' or the source electrode 4 and the drain electrode 5 (see (c) of FIG. 6B), the drain-connecting electrode 5*a* of the TFT is cut at a position 23 not overlapping with the gate electrode 2 or the capacitor wiring 10'. This can avoid a point defect that is caused when the source voltage is directly applied to the pixel electrode 7. The voltage can be applied to the pixel electrode 7 by the other TFT.

If a short circuit 22 occurs between adjacent source wirings 4' on the gate electrode 2 (see (d) of FIG. 6B), cutting is conducted in two upper and lower portions sandwiching the short circuited portion of the source wiring 4', and in the drain- and source-connecting electrodes 5*a* and 4*a* of the transistor located nearest the short circuited portion, at positions 23 not overlapping with the gate electrode 2 or the capacitor wiring 10'. The cutting only has to be conducted for at least one of the two short-circuited source wirings 4'. Thus, the source driver is prevented from being broken or the display is prevented from having a line defect.

If a short circuit 22 occurs between adjacent source wirings 4' on the capacitor wiring 10' (see (e) of FIG. 6B), cutting is conducted in two upper and lower portions sandwiching the short circuited portion of the source wiring 4', at positions 23 not overlapping with the gate electrode 2 or the capacitor wiring 10'. The cutting only has to be conducted for at least one of the two short-circuited source wirings 4'. Thus, the source driver is prevented from being broken or the display is prevented from having a line defect.

Figure 6C:
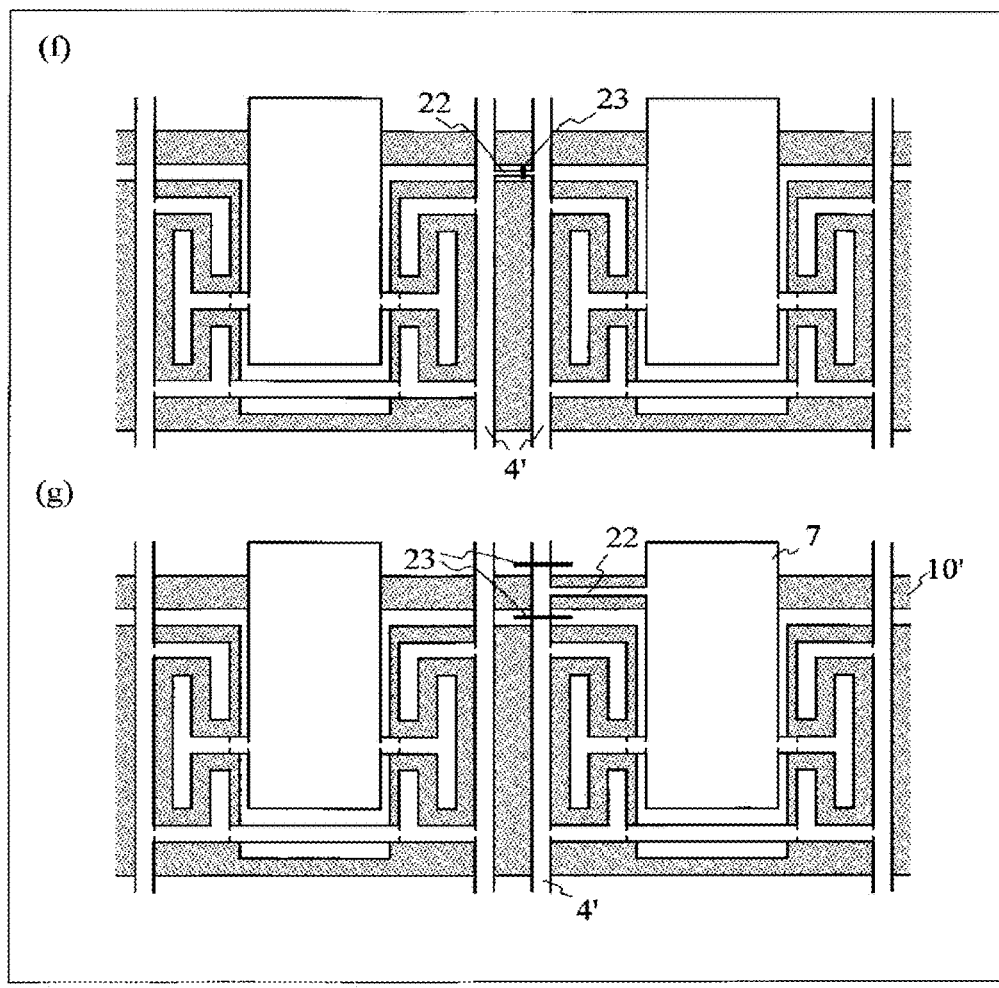
FIG. 6C is a plan view illustrating an example of a repair process for the thin-film transistor array according to the second embodiment of the present invention.

If a short circuit 22 occurs between adjacent source wirings 4' at a position of not overlapping with the gate electrode 2 or the capacitor wiring 10' (see (f) of FIG. 6C), cutting is conducted at any position 23 in the short circuited portion. Thus, the source driver is prevented from being broken or the display is prevented from having a line defect.

If a short circuit 22 occurs between a source wiring 4' and the pixel electrode 7 on the capacitor wiring 10' (see (g) of FIG. 6C), cutting is conducted in two upper and lower portions sandwiching the short circuited portion of the wiring 4', at positions 23 not overlapping with the gate electrode 2 or the capacitor wiring 10'. This can avoid a point defect that is caused when the source voltage is directly applied to the pixel electrode 7.

Figure 6D:
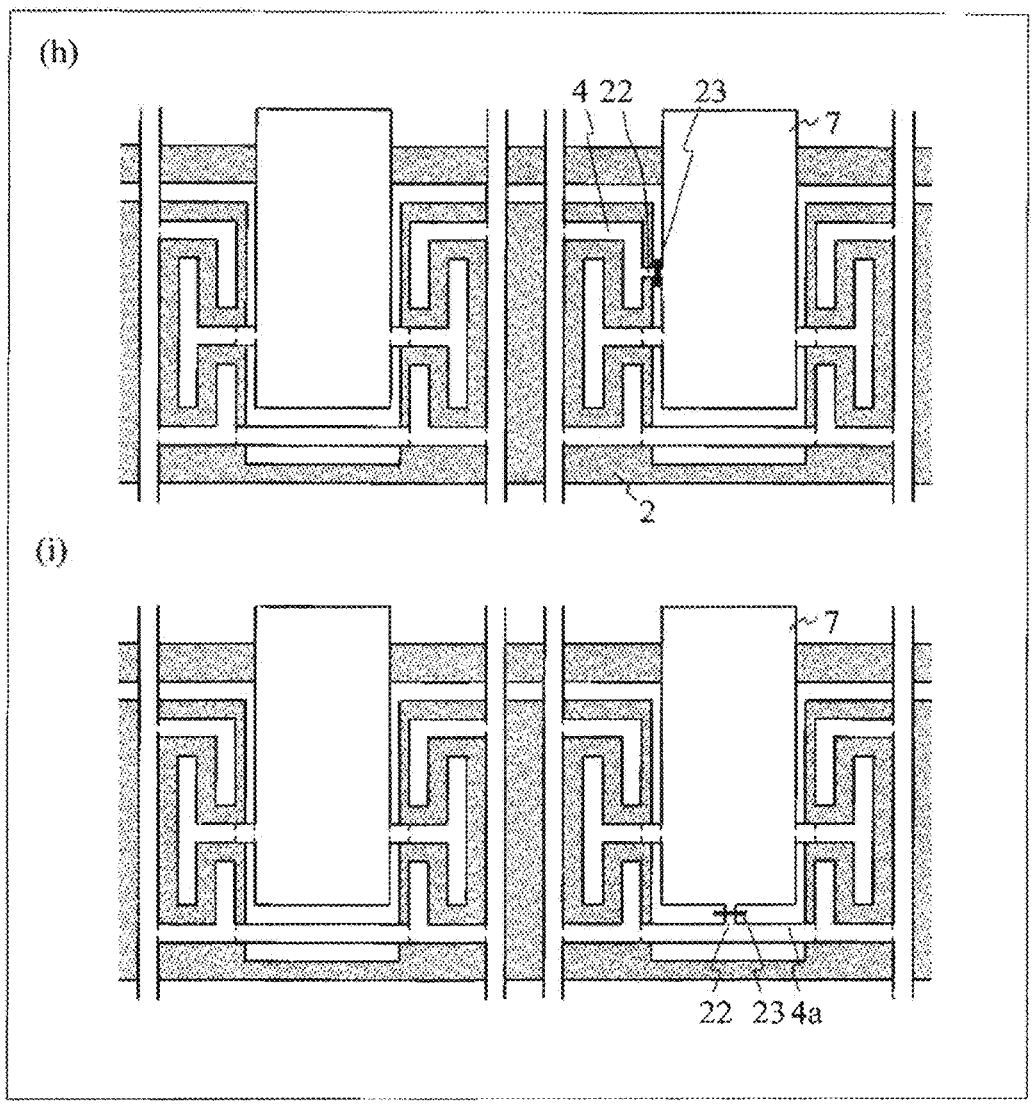
FIG. 6D is a plan view illustrating an example of a repair process for the thin-film transistor array according to the second embodiment of the present invention.

If a short circuit 22 occurs between the source wiring 4' or the source electrode 4 and the pixel electrode 7 at a position of not overlapping with the capacitor wiring 10' (see (h) of FIG. 6D), the short circuited portion is cut at a position 23 not overlapping with the gate electrode 2. This can avoid a point defect that is caused when the source voltage is directly applied to the pixel electrode 7.

If a short circuit 22 occurs between the pixel electrode 7 and the source-connecting electrode 4a (see (i) of FIG. 6D), the short circuited portion is cut at a position 23 not overlapping with the gate electrode 2. This can avoid a point defect that is caused when the source voltage is directly applied to the pixel electrode 7.

If a short circuit has occurred or possibly occurs between the source wiring 4' or the source electrode 4 and the capacitor wiring 10', similar to (d) of FIG. 6B, cutting is conducted in two upper and lower portions of the source wiring 4', at positions 23 not overlapping with the gate electrode 2 or the capacitor wiring 10'. Thus, the source driver is prevented from being broken or the display is prevented from having a line defect. However, this short circuit cannot necessarily be detected through an image inspection.

If a short circuit has occurred or possibly occurs between the source wiring 4' or the source electrode 4 and the capacitor wiring 10', cutting is conducted, similar to (g) of FIG. 6C, in two upper and lower portions of the source wiring 4', at positions 23 not overlapping with the gate electrode 2 or the capacitor wiring 10'. Thus, the source driver is prevented from being broken or the display is prevented from having a line defect. However, again, this short circuit cannot necessarily be detected through an image inspection.

In FIGS. 3A to 3C, the source-connecting electrode 4a has a portion which does not overlap at all with the gate wiring 2'. The expression "portion which does not overlap at all" means that the portion of the source-connecting electrode 4a does not overlap at all with the gate wiring 2' in respect of a width direction of the portion. Thus, when the source-connecting electrode 4a is laser-cut, laser is not required to be applied to the portion overlapping with the gate wiring 2' and accordingly the gate-source withstand voltage is not lowered. On the other hand, if the source-connecting electrode 4a partially overlaps with the gate wiring 2' (see (b) of FIG. 4), laser has to be applied to the portion overlapping with the gate wiring 2'. As a result, in laser-cutting the source-connecting electrode 4a, the gate-source withstand voltage may be lowered.

Figure 4:
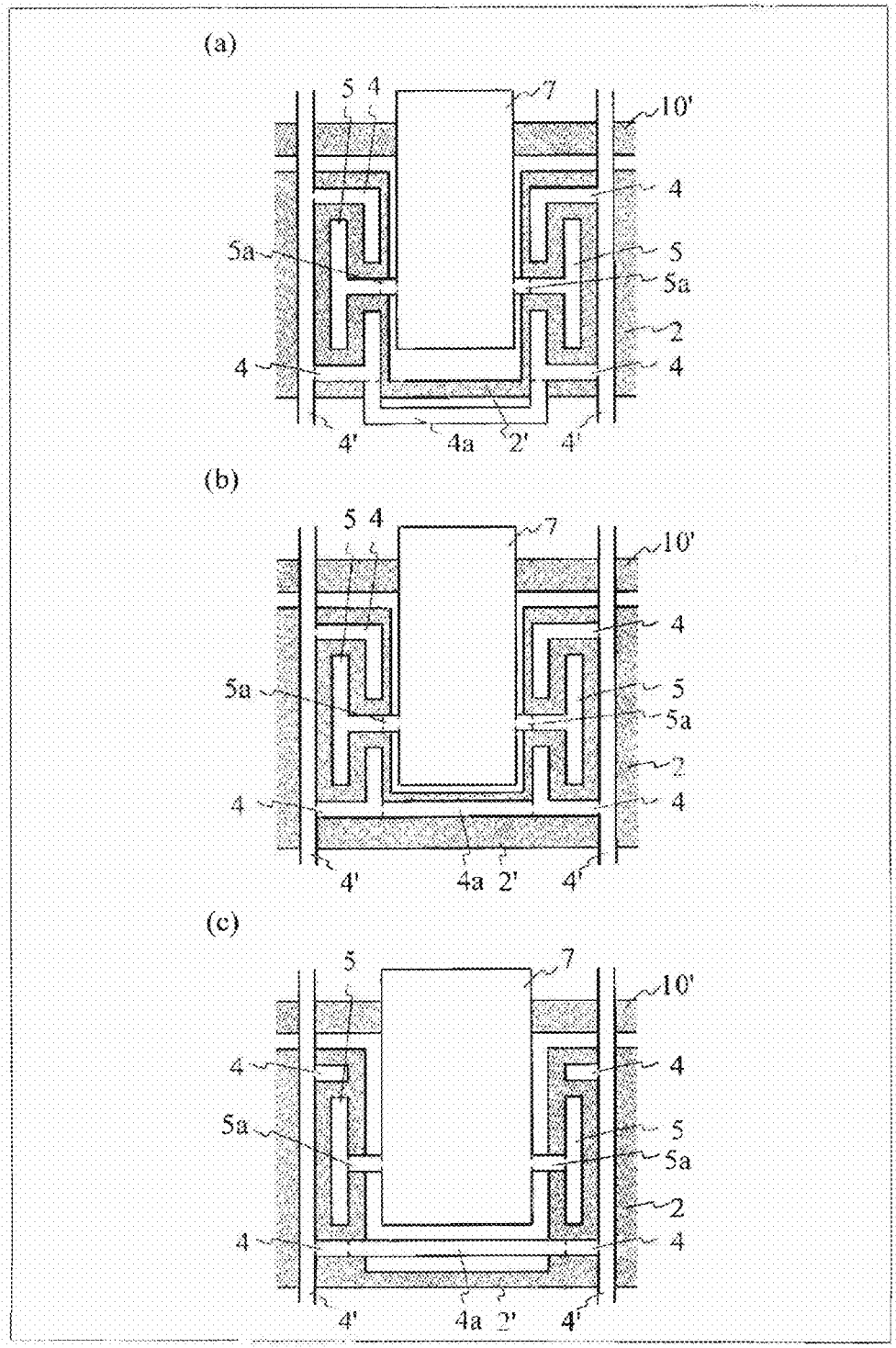
FIG. 4 is a plan view illustrating an example of another thin-film transistor array according to the second embodiment of the present invention.

In FIGS. 3A to 3C, the source-connecting electrode 4a is located on the same side as the drain-connecting electrode 5a is located relative to the gate wiring 2' as viewed perpendicularly from above. In this regard, as shown in FIG. 4 by (a), the source-connecting electrode 4a may be located on the opposite side of the drain-connecting electrode 5a relative to the gate wiring 2' as viewed perpendicularly from above. Further, the shapes of the source electrode 4 and the drain electrode 5 are not limited to the ones shown in FIG. 3A by (b). For example, the shapes of these electrodes may be as shown in FIG. 4 by (c). However, in (a) to (c) of FIG. 4, the semiconductor patterns 6 and the protective layer 6' are omitted to draw.

Referring to FIGS. 3A to 3C, a method for fabricating the thin-film transistor array of the second embodiment will be described. First, the gate electrode 2, the gate wiring 2', the capacitor electrode 10, and the capacitor wiring 10' are formed on the insulating substrate 1 (see (a) of FIG. 3A). As the insulating substrate 1, a rigid member, such as a glass substrate, may be used, or a flexible member may be used, which is made such as of polyethylene terephthalate (PET), polyethylene naphthalate (PEN), polyimide (PI), polyetherimide (PEI), or polyethersulfone (PES). Materials that can be used for the gate electrode 2, the gate wiring 2', the capacitor electrode 10 and the capacitor wiring 10' include metals, such as Al, Ag, Cu, Cr, Ni, Mo, Au and Pt, electrically conductive oxides, such as ITO, carbon, electrically conductive polymers, and the like. As the fabrication method that can be used, mention can be made of a method of printing/baking an ink, a method of applying overall coating, followed by photolithography, etching and resist separation, or a method of applying overall coating, followed by resist printing, etching and resist separation.

Then, a gate insulator film (not shown) is formed over the entire surface. Materials that can be used for the gate insulator film include inorganic materials, such as $SiO_2$, SiON and SiN, and organic materials, such as polyvinyl phenol (PVP) and epoxy. The fabrication method includes vacuum coating, such as sputtering or CVD, or coating/baking of a solution. No gate insulator film is provided to a voltage supply portion (not shown) which is located outside the thin-film transistor array and connected to the gate wiring 2'.

Then, the source electrode 4, the source wiring 4', the source-connecting electrode 4a, the drain electrode 5, the drain-connecting electrode 5a and the pixel electrode 7 are formed (see (b) of FIG. 3A). As materials that can be used for the source electrode 4, the source wiring 4', the source-connecting electrode 4a, the drain electrode 5, the drain-connecting electrode 5a and the pixel electrode 7 include metals, such as Ag, Cu, Cr, Ni, Mo, Au, Pt and Al, electrically conductive oxides, such as ITO, carbon, electrically conductive polymers, and the like. The fabrication method may include overall coating, followed by photolithography, etching and resist separation. Desirably, however, a method of printing/baking an ink is used. The printing method that can be favorably used includes screen printing, gravure printing, flexographic printing, offset printing, or the like. In particular, gravure printing, flexographic printing or offset printing can form a pattern of not more than 20 μm thick with good reproducibility.

The source electrode 4, the source wiring 4', the source-connecting electrode 4a, the drain electrode 5, the drain-connecting electrode 5a and the pixel electrode 7 are subjected to image inspection. Specifically, these electrodes and wirings are subjected to image processing to check for the presence of disconnections or short circuited portions. If there is a disconnection in the source wiring 4', there is no adverse effect unless the two right and left source wirings 4' are simultaneously disconnected in the same one pixel. If there is a disconnection in the drain-connecting electrode 5a, no problem will be caused in the operation unless the two drain-connecting electrodes that drive the same one pixel are simultaneously disconnected, although the driving has to be performed by one TFT.

Then, as a measure against short circuits, laser cutting is conducted. Laser cutting is conducted for at least the short circuit between the source electrode 4 and the drain electrode 5, the short circuit between adjacent source wirings 4', the short circuit between the source wiring 4' and the pixel electrode 7, and the short circuit between the pixel electrode 7 and the source-connecting electrode 4a in manners shown from (c) of FIG. 6B to (i) of FIG. 6D.

The step of inspection may be performed not only before the step of forming the semiconductor patterns 6 described later, but also after the step of forming the semiconductor patterns 6, or after forming the protective layer 6'. The step of laser cutting only has to be performed after the step of inspection. Specifically, laser cutting may be performed after forming the semiconductor patterns 6 or after forming the protective layer 6'. More specifically, laser cutting may be performed in any of the following sequences.

1) Inspection→Laser cutting→Semiconductors→Protective layer
2) Inspection→Semiconductors→Laser cutting→Protective layer
3) Inspection→Semiconductors→Protective layer→Laser cutting
4) Semiconductors→Inspection→Laser cutting→Protective layer
5) Semiconductors→Inspection→Protective layer→Laser cutting
6) Semiconductors→Protective layer→Inspection→Laser cutting However, normally, it is desirable that the protective layer 6' is promptly formed after forming the semiconductor patterns 6. Accordingly, any of the courses 1), 3) and 6) is desirable. When inspection is difficult for such a reason as that the semiconductor patterns 6 have a lot of irregularities, any of the courses 1), 2) and 3) is desirable.

The semiconductor patterns 6 are formed before the step of inspection and the step of laser cutting, or between these steps, or after these steps (see (c) of FIG. 3A). For the semiconductor patterns 6, there can be used organic semiconductors such as polythiophenes, acene-based materials, allylamine-based materials or the like, and oxide semiconductors such as of $In_2O_3$, $Ga_2O_3$, ZnO, $SnO_2$, InGaZnO, InGaSnO, InSnZnO or the like. The fabrication method favorably is a method of printing/baking a solution by means of ink-jet printing, dispenser printing, flexographic printing, or the like.

After forming the semiconductor patterns 6, the protective layer 6' is formed (see (d) of FIG. 3B). The protective layer 6' covers at least the semiconductor pattern 6, the source electrode 4 and the drain electrode 5 and desirably covers the source wiring 4'. Materials that can be used for the protective layer 6' include fluorine-containing resins, silicone-based resins, and the like. The fabrication method favorably is a method of printing/baking of a solution by means of ink-jet printing, dispenser printing, screen printing, or the like.

After the step of laser cutting and after forming the protective layer 6', the insulating film 8 is formed (see (e1) and (e2) of FIG. 3B). If the protective layer 6' also covers the source wiring 4', the insulating film 8 only has to cover the source-connecting electrode 4a, although, desirably, the insulating film 8 also covers the gate wiring 2'. If the protective layer 6' does not cover the source wiring 4', it is desirable that the insulating film 8 covers the source wiring 4'. As the insulating film 8, an organic insulating film such as of epoxy is favorably used. For forming the film, screen printing or gravure offset printing is favorably used.

Further, an upper pixel electrode 9 may be formed (see (f) of FIG. 3C). As the upper pixel electrode 9, an Ag paste or the like is favorably used. For forming the pixel electrode, screen printing or gravure offset printing is favorably used.

After the step of forming the gate electrode 2, the gate wiring 2', the capacitor electrode 10, and the capacitor wiring 10' but before the step of forming the gate insulator film, a step of inspecting for short circuits between the gate electrode 2 or the gate wiring 2', and the capacitor electrode 10 or the capacitor wiring 10', and a step of laser-cutting the short circuit may further be performed.

Third Embodiment

Figure 7A:
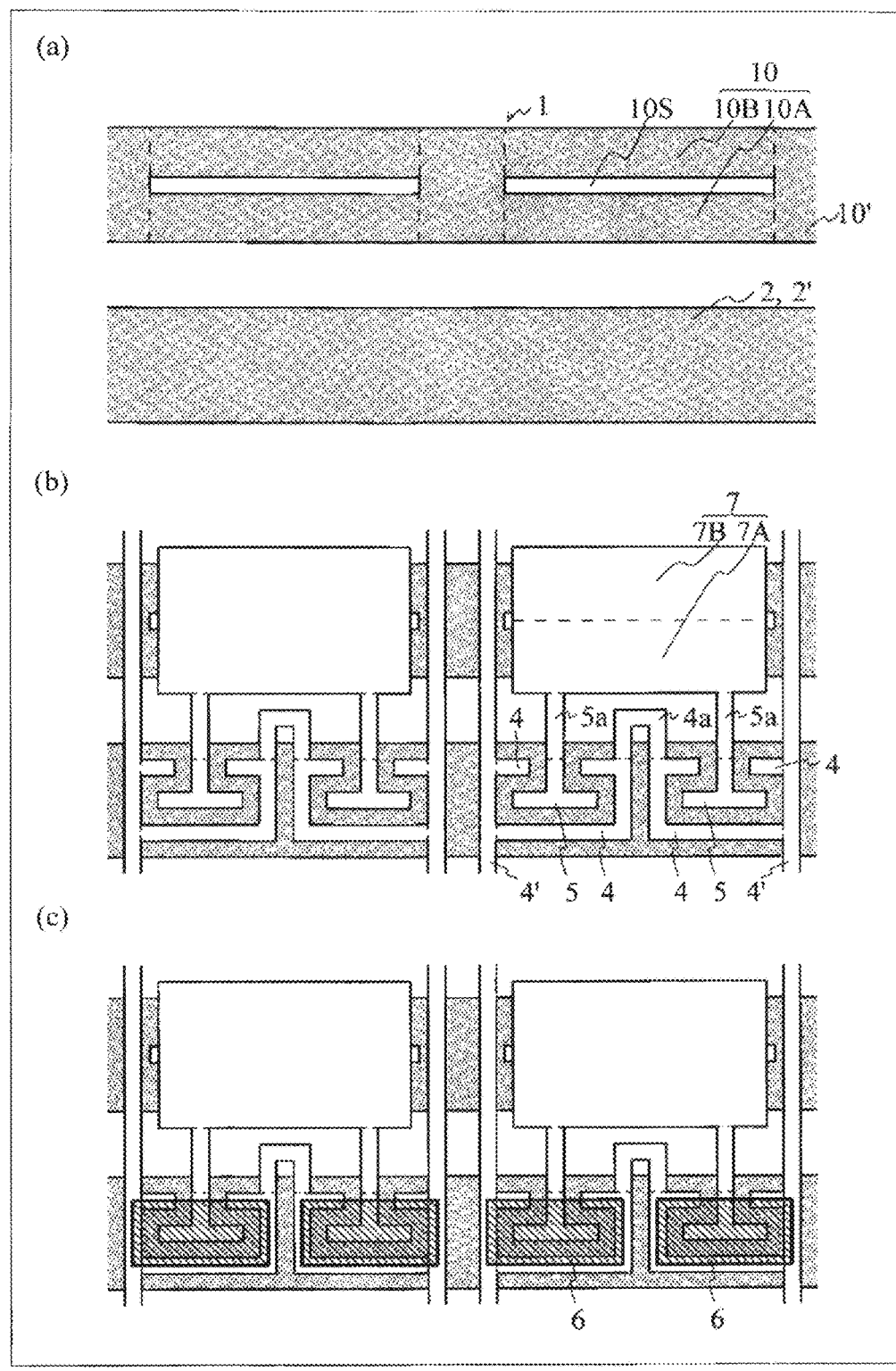
FIG. 7A is a plan view illustrating an example of a repair process for the thin-film transistor array according to the third embodiment of the present invention.
Figure 7B:
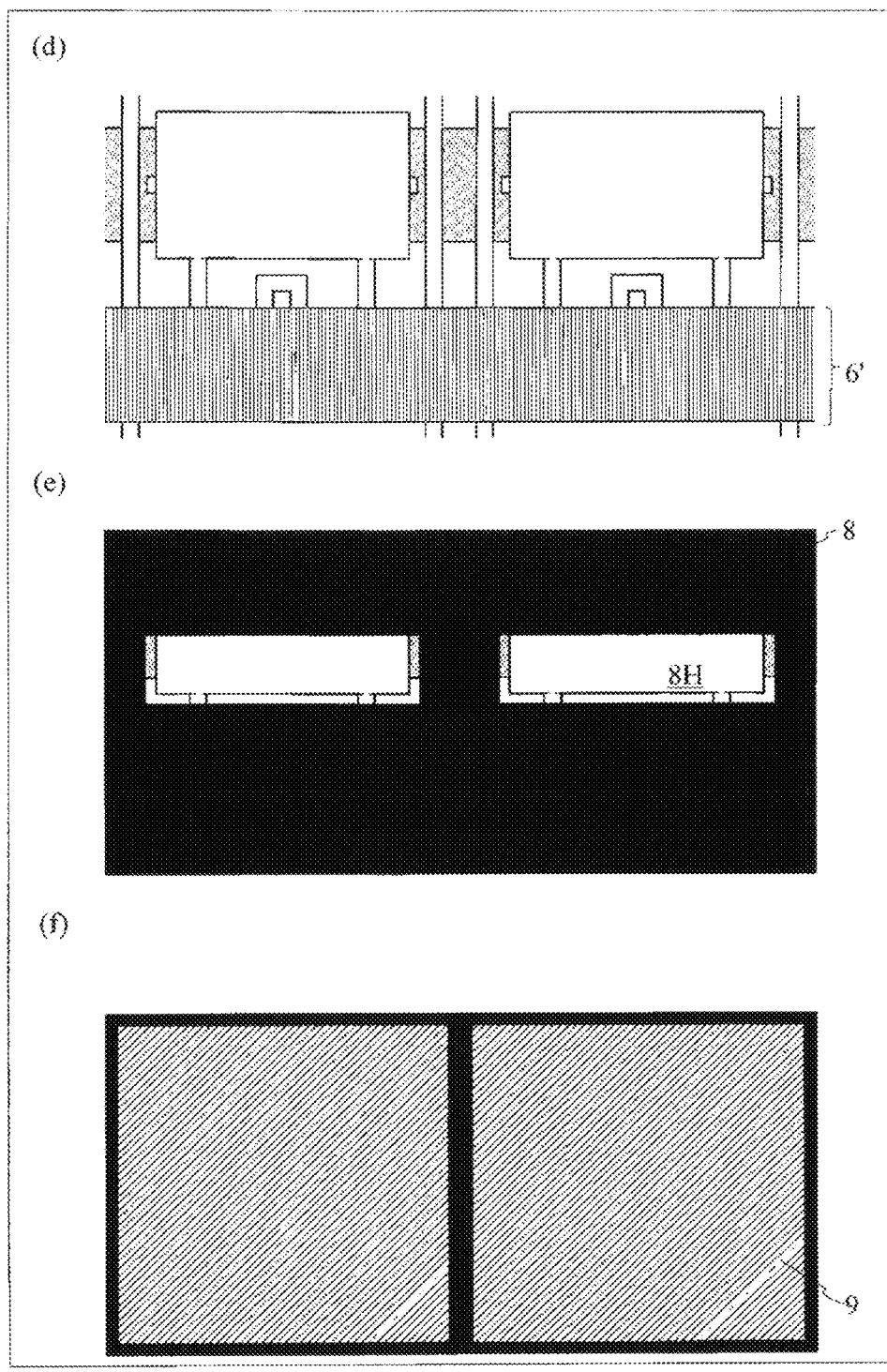
FIG. 7B is a plan view illustrating an example of a repair process for the thin-film transistor array according to the third embodiment of the present invention.
Figure 8:
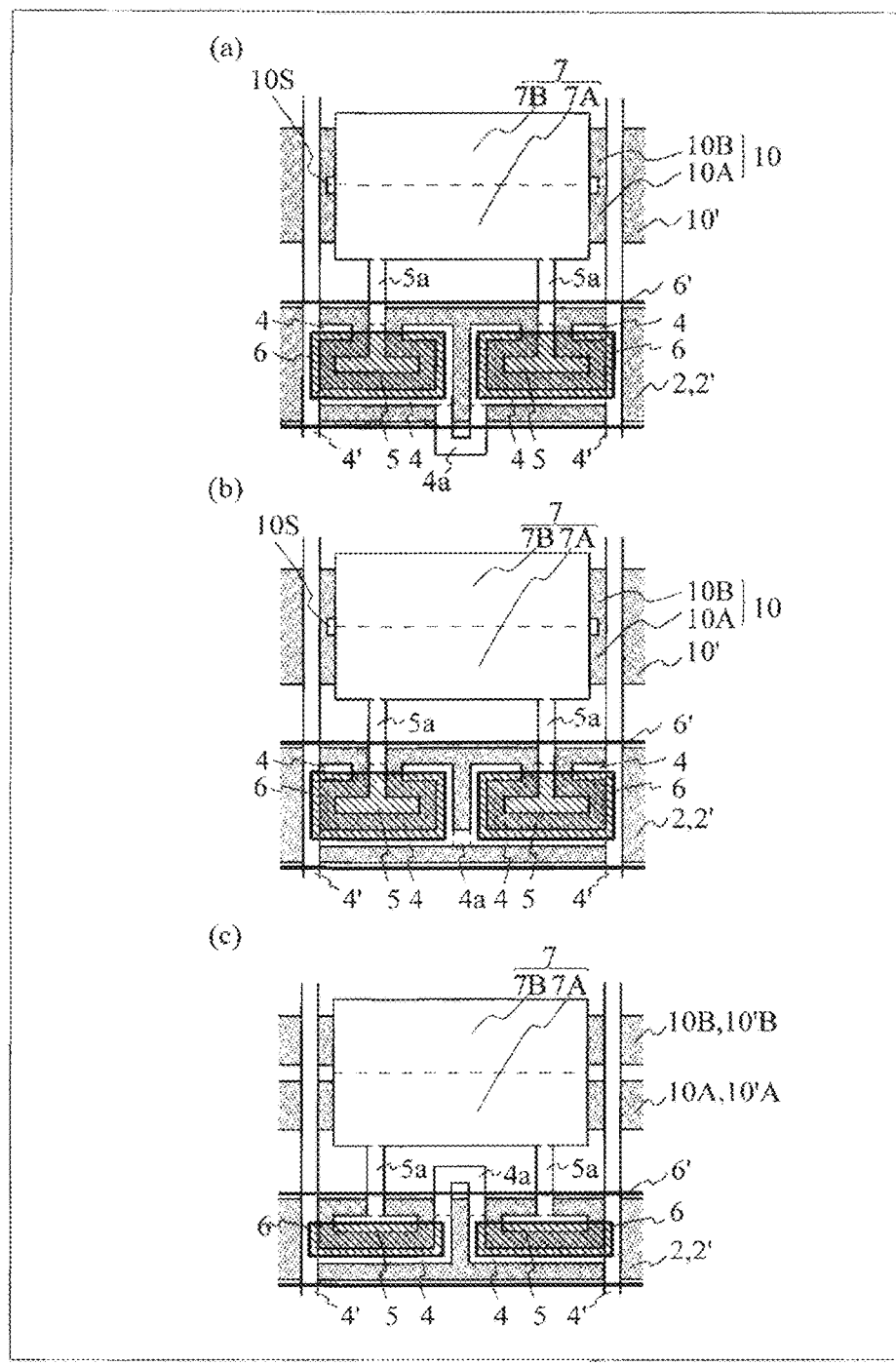
FIG. 8 is a plan view illustrating an example of a repair process for another thin-film transistor array according to the third embodiment of the present invention.

FIGS. 7A and 7B and FIG. 8 show an example of a thin-film transistor array related to a third embodiment of the present invention. The thin-film transistor array includes an insulating substrate 1 which is provided thereon with gate electrodes 2 and gate wirings 2' connected to the respective gate electrodes 2, and capacitor electrodes 10, and capacitor wirings 10' connected to the respective capacitor electrodes 10. In the array, each pixel includes two sets of source electrode 4 and drain electrode 5 having gaps, in a region overlapping with the gate electrode 2 as viewed perpendicularly from above. Semiconductor patterns 6 are each provided at least in a gap between the source electrode 4 and the drain electrode 5. The two source electrodes 4 are separately connected to two respective source wirings 4'. The two drain electrodes 5 are connected to one pixel electrode 7 via two drain-connecting electrodes 5a. The pixel electrode 7 at least overlaps with the capacitor electrode 10. These thin-film transistors are provided with a protective layer 6' covering at least the semiconductor patterns 6. Each thin-film transistor includes a source-connecting electrode 4a that connects between the two source electrodes 4. The same drive waveform is applied to the two source wirings 4'. The pixel electrode 7 has a first capacitor near the drain electrodes 5, and a second capacitor remote from the drain electrodes 5.

FIG. 7A shows in (a) a plan view in which the gate electrode 2, the gate wiring 2', the capacitor electrode 10, and the capacitor wiring 10' are formed on the insulating substrate 1. FIG. 7A shows in (b) a plan view in which a gate insulator film (not shown) is formed on these electrodes and wirings, followed by forming the source electrode 4, the source wiring 4', the source-connecting electrode 4a, the drain electrode 5, the drain-connecting electrode 5a and the pixel electrode 7. The gate electrode 2 and the gate wiring 2' are in a common stripe pattern. The capacitor electrode 10 has a slit 10S that is parallel to a longitudinal direction of the capacitor electrode 10. The slit 10S defines a first capacitor electrode 10A and a second capacitor electrode 10B in the capacitor electrode 10. The pixel electrode 7, the gate insulator film and the first capacitor electrode 10A constitute the first capacitor, while the pixel electrode 7, the gate insulator film and the second capacitor electrode 10B constitute the second capacitor. FIG. 7A shows in (c) a plan view after formation of the semiconductor patterns 6. The semiconductor patterns 6 are arranged in a dot pattern on the gate electrode 2 as the gate wiring 2' so as to include a gap between the source electrode 4 and the drain electrode 5. FIG. 7B shows in (d) a plan view after forming the protective layer 6'. The protective layer 6' plays a role of protecting the semiconductor patterns 6 from the components of a display medium 13 or an insulating film 8 described later. The protective layer 6' is formed covering at least the semiconductor patterns 6. Desirably, the protective layer 6' is in a stripe pattern which is continuous over a plurality of TFTs and parallel to the direction of the gate wiring 2' and has a uniform width. The stripe pattern with a uniform width can provide an advantage of not being influenced by the horizontal offset of the protective layer 6' relative to the lower layer of the source and drain electrodes 4 and 5 and the semiconductor patterns 6. FIG. 7B shows in (e) a plan view in which the insulating film 8 is further formed. FIG. 7B shows in (e) that the insulating film 8 has an opening 8H on a first capacitor portion 7A of the pixel electrode 7. FIG. 7B further shows in (e) that the insulating film 8 at least covers a second capacitor portion 7B of the pixel electrode 7, the source electrode 4, the source-connecting electrode 4a, and the source wiring 4'. Further, as shown in FIG. 7B by (f), each thin-film transistor is provided with an upper pixel electrode 9. Each pixel electrode 9 is connected to the first capacitor portion 7A of the pixel electrode 7 via the opening 8H.

Referring to FIGS. 11A to 11D, measures against disconnections or short circuits will be described. The thin-film transistor array of the third embodiment has the source-connecting electrode 4a. Therefore, if a disconnection occurs in any of the source wiring 4', the source electrode 4 and the source-connecting electrode 4a, the source voltage can be supplied, as it is, to the source electrode 4 after the occurrence of the disconnection.

For example, when current is supplied to the source wiring 4' upward as viewed in (a) of FIG. 11A and there is a disconnection 21 in the left source wiring 4', current is supplied from immediately above the disconnection 21 through the right source wiring 4'→right source electrode 4→source-connecting electrode 4a→left source electrode 4→left source wiring 4', and thus the disconnection 21 produces no adverse effect. Since the source-connecting electrode 4a connects between the two source electrodes 4, there is no need of separately providing a cross-bridge that directly connects between the two source wirings 4', thereby increasing the opening rate.

Since two TFTs are provided to each pixel, in the event that disconnection 21 occurs in one drain-connecting electrode 5a and no on-state current can be supplied (see (b) of FIG. 11A), the other TFT can write to. In this case, gate-drain capacity Cgd is reduced due to the decrease in the number of TFTs to one. However, by laser-cutting the pixel electrode 7 at a position 23 not overlapping with the first or second capacitor electrode 10A or 10B (position overlapping with the slit 10S), the second capacitor can be separated to reduce a storage capacity Cs to a capacity corresponding to only the first capacitor, thereby retaining a gate feedthrough voltage Vgf to be unchanged.

When a metal electrode is located uppermost, laser cutting can be easily performed because metal is easily evaporated. When an insulating film is located on a metal electrode, light passes through the insulating film and is irradiated to the metal electrode for evaporation from between the voids of the insulating film, although the insulating film will be damaged. Thus, laser cutting can be performed in this case as well. However, in the case of a laminate structure of metal, insulating film and metal, it is true that laser cutting can be conducted for the upper layer metal electrode, but the laser cutting in this case damages the insulating film and thus the withstand voltage across the upper metal electrode and the lower metal electrode may be impaired. Further, since the upper layer metal is easily evaporated, it is difficult to connect the upper and lower metals by laser. Since semiconductors absorb some light, laser cutting of semiconductors can be conducted.

When a short circuit occurs as well, the adverse effect can be avoided by conducting laser cutting. If a short circuit 22 occurs between the source and drain electrodes 4 and 5 (see (c) of FIG. 11B), the drain-connecting electrode 5a of the TFT is cut at a position 23 not overlapping with the gate electrode 2 as the gate wiring 2', or the capacitor electrode 10 and the capacitor wiring 10'. Further, in this case, the pixel electrode 7 is cut at a position 23 not overlapping with the first or second capacitor electrode 10A or 10B (position overlapping with the slit 10S). This can avoid a point defect that is caused when the source voltage is directly applied to the pixel electrode 7 and can also avoid variation in the gate feedthrough voltage.

Figure 11B:
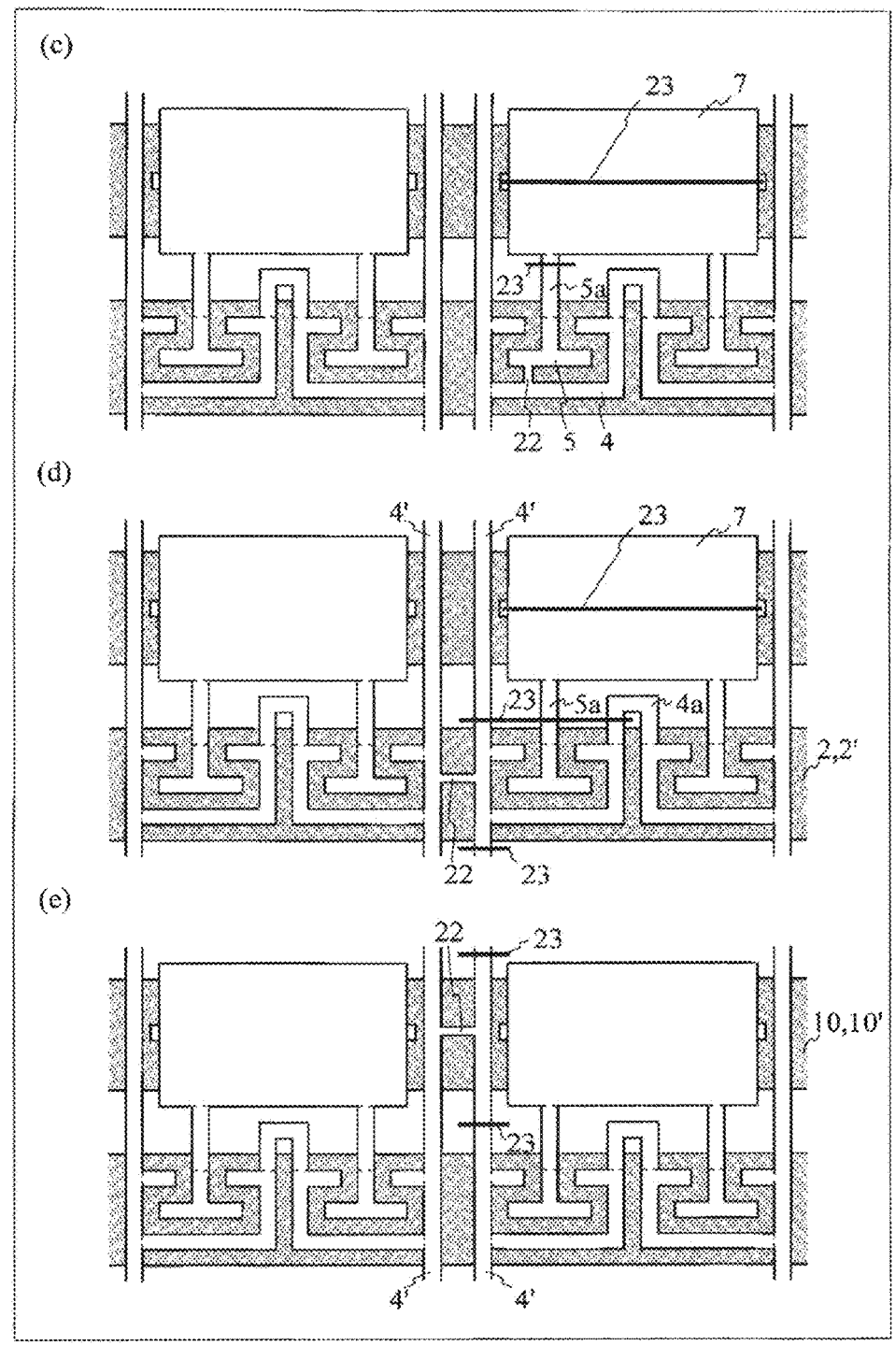
FIG. 11B is a plan view illustrating an example of a repair process for the thin-film transistor array according to the third embodiment of the present invention.

If a short circuit 22 occurs between adjacent source wirings 4' on the gate electrode 2 as the gate wiring 2' (see (d) of FIG. 11B), cutting is conducted in two upper and lower portions sandwiching the short circuited portion of the source wiring 4', and in the drain- and source-connecting electrodes 5a and 4a of the transistor located nearest the short circuited portion, at positions 23 not overlapping with the gate electrode 2 as the gate wiring 2', or the capacitor electrode 10 and the capacitor wiring 10'. Further, in this case, the pixel electrode 7 is cut at a position 23 not overlapping with the first or second capacitor electrode 10A or 10B (position overlapping with the slit 10S). The cutting only has to be conducted for at least one of the two short-circuited source wirings 4'. Thus, the source driver is prevented from being broken or the display is prevented from having a line defect, or the gate feedthrough voltage is prevented from being varied.

If a short circuit 22 occurs between adjacent source wirings 4' on the capacitor wiring 10' (see (e) of FIG. 11B), cutting is conducted in two upper and lower positions sandwiching the short circuited portion of the source wiring 4', at positions 23 not overlapping with the gate electrode 2 as the gate wiring 2' or the capacitor wiring 10'. The cutting only has to be conducted for at least one of the two short-circuited source wirings 4'. Thus, the source driver is prevented from being broken or the display is prevented from having a line defect.

Figure 11C:
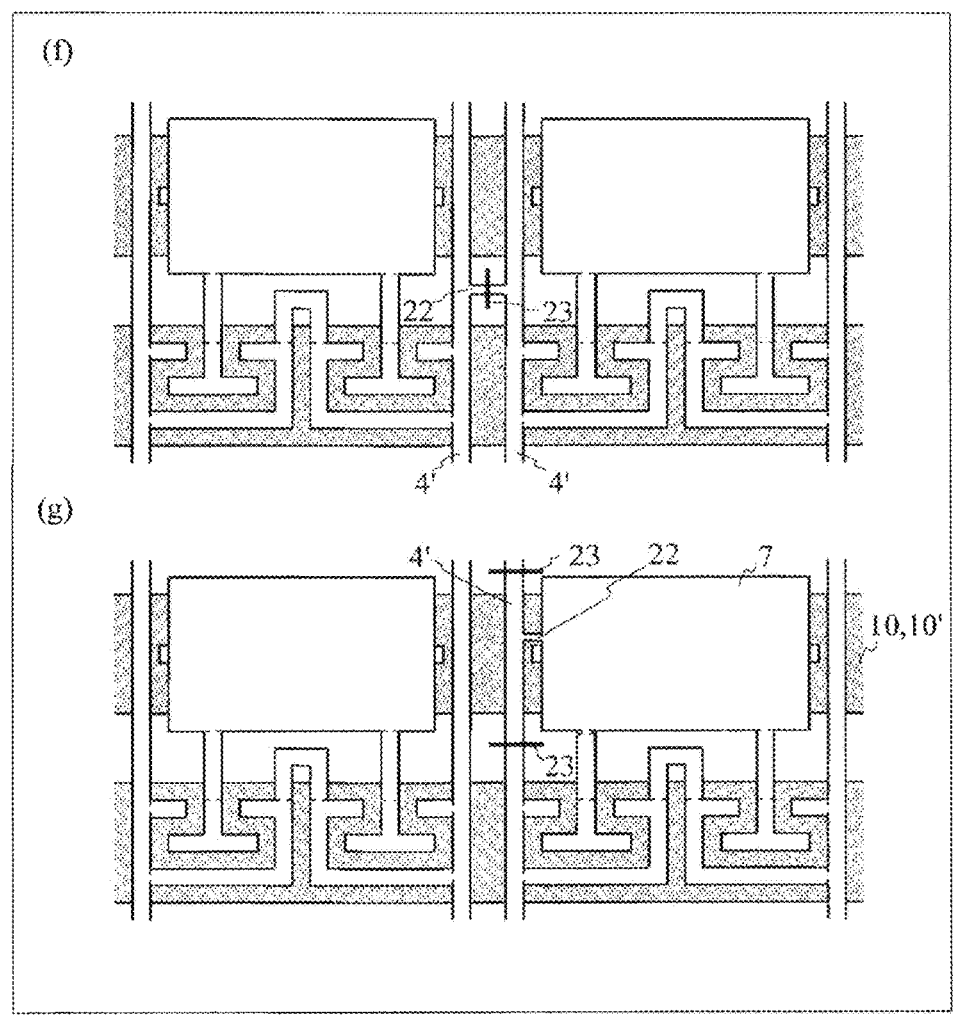
FIG. 11C is a plan view illustrating an example of a repair process for the thin-film transistor array according to the third embodiment of the present invention.

If a short circuit 22 occurs between adjacent source wirings 4' at a position not overlapping with the gate electrode 2 as the gate wiring 2' or the capacitor wiring 10' (see (f) of FIG. 11C), cutting is conducted at any position 23 in the short circuited portion. Thus, the source driver is prevented from being broken or the display is prevented from having a line defect.

If a short circuit 22 occurs between the source wiring 4' and the pixel electrode 7 on the capacitor electrode 10 or the capacitor wiring 10' (see (g) of FIG. 11C), cutting is conducted in two upper and lower portions sandwiching the short circuited portion of the source wiring 4', at positions 23 not overlapping with the gate electrode 2 as the gate wiring 2', or the capacitor electrode 10 and the capacitor wiring 10'.

This can avoid a point defect that is caused when the source voltage is directly applied to the pixel electrode 7.

Figure 11D:
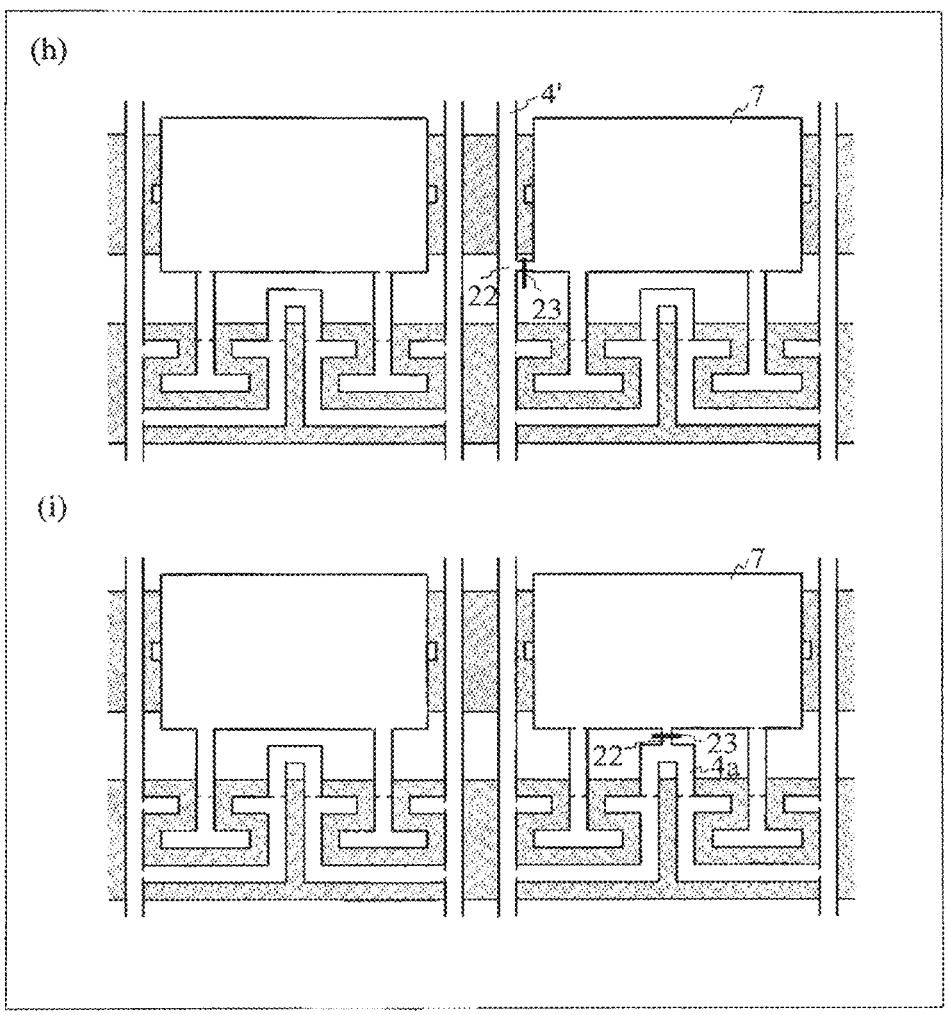
FIG. 11D is a plan view illustrating an example of a repair process for the thin-film transistor array according to the third embodiment of the present invention.

If a short circuit occurs between the source wiring 4' and the pixel electrode 7, at a position not overlapping with the gate electrode as the gate wiring 2', or the capacitor electrode 10 and the capacitor wiring 10' (see (h) of FIG. 11D), cutting is conducted at any position 23 in the short circuited portion. This can avoid a point defect that is caused when the source voltage is directly applied to the pixel electrode 7.

If a short circuit 22 occurs between the pixel electrode 7 and the source-connecting electrode 4a (see (i) of FIG. 11D), the short circuited portion is cut, at a position 23 not overlapping with the gate electrode 2 as the gate wiring 2', or the capacitor electrode 10 and the capacitor wiring 10'. This can avoid a point defect that is caused when the source voltage is directly applied to the pixel electrode 7.

If a short circuit has occurred or possibly occurs between the source wiring 4' or the source electrode 4 and the gate electrode 2 as the gate wiring 2', cutting can be conducted, similar to (d) of FIG. 11B, in two upper and lower portions of the source wiring 4' and in the drain- and source-connecting electrodes 5a and 4a, at positions 23 not overlapping with the gate electrode 2 as the gate wiring 2', or the capacitor electrode 10 and the capacitor wiring 10'. Further, in this case, the pixel electrode 7 can be cut at a position 23 not overlapping with the gate electrode 10 (position overlapping with the slit 10S). Thus, the driver is prevented from being broken or the display is prevented from having a cross-line defect, or the gate feedthrough voltage is prevented from varying. However, this short circuit cannot necessarily be detected through an image inspection.

If a short circuit has occurred or possibly occurs between the source wiring 4' or the source electrode 4 and the capacitor electrode 10 or the capacitor wiring 10', cutting can be conducted, similar to (g) of FIG. 11C, at positions 23, in two upper and lower portions of the source wiring 4', at positions 23 not overlap with the gate electrode 2 as the gate wiring 2', or the capacitor electrode 10 and the capacitor wiring 10'. Thus, the source driver is prevented from being broken or the display is prevented from having a line defect. However, again, this short circuit cannot necessarily be detected through an image inspection.

In FIGS. 7A and 7B, the source-connecting electrode 4a has a portion which does not overlap at all with the gate electrode 2 as the gate wiring 2'. The expression "portion which does not overlap at all" means that the portion of the source-connecting electrode 4a does not overlap at all with the gate electrode 2 as the gate wiring 2' in respect of a width direction of the portion. Thus, when the source-connecting electrode 4a is laser-cut, laser is not required to be applied to the portion overlapping with the gate electrode 2 as the gate wiring 2' and accordingly the gate-source withstand voltage is not lowered. On the other hand, if the source-connecting electrode 4a partially overlaps with the gate electrode 2 as the gate wiring 2' (see (b) of FIG. 8), laser has to be applied to the portion overlapped with the gate electrode 2 as the gate wiring 2'. As a result, in laser-cutting the source-connecting electrode 4a, the gate-source withstand voltage may be lowered.

In FIGS. 7A to 7B, the source-connecting electrode 4a is located on the same side as the drain-connecting electrode 5a is located relative to the gate electrode 2 as the gate wiring 2' as viewed perpendicularly from above. In this regard, as shown in FIG. 8 by (a), the source-connecting electrode 4a may be located on the opposite side of the drain-connecting electrode 5a relative to the gate electrode 2 as the gate wiring 2' as viewed perpendicularly from above. As shown in FIG. 8 by (c), the slit 10S of the capacitor electrode 10 may be formed so as to be also connected to the capacitor wiring 10', so that the capacitor electrode 10 as the capacitor wiring 10' as a whole may be in two stripes. Further, the shapes of the source electrode 4 and the drain electrode 5 are not limited to the ones shown in FIG. 7A by (b). For example, the shapes of these electrodes may be as shown in FIG. 8 by (c). The semiconductor patterns 6 may be independently dotted in each TFT. Alternatively, the semiconductor patterns 6 corresponding to two TFTs connected to the same pixel electrode may form one continuous dot. For example, the four semiconductor dots shown in FIG. 7A by (c) may be connected on a two-by-two basis, forming two rectangles, or the two semiconductor dots shown in FIG. 8 by (a) to (c) may be connected to form one rectangle. In this case, one print pattern has an area enlarged by a factor of two or more. Accordingly, when the supply amount of a semiconductor ink is uneven, the film thickness will be uniform and thus unevenness can be reduced.

Referring to FIGS. 7A and 7B, a method for fabricating the thin-film transistor array of the third embodiment will be described. First, the gate electrode 2 as the gate wiring 2' and the capacitor electrode 10 and the capacitor wiring 10' having the slit 10S are formed on the insulating substrate 1 (see (a) of FIG. 7A). As the insulating substrate 1, a rigid member, such as a glass substrate, may be used, or a flexible member may be used, which is made such as of polyethylene terephthalate (PET), polyethylene naphthalate (PEN), polyimide (PI), polyetherimide (PEI), or polyethersulfone (PES). Materials that can be used for the gate electrode 2, the gate wiring 2', the capacitor electrode 10 and the capacitor wiring 10' include metals, such as Al, Ag, Cu, Cr, Ni, Mo, Au and Pt, electrically conductive oxides, such as ITO, carbon, electrically conductive polymers, and the like. As the fabrication method that can be used, mention can be made of a method of printing/baking an ink, a method of applying overall coating, followed by photolithography, etching and resist separation, or a method of applying overall coating, followed by resist printing, etching and resist separation.

Then, a gate insulator film (not shown) is formed over the entire surface. Materials that can be used for the gate insulator film include inorganic materials, such as $SiO_2$, SiON and SiN, and organic materials, such as polyvinyl phenol (PVP), and epoxy. The fabrication method includes vacuum coating, such as sputtering or CVD, or coating/baking of a solution. No gate insulator film is provided to a voltage supply portion (not shown) which is located outside the thin-film transistor array and used for the gate wiring 2'.

Then, the source electrode 4, the source wiring 4', the source-connecting electrode 4a, the drain electrode 5, the drain-connecting electrode 5a and the pixel electrode 7 are formed (see (b) of FIG. 7A). As materials that can be used for the source electrode 4, the source wiring 4', the source-connecting electrode 4a, the drain electrode 5, the drain-connecting electrode 5a and the pixel electrode 7 include metals, such as Ag, Cu, Cr, Ni, Mo, Au, Pt and Al, electrically conductive oxides, such as ITO, carbon, electrically conductive polymers, and the like. The fabrication method may include overall coating, followed by photolithography, etching and resist separation. Desirably, however, a method of printing/baking an ink is used. The printing method that can be favorably used includes screen printing, gravure printing, flexographic printing, offset printing, or the like. In particular, gravure printing, flexographic printing or offset printing can form a pattern of not more than 20 μm width with good reproducibility.

The source electrode 4, the source wiring 4', the source-connecting electrode 4a, the drain electrode 5, the drain-connecting electrode 5a and the pixel electrode 7 are subjected to image inspection. Specifically, these electrodes and wirings are subjected to image processing to check for the presence of disconnections or short circuited portions. If there is a disconnection in the source wiring 4', there is no adverse effect unless the two right and left source wirings 4' are simultaneously disconnected in the same one pixel. If there is a disconnection in the drain-connecting electrode 5a, no problem will be caused in the operation unless the two drain-connecting electrodes that drive the same one pixel are simultaneously disconnected, although the driving has to be performed by one TFT.

Then, as a measure against disconnections or short circuits, laser cutting is conducted. Laser cutting is conducted for at least the disconnection in the drain-connecting electrode 5a, the short circuit between the source electrode 4 and the drain electrode 5, the short circuit between adjacent source wirings 4', the short circuit between the source wiring 4' and the pixel electrode 7, and the short circuit between the pixel electrode 7 and the source-connecting electrode 4a in manners shown from (b) of FIG. 11A to (i) of FIG. 11D.

The step of inspection may be performed not only before the step of forming the semiconductor patterns 6 described later, but also after the step of forming the semiconductor patterns 6, or after forming the protective layer 6'. The step of laser cutting only has to be performed after the step of inspection. Specifically, laser cutting may be performed after forming the semiconductor patterns 6 or after forming the protective layer 6'. More specifically, laser cutting may be performed in any of the following sequences.

1) Inspection→Laser cutting-Semiconductors→Protective layer
2) Inspection→Semiconductors→Laser cutting→Protective layer
3) Inspection→Semiconductors→Protective layer→Laser cutting
4) Semiconductors→Inspection→Laser cutting→Protective layer
5) Semiconductors→Inspection→Protective layer→Laser cutting
6) Semiconductors→Protective layer→Inspection→Laser cutting However, normally, it is desirable that the protective layer 6' is promptly formed after forming the semiconductor patterns 6. Accordingly, any of the courses 1), 3) and 6) is desirable. When inspection is difficult for such a reason as that the semiconductor patterns 6 have a lot of irregularities, any of the courses 1), 2) and 3) is desirable.

The semiconductor patterns 6 are formed before the step of inspection and the step of laser cutting, or between these steps, or after these steps (see (c) of FIG. 7A). For the semiconductor patterns 6, there can be used organic semiconductors such as polythiophenes, acene-based materials, allylamine-based materials or the like, and oxide semiconductors such as of $In_2O_3$, $Ga_2O_3$, ZnO, $SnO_2$, InGaZnO, InGaSnO, InSnZnO or the like. The fabrication method favorably is a method of printing/baking a solution by means of ink-jet printing, dispenser printing, screen printing, or the like.

After forming the semiconductor patterns 6, the protective layer 6' is formed (see (d) of FIG. 7B). The protective layer 6' covers at least the semiconductor patterns 6, the source electrodes 4 and the drain electrodes 5 and desirably covers the entire gate electrodes 2 as the gate wirings 2'. When laser cutting is conducted after forming the protective layer 6', the source-connecting electrodes 4a cannot be covered with the protective layer 6'. Materials that can be used for the protective layer 6' include fluorine-containing resins, silicone-based resins, and the like. The fabrication method favorably is a method of printing/baking a solution by means of ink-jet printing, dispenser printing, screen printing, or the like.

After the step of laser cutting and after forming the protective layer 6', the insulating film 8 is formed (see (e) of FIG. 7B). The insulator film 8 has an opening 8H above the first capacitor portion 7A of the pixel electrode 7, and covers at least the second capacitor portion 7B, the source electrode 4, the source-connecting electrode 4a, and the source wiring 4'. As the insulating film 8, an organic insulating film such as of epoxy is favorably used. For forming the film, screen printing or gravure offset printing is favorably used.

Further, an upper pixel electrode 9 is formed (see (f) of FIG. 7B). As the upper pixel electrode 9, an Ag paste or the like is favorably used. For forming the pixel electrode, screen printing or gravure offset printing is favorably used.

After the step of forming the gate electrode 2 as the gate wiring 2', the capacitor electrode 10 and the capacitor wiring 10' but before the step of forming the gate insulator film, there may further be provided a step of inspecting for short circuits between the gate electrode 2 as the gate wiring 2' and the capacitor electrode 10 or the capacitor wiring 10', and a step of laser-cutting the short circuit.

Fourth Embodiment

Figure 9A:
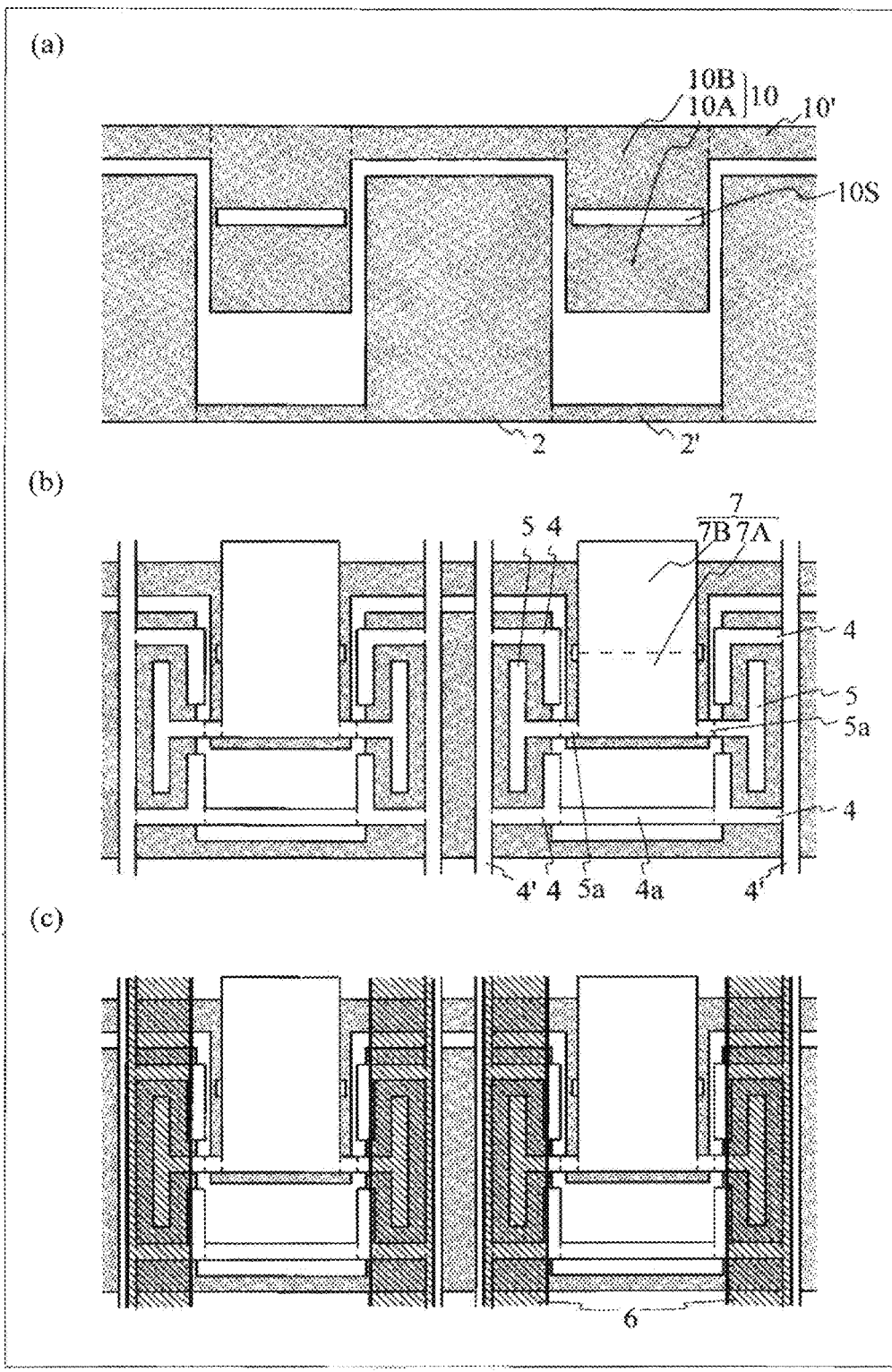
FIG. 9A is a plan view illustrating an example of a repair process for the thin-film transistor array according to the fourth embodiment of the present invention.
Figure 10:
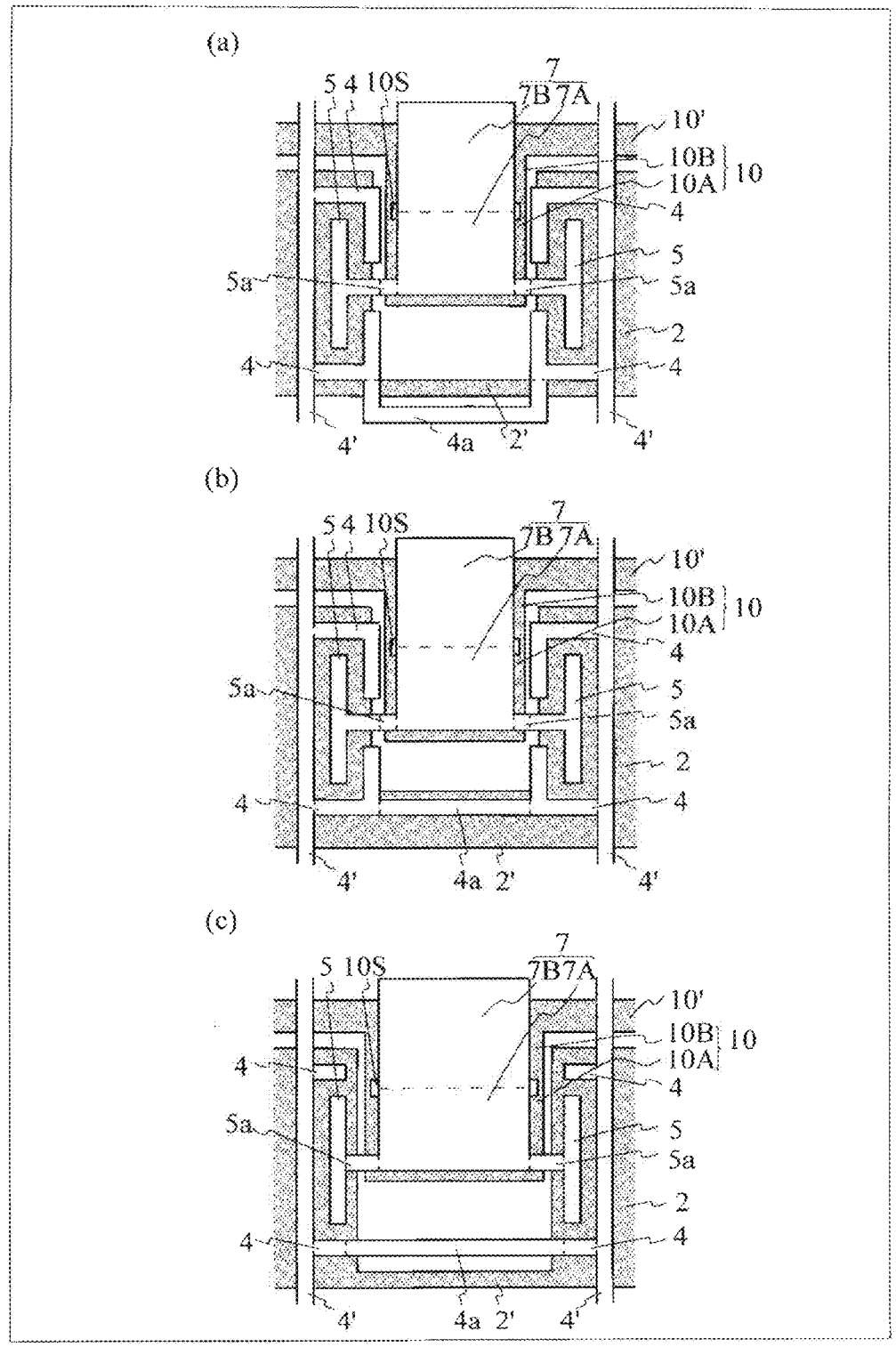
FIG. 10 is a plan view illustrating an example of a repair process for another thin-film transistor array according to the fourth embodiment of the present invention.

FIGS. 9A, 9B and 10 show an example of a thin-film transistor array according to a fourth embodiment of the present invention. Each thin-film transistor includes an insulating substrate 1 which is provided thereon with a gate electrode 2 and a gate wiring 2' connected to the gate electrode 2, and a capacitor electrode 10 and a capacitor wiring 10' connected to the capacitor electrode 10. On these electrodes and wirings, two sets of source electrode 4 and drain electrode 5 having gaps are provided, for each pixel, in a region overlapping with the gate electrode 2 as viewed perpendicularly from above. Semiconductor patterns 6 are each provided at least in a gap between the source electrode 4 and the drain electrode 5. The two source electrodes 4 are separately connected to two respective source wirings 4'. The two drain electrodes 5 are connected to one pixel electrode 7 via two drain-connecting electrodes 5a. The pixel electrode 7 at least overlaps with the capacitor electrode 10. The thin-film transistors are provided with a protective layer 6' covering at least the semiconductor patterns 6. Each thin-film transistor includes a source-connecting electrode 4a that connects between the two source electrodes 4. The same drive waveform is applied to the two source wirings 4'. The pixel electrode 7 has a first capacitor near the drain electrodes 5, and a second capacitor remote from the drain electrodes 5.

FIG. 9A shows in (a) a plan view in which the gate electrode 2, the gate wiring 2', the capacitor electrode 10, and the capacitor wiring 10' are formed on the insulating substrate 1. FIG. 9A shows in (b) a plan view in which a gate insulator film (not shown) is formed on these electrodes and wirings, followed by forming the source electrode 4, the source wiring 4', the source-connecting electrode 4a, the drain electrode 5, the drain-connecting electrode 5a and the pixel electrode 7. The capacitor electrode 10 has a slit 10S that is parallel to a longitudinal direction of the capacitor wiring 10'. The slit 10S defines a first capacitor electrode 10A and a second capacitor electrode 10B in the capacitor electrode 10. The pixel electrode 7, the gate insulator film and the first capacitor electrode 10A constitute the first capacitor, while the pixel electrode 7, the gate insulator film and the second capacitor electrode 10B constitute the second capacitor. FIG. 9A shows in (c) a plan view after formation of the semiconductor patterns 6. The semiconductor patterns 6 are arranged in a stripe pattern which is continuous over a plurality of TFTs and parallel to the source wiring 4' and has a uniform width. In this case, there is an advantage of not having an adverse effect if there is a vertical offset, as viewed in the figure, in the alignment of the semiconductor patterns 6 (offset in a direction parallel to the source wirings 4'). FIG. 9B shows in (d) a plan view after formation of the protective layer 6'. The protective layer 6' plays a role of protecting the semiconductor patterns 6 from the components of a display medium 13 or an insulating film 8 described later. The protective layer 6' is formed covering at least the semiconductor patterns 6. Desirably, the protective layer 6' is in a stripe pattern which is continuous over a plurality of TFTs and parallel to the source wirings 4' and has a uniform width. The stripe pattern with a uniform width can provide an advantage of not being influenced by the vertical offset of the protective layer 6' relative to the lower layer of the source and drain electrodes 4 and 5 and the semiconductor patterns 6. FIG. 9B shows in (e) a plan view in which the insulating film 8 is further formed. FIG. 9B shows in (e) the insulating film 8 having an opening 8H above the first capacitor portion 7A of the pixel electrode 7. The insulating film 8 at least covers the second capacitor portion 7B, the source electrodes 4, the source-connecting electrode 4a and the source wirings 4'. As shown in FIG. 9B by (f), an upper pixel electrode 9 is provided. The upper pixel electrode 9 is connected to the first capacitor portion 7A of the pixel electrode 7 via the opening 8H of the insulating film 8.

Referring to FIGS. 12A to 12D, measures against disconnections or short circuits will be described. The thin-film transistor array of the fourth embodiment has the source-connecting electrode 4a. Therefore, if a disconnection occurs in any of the source wiring 4', the source electrode 4 and the source-connecting electrode 4a, the source voltage can be supplied, as it is, to the source electrode 4 after the occurrence of the disconnection.

For example, when current is supplied to the source wiring 4' upward as viewed in (a) of FIG. 12A and there is a disconnection 21 in the left source wiring 4', current is supplied from immediately above the disconnection 21 through the right source wiring 4'→right source electrode 4→source-connecting electrode 4a→left source electrode 4→left source wiring 4', and thus the disconnection 21 produces no adverse effect. Since the source-connecting electrode 4a connects between the two source electrodes 4, there is no need of separately providing a redundant wiring that directly connects between the two source wirings 4', thereby increasing the opening rate.

Further, since one pixel has two TFTs, if a disconnection 21 occurs in one drain-connecting electrode 5a to interrupt the on-state current (see (b) of FIG. 12A) or if a disconnection occurs in the source electrode 4 or the drain electrode 5 to reduce the on-state current, the other TFT can write to. In this case, gate-drain capacity Cgd is reduced due to the decrease in the number of TFTs to one. However, by laser-cutting the pixel electrode 7 at a position 23 not overlapping with the first or second capacitor electrode 10A or 10B (position overlapping with the slit 10S), the second capacitor can be separated to thereby reduce a storage capacity Cs to a capacity corresponding to only the first capacitor, thereby retaining a gate feedthrough voltage Vgf to be unchanged.

When a metal electrode is located uppermost, laser cutting can be easily performed because metal is easily evaporated. When an insulating film is located on a metal electrode, light passes through the insulating film and is irradiated to the metal electrode for evaporation from between the voids of the insulating film, although the insulating film will be damaged. Thus, laser cutting can be performed in this case as well. However, in the case of a laminate structure of metal, insulating film and metal, it is true that laser cutting can be conducted for the upper layer metal electrode, but the laser cutting in this case damages the insulating film and thus the withstand voltage across the upper metal electrode and the lower metal electrode may be impaired. Further, since the upper layer metal is easily evaporated, it is difficult to connect the upper and lower metals by laser. Since semiconductors absorb some light, laser cutting of semiconductors can be conducted.

When a short circuit occurs as well, the adverse effect can be avoided by conducting laser cutting. If a short circuit 22 occurs between the source and drain electrodes 4 and 5 (see (c) of FIG. 12B), the drain-connecting electrode 5a of the TFT is cut at a position 23 not overlapping with the gate electrode 2, the gate wiring 2', the capacitor electrode 10 and the capacitor wiring 10'. Further, in this case, the pixel electrode 7 is cut at a position 23 not overlapping with the first or second capacitor electrode 10A or 10B (position overlapping with the slit 10S). This can avoid a point defect that is caused when the source voltage is directly applied to the pixel electrode 7 and can also avoid variation in the gate feedthrough voltage.

Figure 12B:
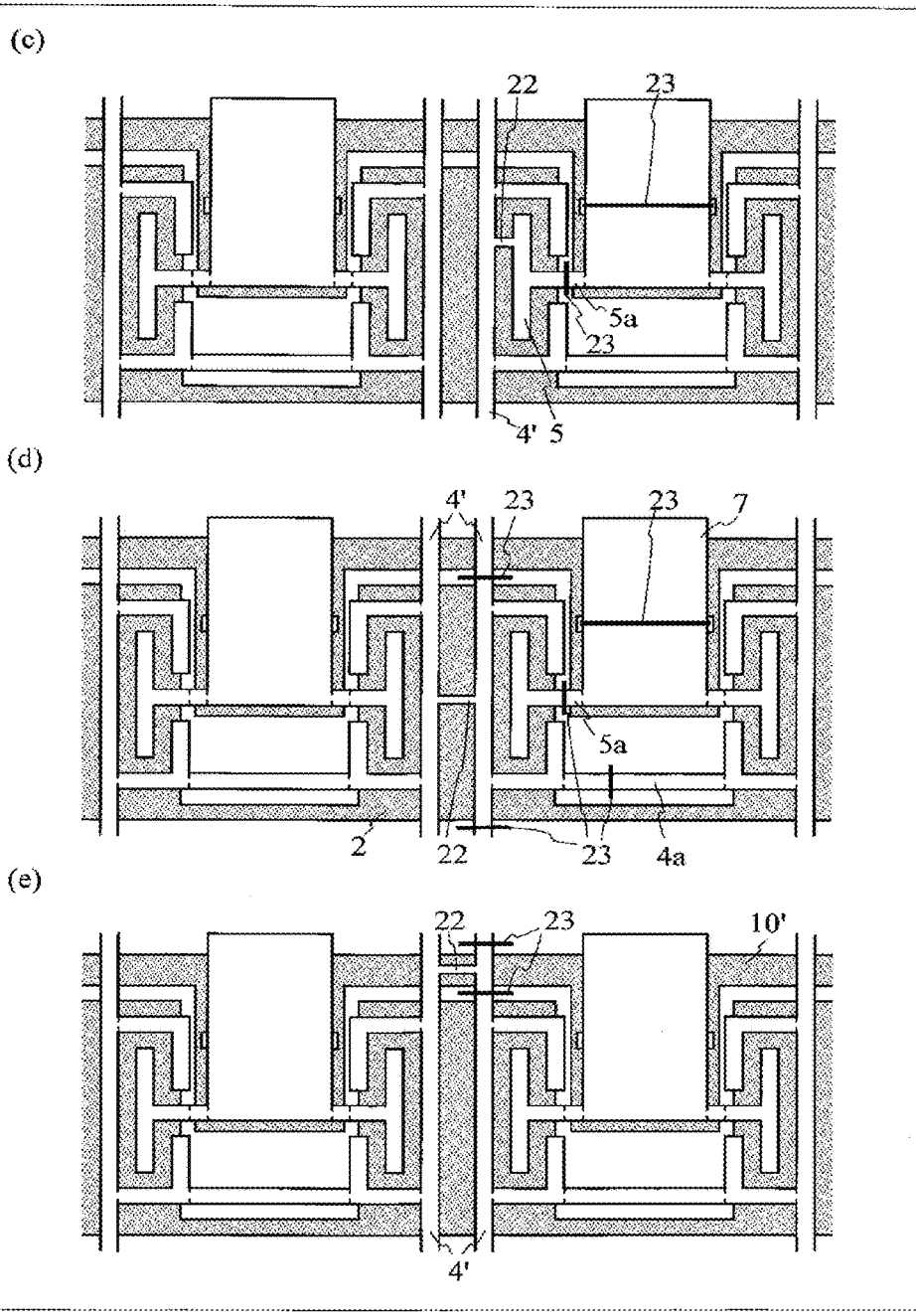
FIG. 12B is a plan view illustrating an example of a repair process for the thin-film transistor array according to the fourth embodiment of the present invention.

If a short circuit 22 occurs between adjacent source wirings 4' on the gate electrode 2 (see (d) of FIG. 12B), cutting is conducted in two upper and lower portions sandwiching the short circuited portion of the source wiring 4', and in the drain- and source-connecting electrodes 5a and 4a, at positions 23 not overlapping with the gate electrode 2 or the capacitor wiring 10'. Further, in this case, the pixel electrode 7 is cut at a position 23 not overlapping with the first or second capacitor electrode 10A or 10B (position overlapping with the slit 10S). The cutting only has to be conducted for at least one of the two short-circuited source wirings 4'. Thus, the source driver is prevented from being broken or the display is prevented from having a line defect, or the gate feedthrough voltage is prevented from being varied.

If a short circuit 22 occurs between adjacent source wirings 4' on the capacitor wiring 10' (see (e) of FIG. 12B), cutting is conducted in two upper and lower portions sandwiching the short circuited portion of the source wiring 4', at positions 23 not overlapping with the gate electrode 2 or the capacitor wiring 10'. The cutting only has to be conducted for at least one of the two short-circuited source wirings 4'. Thus, the source driver is prevented from being broken or the display is prevented from having a line defect.

Figure 12C:
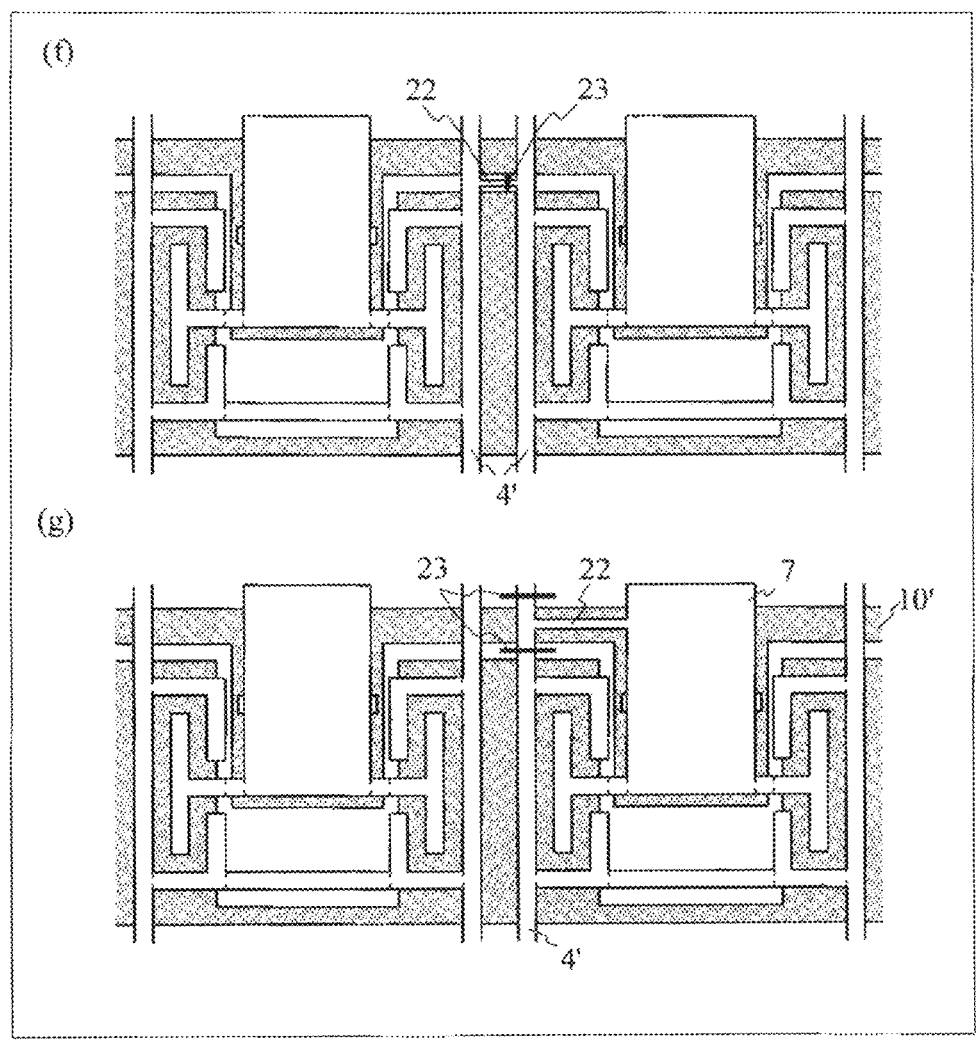
FIG. 12C is a plan view illustrating an example of a repair process for the thin-film transistor array according to the fourth embodiment of the present invention.

If a short circuit 22 occurs between adjacent source wirings 4' at a position not overlapping with the gate electrode 2 or the capacitor wiring 10' (see (f) of FIG. 12C), cutting is conducted at any position 23 in the short circuited portion. Thus, the source driver is prevented from being broken or the display is prevented from having a line defect.

If a short circuit 22 occurs between the source wiring 4' and the pixel electrode 7 on the capacitor electrode 10 or the capacitor wiring 10' (see (g) of FIG. 12C), cutting is conducted in two upper and lower portions sandwiching the short circuited portion of the source wiring 4', at positions 23 not overlapping with the gate electrode 2, the gate wiring 2', the capacitor electrode 10 and the capacitor wiring 10'. This can avoid a point defect that is caused when the source voltage is directly applied to the pixel electrode 7.

Figure 12D:
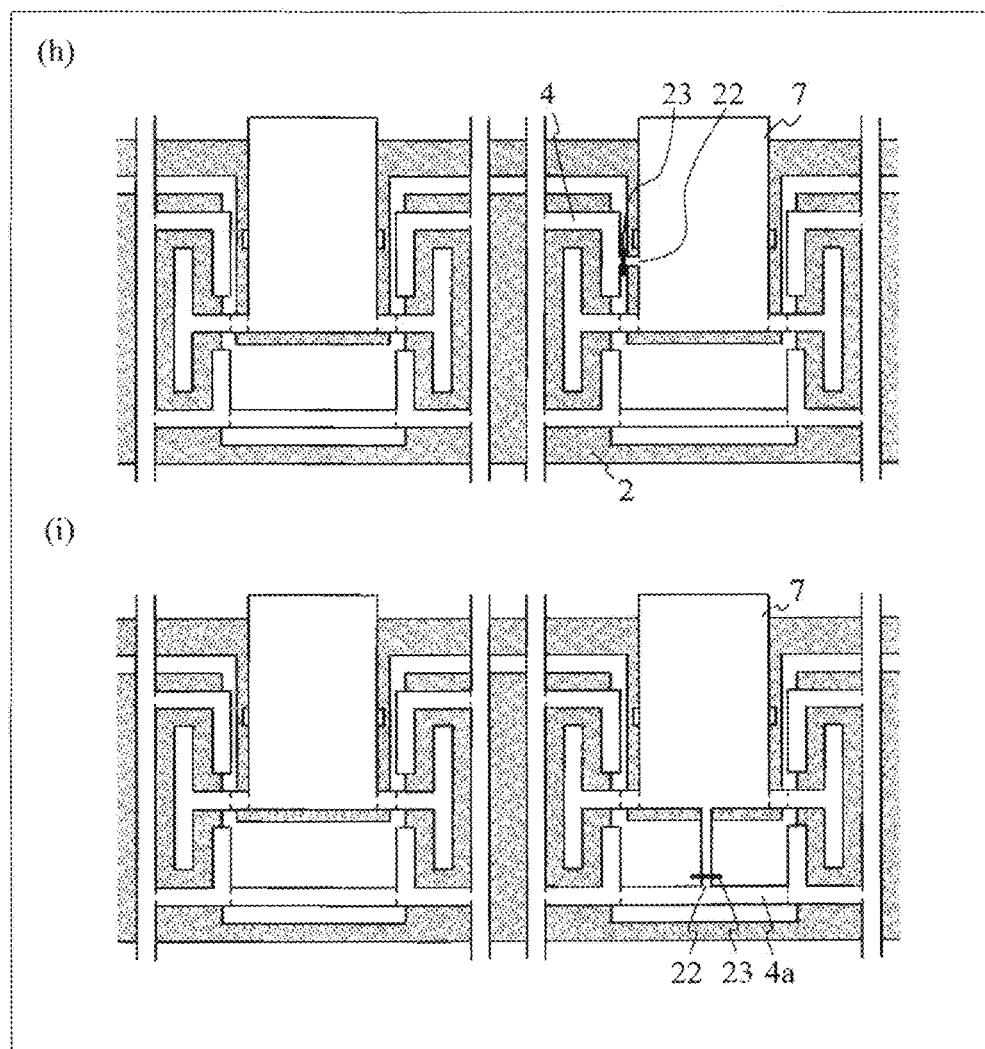
FIG. 12D is a plan view illustrating an example of a repair process for the thin-film transistor array according to the fourth embodiment of the present invention.

If a short circuit 22 occurs between the source wiring 4' or the source electrode 4 and the pixel electrode 7, at a position 23 not overlapping with the gate electrode 2, or the capacitor electrode 10 and the capacitor wiring 10' (see (h) of FIG. 12D), the short circuited portion is cut at any position 23. This can avoid a point defect that is caused when the source voltage is directly applied to the pixel electrode 7.

If a short circuit 22 occurs between the pixel electrode 7 and the source-connecting electrode 4a (see (i) of FIG. 12D), the short circuited portion is cut at a position 23 not overlapping with the gate wiring 2' or the capacitor electrode 10. This can avoid a point defect that is caused when the source voltage is directly applied to the pixel electrode 7.

If a short circuit has occurred or possibly occurs between the source wiring 4' or the source electrode 4 and the gate electrode 2, cutting can be conducted, similar to (d) of FIG. 12B, in two upper and lower portions of the source wiring 4' and in the drain- and source-connecting electrodes 5a and 4a, at positions 23 not overlapping with the gate electrode 2 and the gate wiring 2', or the capacitor electrode 10 and the capacitor wiring 10'. Further, in this case, the pixel electrode 7 can be cut at a position 23 not overlapping with the gate electrode 10 (position overlapping with the slit 10S). Thus, the driver is prevented from being broken or the display is prevented from having a cross-line defect. However, this short circuit cannot necessarily be detected through an image inspection.

If a short circuit has occurred or possibly occurs between the source wiring 4' or the source electrode 4 and the capacitor wiring 10', cutting can be conducted, similar to (g) of FIG. 12C, in two upper and lower portions of the source wiring 4', at positions 23 not overlapping with the gate electrode 2 or the capacitor wiring 10'. Thus, the source driver is prevented from being broken or the display is prevented from having a line defect. However, again, this short circuit cannot necessarily be detected through an image inspection.

In FIGS. 9A and 9B, the source-connecting electrode 4a has a portion which does not overlap at all with the gate wiring 2'. The expression "portion which does not overlap at all" means that the portion of the source-connecting electrode 4a does not overlap at all with the gate wiring 2' in respect of a width direction of the portion. Thus, when the source-connecting electrode 4a is laser-cut, laser is not required to be applied to the portion overlapping with the gate wiring 2' and accordingly the gate-source withstand voltage is not lowered. On the other hand, if the source-connecting electrode 4a partially overlaps with the gate wiring 2' (see (b) of FIG. 10), laser has to be applied to the portion overlapping with the gate wiring 2'. As a result, in laser-cutting the source-connecting electrode 4a, the gate-source withstand voltage may be lowered.

In FIGS. 9A to 9B, the source-connecting electrode 4a is located on the same side as the drain-connecting electrode 5a is located relative to the gate wiring 2' as viewed perpendicularly from above. In this regard, as shown in FIG. 10 by (a), the source-connecting electrode 4a may be located on the opposite side of the drain-connecting electrode 5a relative to the gate wiring 2' as viewed perpendicularly from above. Further, the shapes of the source electrode 4 and the drain electrode 5 are not limited to the ones shown in FIG. 9A by (b). For example, the shapes of these electrodes may be as shown in FIG. 10 by (c).

Referring to FIGS. 9A and 9B, a method for fabricating the thin-film transistor array of the fourth embodiment will be described. First, the gate electrode 2, the gate wiring 2', the capacitor electrode 10 having the slit 10S, and the capacitor wiring 10' are formed on the insulating substrate 1 (see (a) of FIG. 9A). As the insulating substrate 1, a rigid member, such as a glass substrate, may be used, or a flexible member may be used, which is made such as of polyethylene terephthalate (PET), polyethylene naphthalate (PEN), polyimide (PI), polyetherimide (PEI), or polyethersulfone (PES). Materials that can be used for the gate electrode 2, the gate wiring 2', the capacitor electrode 10, and the capacitor wiring 10' include metals, such as Al, Ag, Cu, Cr, Ni, Mo, Au and Pt, electrically conductive oxides, such as ITO, carbon, electrically conductive polymers, and the like. As the fabrication method that can be used, mention can be made of a method of printing/baking an ink, a method of applying overall coating, followed by photolithography, etching and resist separation, or a method of applying overall coating, followed by resist printing, etching and resist separation.

Then, a gate insulator film (not shown) is formed over the entire surface. Materials that can be used for the gate insulator film include inorganic materials, such as $SiO_2$, SiON and SiN, and organic materials, such as polyvinyl phenol (PVP), and epoxy. The fabrication method includes vacuum coating, such as sputtering or CVD, or coating/baking of a solution. No gate insulator film is provided to a voltage supply portion (not shown) which is located outside the thin-film transistor array and connected to the gate wiring 2'.

Then, the source electrode 4, the source wiring 4', the source-connecting electrode 4a, the drain electrode 5, the drain-connecting electrode 5a and the pixel electrode 7 are formed (see (b) of FIG. 9A). As materials that can be used for the source electrode 4, the source wiring 4', the source-connecting electrode 4a, the drain electrode 5, the drain-connecting electrode 5a and the pixel electrode 7 include metals, such as Ag, Cu, Cr, Ni, Mo, Au, Pt and Al, electrically conductive oxides, such as ITO, carbon, electrically conductive polymers, and the like. The fabrication method may include overall coating, followed by photolithography, etching and resist separation. Desirably, however, a method of printing/baking an ink is used. The printing method that can be favorably used includes screen printing, gravure printing, flexographic printing, offset printing, or the like. In particular, gravure printing, flexographic printing or offset printing can form a pattern of not more than 20 μm width with good reproducibility.

The source electrode 4, the source wiring 4', the source-connecting electrode 4a, the drain electrode 5, the drain-connecting electrode 5a and the pixel electrode 7 are subjected to image inspection. Specifically, these electrodes and wirings are subjected to image processing to check for the presence of disconnections or short circuited portions. If there is a disconnection in the source wiring 4', there is no adverse effect unless the two right and left source wirings 4' are simultaneously disconnected in the same one pixel. If there is a disconnection in the drain-connecting electrode 5a, no problem will be caused in the operation unless the two drain-connecting electrodes that drive the same one pixel are simultaneously disconnected, although the driving has to be performed by 1 TFT.

Then, as a measure against disconnections or short circuits, laser cutting is conducted. Laser cutting is conducted for at least the disconnection in the drain-connecting electrode 5a, the short circuit between the source electrode 4 and the drain electrode 5, the short circuit between adjacent source wirings 4', the short circuit between the source wiring 4' and the pixel electrode 7, and the short circuit between the pixel electrode 7 and the source-connecting electrode 4a in manners shown from (b) of FIG. 12A to (i) of FIG. 12D.

The step of inspection may be performed not only before the step of forming the semiconductor patterns 6 described later, but also after the step of forming the semiconductor patterns 6, or after forming the protective layer 6'. The step of laser cutting only has to be performed after the step of inspection. Specifically, laser cutting may be performed after forming the semiconductor patterns 6 or after forming the protective layer 6'. More specifically, laser cutting may be performed in any of the following sequences.

1) Inspection→Laser cutting→Semiconductors→Protective layer
2) Inspection→Semiconductors→Laser cutting→Protective layer
3) Inspection→Semiconductors-→Protective layer→Laser cutting
4) Semiconductors→Inspection→Laser cutting→Protective layer
5) Semiconductors→Inspection→Protective layer→Laser cutting
6) Semiconductors→Protective layer→Inspection→Laser cutting However, normally, it is desirable that the protective layer 6' is promptly formed after forming the semiconductor patterns 6. Accordingly, any of the courses 1), 3) and 6) is desirable. When inspection is difficult for such a reason as that the semiconductor patterns 6 have a lot of irregularities, any of the courses 1), 2) and 3) is desirable.

The semiconductor patterns 6 are formed before the step of inspection and the step of laser cutting, or between these steps, or after these steps (see (c) of FIG. 9A). For the semiconductor patterns 6, there can be used organic semiconductors such as polythiophenes, acene-based materials, allylamine-based materials or the like, and oxide semiconductors such as of $In_2O_3$, $Ga_2O_3$, ZnO, $SnO_2$, InGaZnO, InGaSnO, InSnZnO or the like. The fabrication method favorably is a method of printing/baking a solution by means of ink-jet printing, dispenser printing, flexographic printing, or the like.

After forming the semiconductor patterns 6, the protective layer 6' is formed (see (d) of FIG. 9B). The protective layer 6' covers at least the semiconductor patterns 6, the source electrodes 4 and the drain electrodes 5 and desirably covers the source wirings 4'. When laser cutting is conducted after forming the protective layer 6', the source-connecting electrodes 4a cannot be covered with the protective layer 6'. Materials that can be used for the protective layer 6' include fluorine-containing resins, silicone-based resins, and the like. The fabrication method favorably is a method of printing/baking a solution by means of ink-jet printing, dispenser printing, screen printing, or the like.

After the step of laser cutting and after forming the protective layer 6', the insulating film 8 is formed (see (e) of FIG. 9B). The insulator film 8 has an opening 8H above the first capacitor portion 7A of the pixel electrode 7, and covers at least the second capacitor portion 7B, the source electrode 4, the source-connecting electrode 4a, and the source wiring 4'. As the insulating film 8, an organic insulating film such as of epoxy is favorably used. For forming the film, screen printing or gravure offset printing is favorably used.

Further, an upper pixel electrode 9 is formed (see (f) of FIG. 9B). As the upper pixel electrode 9, an Ag paste or the like is favorably used. For forming the pixel electrode, screen printing or gravure offset printing is favorably used.

After the step of forming the gate electrode 2, the gate wiring 2', the capacitor electrode 10 and the capacitor wiring 10' but before the step of forming the gate insulator film, there may further be provided a step of inspecting for short circuits between the gate electrode 2 or the gate wiring 2', and the capacitor electrode 10 or the capacitor wiring 10', and a step of laser-cutting the short circuit.

Fifth Embodiment

The following description sets forth an image display device that uses the thin-film transistor array of the present invention.

Figure 13:
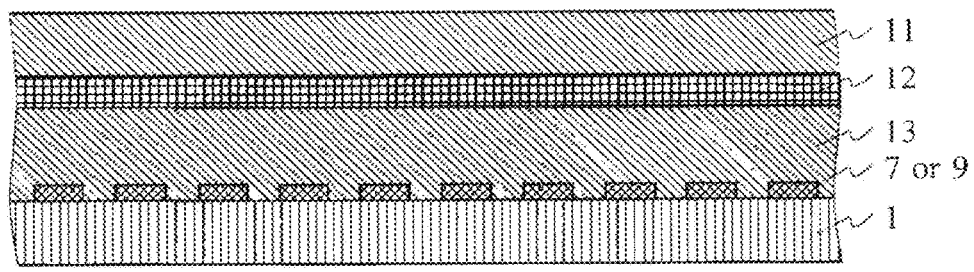
FIG. 13 is a cross-sectional view illustrating an example of a display device according to a fifth embodiment of the present invention.
Figure 14:
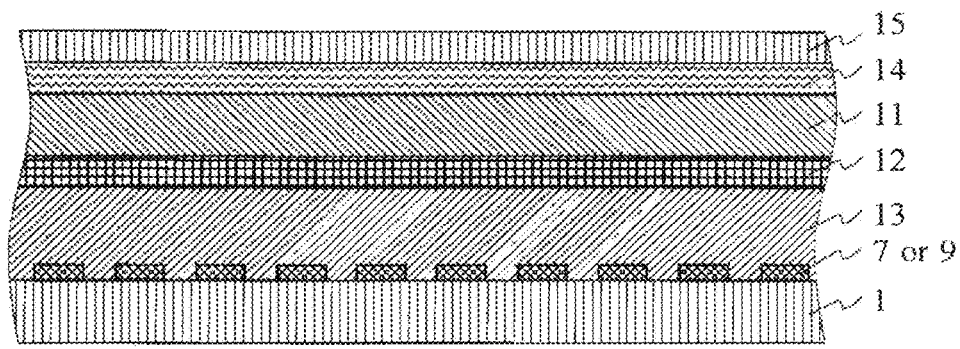
FIG. 14 is a cross-sectional view illustrating an example of a display device according to the fifth embodiment of the present invention.

A display medium 13 is interposed between the pixel electrode 7 or the upper pixel electrode 9 of the thin-film transistor of the present invention and a transparent counter electrode 12 to provide a reflection-type image display device (FIG. 13). In this case, the transparent electrode 12 is provided on a transparent counter substrate 11 that has been prepared separately. As the display medium 13, an electrophoretic member, a liquid crystal member, or the like is used. The electrophoretic member includes a member that is a capsule of reversely charged black and white particles, or a member that is a barrier plate including a colored liquid that contains charged particles, or the like. When a liquid crystal member is used, the member generally further includes an oriented film (not shown), a retarder 14, or a polarizer 15 (FIG. 14), which is not necessary in a polymer dispersed liquid crystal medium. For colorization, a color filter is used.

(Influence of Gate Feedthrough Voltage)

Hereinafter, influence of gate feedthrough voltage will be described.

Figure 15:
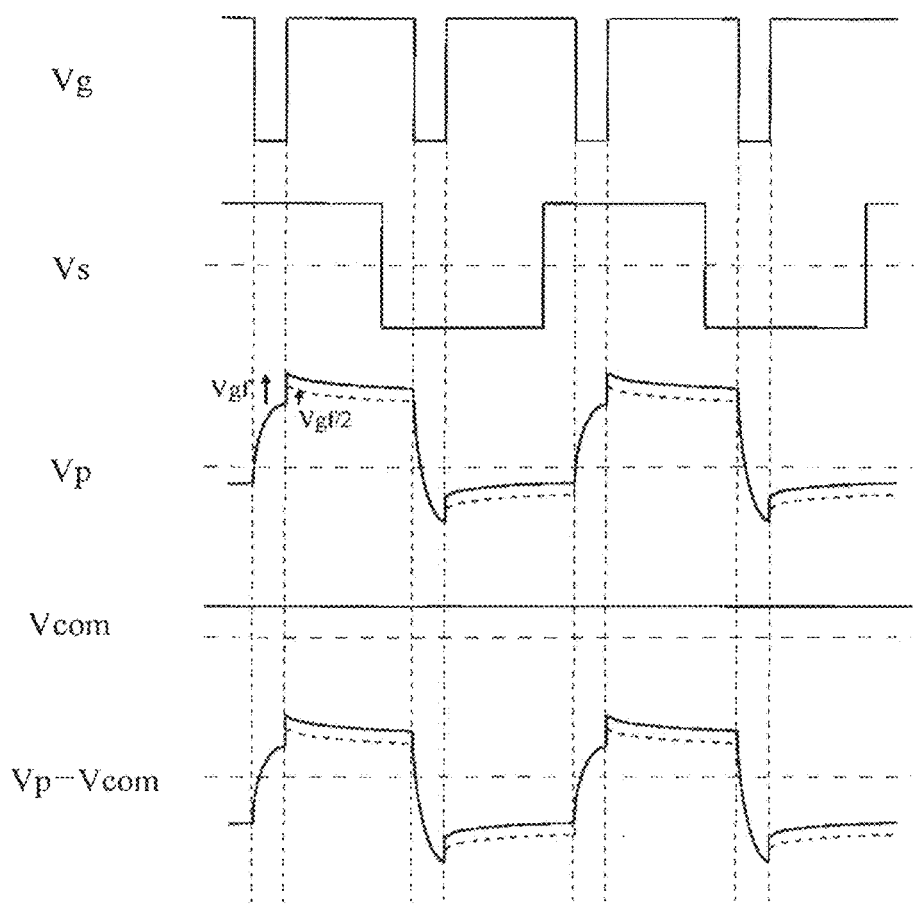
FIG. 15 is a waveform diagram illustrating an operation of the display device according to the fifth embodiment of the present invention.

First, the case of a p channel TFT is shown in FIG. 15. In a pixel that is driven by two TFTs, application of waveforms shown in FIG. 15 as a gate voltage Vg and a source voltage Vs creates a pixel potential Vp as indicated by the solid line in FIG. 15. When the gate voltage Vg is turned on→off, the pixel potential is offset and the offset is a gate feedthrough voltage Vgf. The gate feedthrough voltage Vgf expressed by $Vgf=\Delta Vg \times Cgd/(Cgd+Cs+Cp)$ is applied, where Cgd is a gate-drain capacitance of the thin-film transistor, Cs is a storage capacitance, Cp is a capacitance of the display medium, and $\Delta Vg$ is an on→off variation of the gate voltage. Normally, Cgd<<Cs+Cp is established. When a counter voltage Vcom is equal to the gate feedthrough voltage Vgf, a voltage Vp–Vcom applied to the display medium is as indicated in FIG. 15, substantially equal to the source voltage Vs of the on state. In FIG. 15, a selected time (period in which the gate voltage Vg is minus (–) to turn on the TFT) is indicated to be long for clarity, but actually the selected time is very short and the non-selected time takes up a greater proportion. Display is substantially determined by the voltage in the non-selected time.

On the other hand, in the case of 1-TFT pixel, the gate-drain capacitance Cgd is reduced to half and thus the gate feedthrough voltage Vgf is also reduced to approximately half, as indicated by the dashed line in FIG. 15. When the non-selected time alone is focused on, it will be understood that the voltage Vp-Vcom applied to the display medium is offset to a minus (–) side by a gate feedthrough difference Vgf/2.

Figure 17:
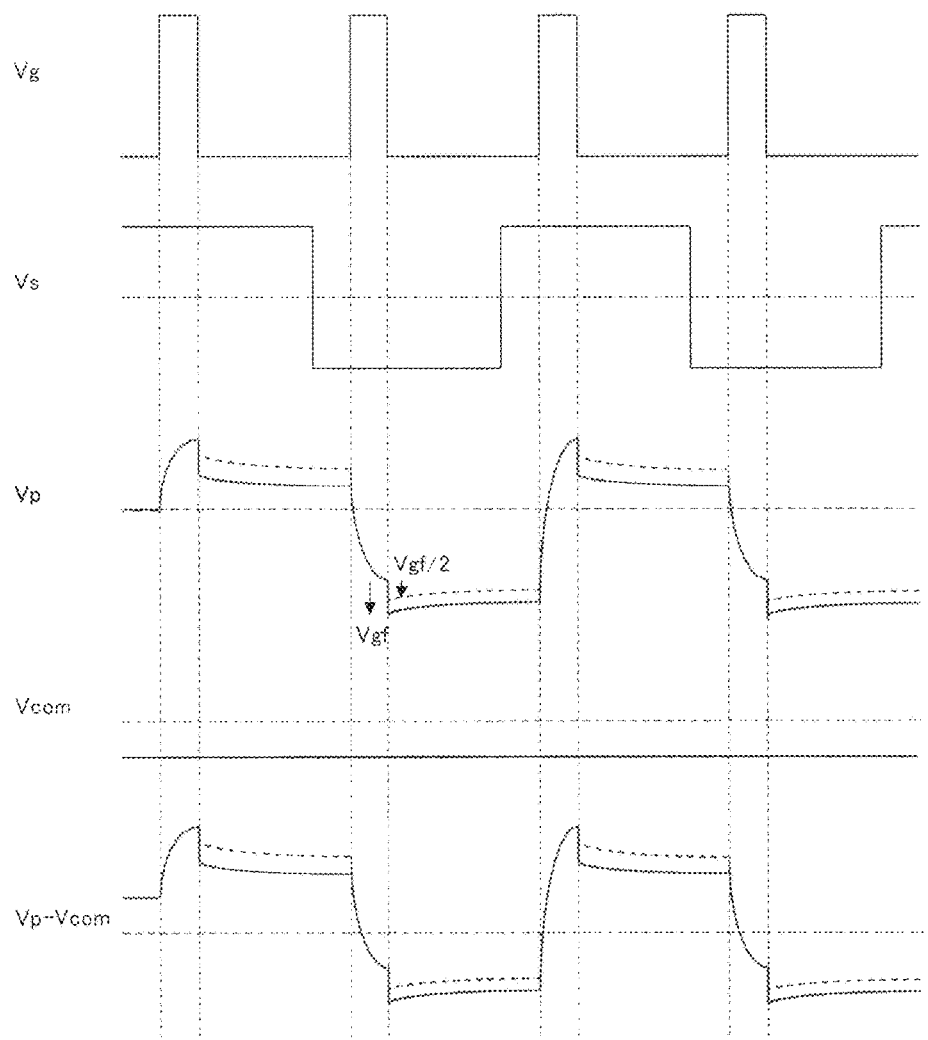
FIG. 17 is a waveform diagram illustrating an operation of a display device of the present invention.

In the case of an n channel TFT, the TFT is turned on in a period when the gate voltage Vg is plus (+). Specifically, as shown in FIG. 17, the gate feedthrough turns negative, causing an offset similar to that of p channel, although the direction is opposite. In other words, when the non-selected time alone is focused on, the voltage Vp-Vcom applied to the display medium is offset to a plus (+) side by the gate feedthrough difference Vgf/2.

When the influence of the gate feedthrough voltage Vgf on display is so small as can be ignored, Vgf/2 can also be ignored and thus there is no problem. When Vgf/2 cannot be ignored, it is necessary to correct the difference between the 2-TFT pixel and the 1-TFT pixel.

For example, in the case of an electrophoretic display, lightness is offset to either black or white due to the offset of Vgf/2. In the case of an electrophoretic member of a type that achieves black display with a plus (+) pixel potential, the display color is offset to a white side in the 1-TFT pixel (dotted line) shown in FIG. 15. This is because the voltage in the non-selected time of the 1-TFT pixel shown in FIG. 15 is offset by −Vgf/2 compared to the 2TFT (solid line). As a simple method for correcting the offset, it is effective that the lightness data of the 1-TFT-processed pixel portion is corrected in advance. For example, when pure black is 00h and pure white is FFh in hexadecimal notation, and original image data is 00h-FFh in hexadecimal notation, the original data is converted to 10h-FFh, with −10h being added to only the 1-TFT portion so as to be 00h-EFh, thereby correcting the 1-TFT portion to a black side. (The numerical values shown herein are only examples. The point is to correct the lightness data of 1-TFT pixel in a way of cancelling the influence of Vgf/2.) In the case of an electrophoretic member of a type that achieves white display with a plus (+) pixel potential, the display color is offset to a black side in the 1-TFT pixel (dotted line) shown in FIG. 15. This is because the voltage in the non-selected time of the 1-TFT pixel shown in FIG. 15 is offset by −Vgf/2 compared to the 2TFT (solid line). As a simple method for correcting the offset, it is effective that the chromaticity data of the 1-TFT-processed pixel portion is corrected in advance. For example, when pure black is 00h and pure white is FFh in hexadecimal notation, and original image data is 00h-EFh in hexadecimal notation, the original data is converted to 00h-EFh, with +10h being added to only the 1-TFT portion so as to be 10h-FFh, thereby correcting the 1-TFT portion to a white side.

In the case of n-channel TFT, correction can be similarly made as shown in FIG. 17, although the polarity is opposite to that of p channel. Specifically, in the case of an electrophoretic member of a type that achieves black display with a plus (+) pixel potential, the display color is offset to a black side in the 1-TFT pixel (dotted line) shown in FIG. 17. This is because the voltage in the non-selected time of the 1-TFT pixel shown in FIG. 17 is offset by +Vgf/2 compared to the 2TFT (solid line). As a simple method for correcting the offset, it is effective that the lightness data of the 1-TFT-processed pixel portion is corrected in advance. For example, when pure black is 00h and pure white is FFh in hexadecimal notation, and original image data is 00h-FFh in hexadecimal notation, the original data is converted to 00h-EFh, with +10h being added to only the 1-TFT portion so as to be 10h-FFh, thereby correcting the 1-TFT pixel to a white side. (The numerical values shown herein are only examples. The point is to correct the lightness data of 1-TFT pixel in a way of cancelling the influence of Vgf/2.) In the case of an electrophoretic member of a type that achieves white display with a plus (+) pixel potential, the display color is offset to a white side in the 1-TFT pixel (dotted line) shown in FIG. 17. This is because the voltage in the non-selected time of the 1-TFT pixel shown in FIG. 17 is offset by +Vgf/2 compared to the 2TFT (solid line). As a simple method for correcting the offset, it is effective that the chromaticity data of the 1-TFT-processed pixel portion is corrected in advance. For example, when pure black is 00h and pure white is FFh in hexadecimal notation, and original image data is 00h-FFh in hexadecimal notation, the original data is converted to 10h-FFh, with −10h being added to only the 1-TFT portion so as to be 00h-EFh, thereby correcting the 1-TFT portion to a black side.

Figure 16:
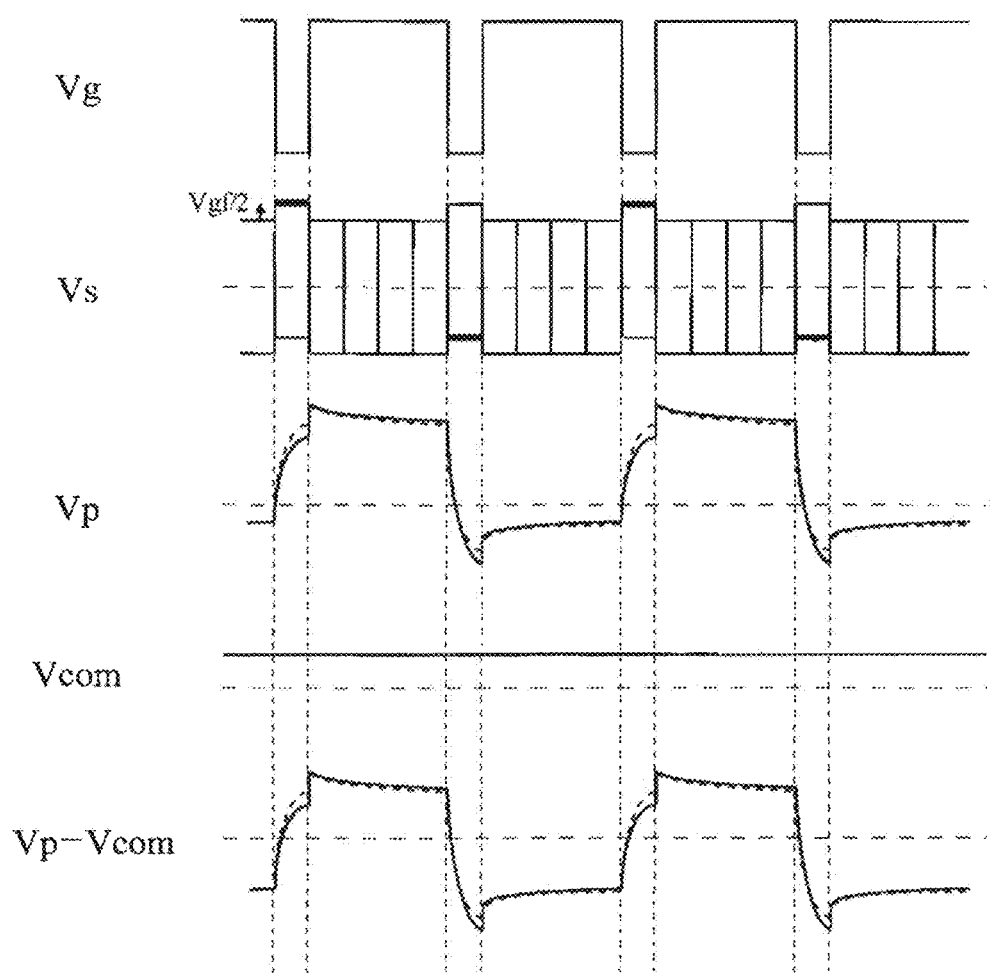
FIG. 16 is a waveform diagram illustrating an example of a display method of the present invention.
Figure 18:
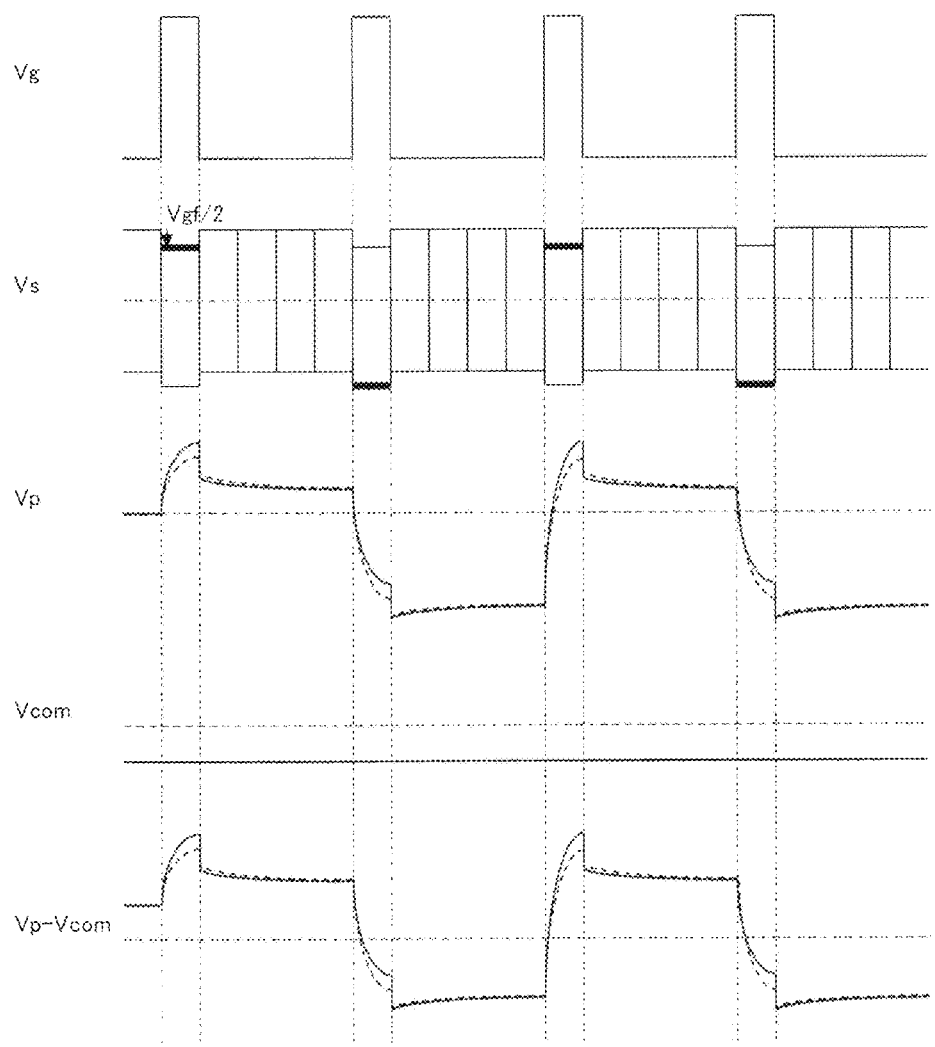
FIG. 18 is a waveform diagram illustrating an example of a display method of the present invention.
Figure 19:
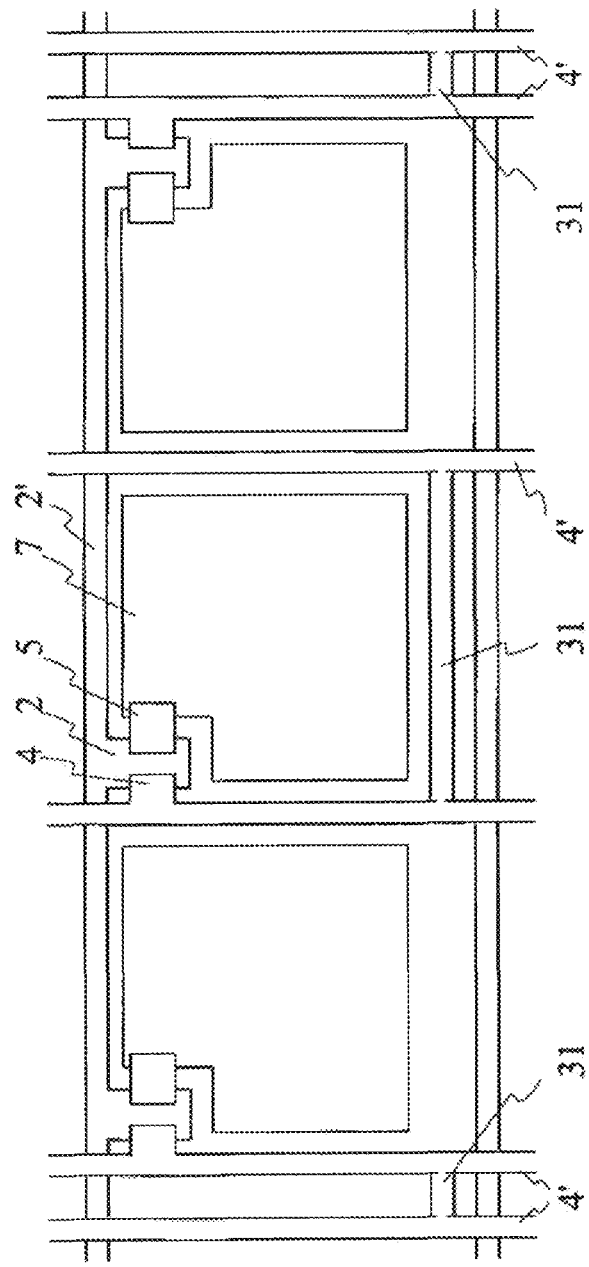
FIG. 19 is a plan view illustrating an example of a thin-film transistor array according to conventional art.
Figure 20:
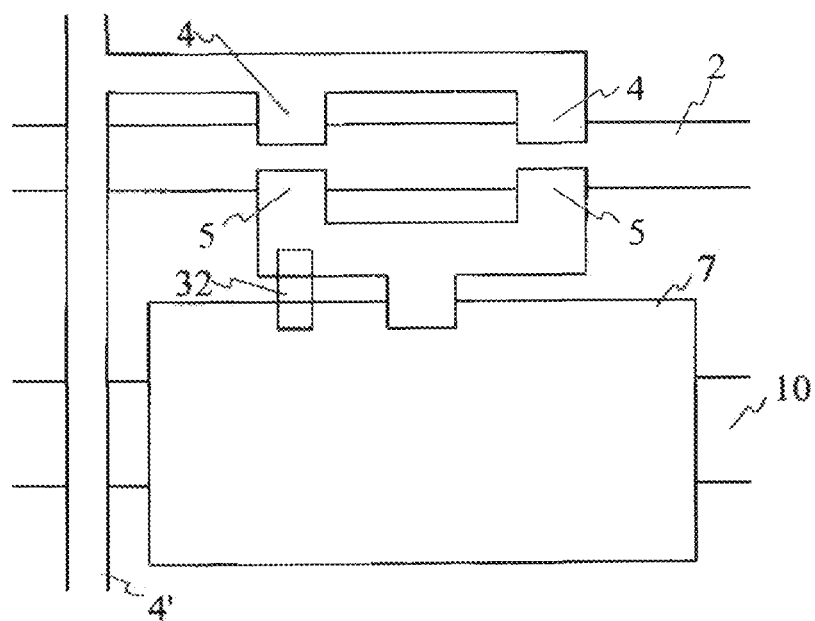
FIG. 20 is a plan view illustrating an example of a thin-film transistor array according to conventional art.

Alternatively, in the case of a liquid crystal display, direct-current components of a voltage applied to the liquid crystal cannot be cleared to zero due to the Vgf/2 offset, which easily leads to degradation. In this regard, it is effective to memorize the position of the 1-TFT-processed pixel, and offset the source voltage Vs only at the time point when the pixel is driven. For example, as shown in FIG. 16, the source voltage Vs at the pixel driving time point is offset by +Vgf/2 to permit the voltage Vd−Vcom to have a waveform approximate to the original waveform. In the case of n-channel TFT, correction can be similarly made, although the polarity is opposite as shown in FIG. 18.

In the case of the thin-film transistor arrays of the third and fourth embodiments, the second capacitor is cut off when a disconnection occurs in the drain-connecting electrode 5a or when laser cutting is conducted. Accordingly, the gate feedthrough voltage Vgf is retained to be unchanged and thus display is conducted normally.

EXAMPLES

Referring to FIGS. 1A to 1C and FIGS. 5A to 5D, hereinafter are described Examples 1 to 9 of the present invention.

Example 1

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a disconnection was confirmed in one portion of a source wiring 4'. In this case, laser cutting is not necessary.

Further, a polythiophene solution coating was applied by flexographic printing, followed by baking at 100° C. to thereby form the semiconductor patterns 6 arranged in a dot pattern (see (c) of FIG. 1A). Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a stripe pattern (see (e1) of FIG. 1B).

The thin-film transistors prepared in this way were provided thereon with an electrophoretic member, for sandwiching with a PET substrate having a transparent electrode.

As a result of active-matrix driving performed thereafter, a display that conformed to the lightness of inputted data was obtained.

Example 2

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a disconnection was confirmed in one portion of a drain-connecting electrode 5a. Although laser cutting was not necessary in this case, the position of the pixel in question was recorded as 1-TFT.

Further, a polythiophene solution coating was applied by flexographic printing, followed by baking at 100° C. to thereby form the semiconductor patterns 6 arranged in a dot pattern (see (c) of FIG. 1A). Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a stripe pattern (see (e1) of FIG. 1B).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 3

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between a source electrode 4 and a drain-connecting electrode 5a. Then, the laser cutting shown in FIG. 5B by (c) was performed and the position of the pixel in question was recorded as 1-TFT.

Further, a polythiophene solution coating was applied by flexographic printing, followed by baking at 100° C. to thereby form the semiconductor patterns 6 arranged in a dot pattern (see (c) of FIG. 1A). Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a stripe pattern (see (e1) of FIG. 1B).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 0011 to EFh. As a result of active-matrix driving performed thereafter, a display that conformed to the lightness of inputted data was obtained by the 2-TFT pixels as well as by the 1-TFT portion.

Example 4

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between adjacent source wirings 4', the portion being at a position where the pattern overlapped with the gate electrode 2 as the gate wiring 2'. Then, the laser cutting shown in FIG. 5B by (d) was performed and the position of the pixel in question was recorded as 1-TFT.

Further, a polythiophene solution coating was applied by flexographic printing, followed by baking at 100° C. to thereby form the semiconductor patterns 6 arranged in a dot pattern (see (c) of FIG. 1A). Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a stripe pattern (see (e1) of FIG. 1B).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1TFT portion.

Example 5

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between adjacent source wirings 4', the portion being at a position where the pattern overlapped with the capacitor electrode 10 as the capacitor wiring 10'. Then, the laser cutting shown in FIG. 5B by (e) was performed.

Further, a polythiophene solution coating was applied by flexographic printing, followed by baking at 100° C. to thereby form the semiconductor patterns 6 arranged in a dot pattern (see (c) of FIG. 1A). Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a stripe pattern (see (e1) of FIG. 1B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 6

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between adjacent source wirings 4', the portion being at a position where the pattern did not overlap with the gate electrode 2 as the gate wiring 2' or the capacitor electrode 10 as the capacitor wiring 10'. Then, the laser cutting shown in FIG. 5C by (f) was performed.

Further, a polythiophene solution coating was applied by flexographic printing, followed by baking at 100° C. to thereby form the semiconductor patterns 6 arranged in a dot pattern (see (c) of FIG. 1A). Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a stripe pattern (see (e1) of FIG. 1B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 7

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between a source wiring 4' and a pixel electrode 7, the portion being at a position where the pattern overlapped with the capacitor electrode 10 as the capacitor wiring 10'. Then, the laser cutting shown in FIG. 5C by (g) was performed.

Further, a polythiophene solution coating was applied by flexographic printing, followed by baking at 100° C. to thereby form the semiconductor patterns 6 arranged in a dot pattern (see (c) of FIG. 1A). Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a stripe pattern (see (e1) of FIG. 1B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 8

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between a source wiring 4' and a pixel electrode 7, the portion being at a position where the pattern did not overlap with the capacitor electrode 10 as the capacitor wiring 10'. Then, the laser cutting shown in FIG. 5D by (h) was performed.

Further, a polythiophene solution coating was applied by flexographic printing, followed by baking at 100° C. to thereby form the semiconductor patterns 6 arranged in a dot pattern (see (c) of FIG. 1A). Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a stripe pattern (see (e1) of FIG. 1B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 9

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between a pixel electrode 7 and a source-connecting electrode 4a, the portion being at a position where the pattern did not overlap with the capacitor electrode 10 as the capacitor wiring 10'. Then, the laser cutting shown in FIG. 5D by (i) was performed.

Further, a polythiophene solution coating was applied by flexographic printing, followed by baking at 100° C. to thereby form the semiconductor patterns 6 arranged in a dot pattern (see (c) of FIG. 1A). Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a stripe pattern (see (e1) of FIG. 1B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Referring to FIGS. 3A to 3C and FIGS. 6A to 6D, hereinafter are described Examples 10 to 18 of the present invention.

Example 10

First, an Al film 50 nm thick was formed by vapor deposition on PEN serving as the insulating substrate 1, followed by forming the gate electrodes 2, the gate wirings 2', the capacitor electrodes 10 and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A). Using an image inspection apparatus, the pattern was inspected for disconnections or short circuits. As a result, a disconnection was confirmed in one portion of a source wiring 4'.

Further, a polythiophene solution coating was applied by flexographic printing, followed by baking at 100° C. to thereby form the semiconductor patterns 6 in a stripe pattern (see (c) of FIG. 3A). Then, a fluorinated resin was screen-printed, followed by baking at 100° C. to thereby form the protective layer 6' in a stripe pattern (see (d) of FIG. 3B). In the case of disconnection in a source wiring 4', laser cutting is not necessary. Then, an epoxy resin was screen-printed to form the insulating film 8 in a stripe pattern (see (e1) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 11

First, an Al film 50 nm thick was formed by vapor deposition on PEN serving as the insulating substrate 1, followed by forming the gate electrodes 2, the gate wirings 2', the capacitor electrodes 10 and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A). Using an image inspection apparatus, the pattern was inspected for disconnections or short circuits. As a result, a disconnection was confirmed in one portion of a drain-connecting electrode 5a.

Further, a polythiophene solution coating was applied by flexographic printing, followed by baking at 100° C. to thereby form the semiconductor patterns 6 in a stripe pattern (see (c) of FIG. 3A). Then, a fluorinated resin was screen-printed, followed by baking at 100° C. to thereby form the protective layer 6' in a stripe pattern (see (d) of FIG. 3B). In the case of disconnection in a drain-connecting electrode 5a, laser cutting is not necessary. However, the position of the pixel in question was recorded as 1-TFT. Then, an epoxy resin was screen-printed to form the insulating film 8 in a stripe pattern (see (e1) of FIG. 3B).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 12

First, an Al film 50 nm thick was formed by vapor deposition on PEN serving as the insulating substrate 1, followed by forming the gate electrodes 2, the gate wirings 2', the capacitor electrodes 10 and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A). Using an image inspection apparatus, the pattern was inspected for disconnections or short circuits. As a result, a short circuit was confirmed in one portion between a source wiring 4' and a drain electrode 5.

Further, a polythiophene solution coating was applied by flexographic printing, followed by baking at 100° C. to thereby form the semiconductor patterns 6 in a stripe pattern (see (c) of FIG. 3A). Then, a fluorinated resin was screen-printed, followed by baking at 100° C. to thereby form the protective layer 6' in a stripe pattern (see (d) of FIG. 3B). Then, the laser cutting shown in FIG. 6B by (c) was conducted and at the same time the position of the pixel in question was recorded as 1-TFT. Then, an epoxy resin was screen-printed to form the insulating film 8 in a stripe pattern (see (e1) of FIG. 3B).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 13

First, an Al film 50 nm thick was formed by vapor deposition on PEN serving as the insulating substrate 1, followed by forming the gate electrodes 2, the gate wirings 2', the capacitor electrodes 10 and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A). Using an image inspection apparatus, the pattern was inspected for disconnections or short circuits. As a result, a short circuit was confirmed in one portion between adjacent source wirings 4', the portion being at a position where the pattern overlapped with a gate electrode 2.

Further, a polythiophene solution coating was applied by flexographic printing, followed by baking at 100° C. to thereby form the semiconductor patterns 6 in a stripe pattern (see (c) of FIG. 3A). Then, a fluorinated resin was screen-printed, followed by baking at 100° C. to thereby form the protective layer 6' in a stripe pattern (see (d) of FIG. 3B). Then, the laser cutting shown in FIG. 6B by (d) was conducted and at the same time the position of the pixel in question was recorded as 1-TFT. Then, an epoxy resin was screen-printed to form the insulating film 8 in a stripe pattern (see (e1) of FIG. 3B).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 14

First, an Al film 50 nm thick was formed by vapor deposition on PEN serving as the insulating substrate 1, followed by forming the gate electrodes 2, the gate wirings 2', the capacitor electrodes 10 and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A). Using an image inspection apparatus, the pattern was inspected for disconnections or short circuits. As a result, a short circuit was confirmed in one portion between adjacent source wirings 4', the portion being at a position where the pattern overlapped with a capacitor wiring 10'.

Further, a polythiophene solution coating was applied by flexographic printing, followed by baking at 100° C. to thereby form the semiconductor patterns 6 in a stripe pattern (see (c) of FIG. 3A). Then, a fluorinated resin was screen-printed, followed by baking at 100° C. to thereby form the protective layer 6' in a stripe pattern (see (d) of FIG. 3B). Then, the laser cutting shown in FIG. 6B by (e) was conducted. Then, an epoxy resin was screen-printed to form the insulating film 8 in a stripe pattern (see (e1) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 15

First, an Al film 50 nm thick was formed by vapor deposition on PEN serving as the insulating substrate 1, followed by forming the gate electrodes 2, the gate wirings 2', the capacitor electrodes 10 and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A). Using an image inspection apparatus, the pattern was inspected for disconnections or short circuits. As a result, a short circuit was confirmed in one portion between adjacent source wirings 4', the portion being at a position where the pattern did not overlap with a gate electrode 2 or a capacitor wiring 10'.

Further, a polythiophene solution coating was applied by flexographic printing, followed by baking at 100° C. to thereby form the semiconductor patterns 6 in a stripe pattern (see (c) of FIG. 3A). Then, a fluorinated resin was screen-printed, followed by baking at 100° C. to thereby form the protective layer 6' in a stripe pattern (see (d) of FIG. 3B). Then, the laser cutting shown in FIG. 6C by (f) was conducted. Then, an epoxy resin was screen-printed to form the insulating film 8 in a stripe pattern (see (e1) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 16

First, an Al film 50 nm thick was formed by vapor deposition on PEN serving as the insulating substrate 1, followed by forming the gate electrodes 2, the gate wirings 2', the capacitor electrodes 10 and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A). Using an image inspection apparatus, the pattern was inspected for disconnections or short circuits. As a result, a short circuit was confirmed in one portion between a source wiring 4' and a pixel electrode 7, the portion being at a position where the pattern overlapped with a capacitor wiring 10'.

Further, a polythiophene solution coating was applied by flexographic printing, followed by baking at 100° C. to thereby form the semiconductor patterns 6 in a stripe pattern (see (c) of FIG. 3A). Then, a fluorinated resin was screen-printed, followed by baking at 100° C. to thereby form the protective layer 6' in a stripe pattern (see (d) of FIG. 3B). Then, the laser cutting shown in FIG. 6C by (g) was conducted. Then, an epoxy resin was screen-printed to form the insulating film 8 in a stripe pattern (see (e1) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 17

First, an Al film 50 nm thick was formed by vapor deposition on PEN serving as the insulating substrate 1, followed by forming the gate electrodes 2, the gate wirings 2', the capacitor electrodes 10 and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A). Using an image inspection apparatus, the pattern was inspected for disconnections or short circuits. As a result, a short circuit was confirmed in one portion between a source wiring 4' and a pixel electrode 7.

Further, a polythiophene solution coating was applied by flexographic printing, followed by baking at 100° C. to thereby form the semiconductor patterns 6 in a stripe pattern (see (c) of FIG. 3A). Then, a fluorinated resin was screen-printed, followed by baking at 100° C. to thereby form the protective layer 6' in a stripe pattern (see (d) of FIG. 3B). Then, the laser cutting shown in FIG. 6D by (h) was conducted. Then, an epoxy resin was screen-printed to form the insulating film 8 in a stripe pattern (see (e1) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 18

First, an Al film 50 nm thick was formed by vapor deposition on PEN serving as the insulating substrate 1, followed by forming the gate electrodes 2, the gate wirings 2', the capacitor electrodes 10 and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A). Using an image inspection apparatus, the pattern was inspected for disconnections or short circuits. As a result, a short circuit was confirmed in one portion between a pixel electrode 7 and a source-connecting electrode 4a.

Further, a polythiophene solution coating was applied by flexographic printing, followed by baking at 100° C. to thereby form the semiconductor patterns 6 in a stripe pattern (see (c) of FIG. 3A). Then, a fluorinated resin was screen-printed, followed by baking at 100° C. to thereby form the protective layer 6' in a stripe pattern (see (d) of FIG. 3B). Then, the laser cutting shown in FIG. 6D by (i) was conducted. Then, an epoxy resin was screen-printed to form the insulating film 8 in a stripe pattern (see (e1) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Referring now to FIGS. 1A to 1C and FIGS. 5A to 5D, hereinafter are described Examples 19 to 27 of the present invention.

Example 19

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a disconnection was confirmed in one portion of a source wiring 4'.

Further, a polythiophene solution coating was applied by flexographic printing, followed by baking at 100° C. to thereby form the semiconductor patterns 6 arranged in a dot pattern (see (c) of FIG. 1A). In the case of a disconnection in a source wiring 4', laser cutting is not necessary. Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a dot pattern (see (e2) of FIG. 1B, however, the source-connecting electrodes 4a, which had already been covered with the protective layer, were not covered with the insulating film 8).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 20

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a disconnection was confirmed in one portion of a drain-connecting electrode 5a.

Further, a polythiophene solution coating was applied by flexographic printing, followed by baking at 100° C. to thereby form the semiconductor patterns 6 arranged in a dot pattern (see (c) of FIG. 1A). Although laser cutting was not necessary, the pixel in question was recorded as 1-TFT. Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a dot pattern (see (e2) of FIG. 1B, however, the source-connecting electrodes 4a, which had already been covered with the protective layer, were not covered with the insulating film 8).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 21

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between a source electrode 4 and a drain electrode 5 a drain-connecting electrode 5a.

Further, a polythiophene solution coating was applied by flexographic printing, followed by baking at 100° C. to thereby form the semiconductor patterns 6 arranged in a dot pattern (see (c) of FIG. 1A). Then, the laser cutting shown in FIG. 5B by (c) was conducted and at the same time the pixel in question was recorded as 1 TFT. Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a dot pattern (see (e2) of FIG. 1B, however, the source-connecting electrodes 4a, which had already been covered with the protective layer 6', were not covered with the insulating film 8).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 22

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between adjacent source wirings 4', the portion being at a position where the pattern overlapped with a gate electrode 2 as a gate wiring 2'.

Further, a polythiophene solution coating was applied by flexographic printing, followed by baking at 100° C. to thereby form the semiconductor patterns 6 arranged in a dot pattern (see (c) of FIG. 1A). Then, the laser cutting shown in FIG. 5B by (d) was conducted and at the same time the pixel in question was recorded as 1 TFT. Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a dot pattern (see (e2) of FIG. 1B, however, the source-connecting electrodes 4a, which had already been covered with the protective layer 6', were not covered m with the insulating film 8).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 23

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between adjacent source wirings 4', the portion being at a position where the pattern overlapped with a capacitor electrode 10 as a capacitor wiring 10'.

Further, a polythiophene solution coating was applied by flexographic printing, followed by baking at 100° C. to thereby form the semiconductor patterns 6 arranged in a dot pattern (see (c) of FIG. 1A). Then, the laser cutting shown in FIG. 5B by (e) was conducted. Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a dot pattern (see (e2) of FIG. 1B, however, the source-connecting electrodes 4a, which had already been covered with the protective layer 6', were not covered with the insulating film 8).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 24

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between adjacent source wirings 4', the portion being at a position where the pattern did not overlap with a gate electrode 2 as a gate wiring 2' or a capacitor electrode 10 as a capacitor wiring 10'.

Further, a polythiophene solution coating was applied by flexographic printing, followed by baking at 100° C. to thereby form the semiconductor patterns 6 arranged in a dot pattern (see (c) of FIG. 1A). Then, the laser cutting shown in FIG. 5C by (f) was conducted. Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a dot pattern (see (e2) of FIG. 1B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 25

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between a source wiring 4' and a pixel electrode 7, the portion being at a position where the pattern overlapped with a capacitor electrode 10 as a capacitor wiring 10'.

Further, a polythiophene solution coating was applied by flexographic printing, followed by baking at 100° C. to thereby form the semiconductor patterns 6 arranged in a dot pattern (see (c) of FIG. 1A). Then, the laser cutting shown in FIG. 5C by (g) was conducted. Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a dot pattern (see (e2) of FIG. 1B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 26

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between a source wiring 4' and a pixel electrode 7, the portion being at a position where the pattern did not overlap with a capacitor electrode 10 as a capacitor wiring 10'.

Further, a polythiophene solution coating was applied by flexographic printing, followed by baking at 100° C. to thereby form the semiconductor patterns 6 arranged in a dot pattern (see (c) of FIG. 1A). Then, the laser cutting shown in FIG. 5D by (h) was conducted. Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a dot pattern (see (e2) of FIG. 1B, however, the source-connecting electrodes 4a, which had already been covered with the protective layer 6', were not covered with the insulating film 8).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 27

First, an Al film 50 nm thick was formed by vapor deposition on PEN serving as the insulating substrate 1, followed by forming the gate electrodes 2 as the gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. As a result, a short circuit was confirmed in one portion between a pixel electrode 7 and a source-connecting electrode 4a, the portion being at a position where the pattern did not overlap with a capacitor electrode 10 as a capacitor wiring 10'.

Further, a polythiophene solution coating was applied by flexographic printing, followed by baking at 100° C. to thereby form the semiconductor patterns 6 arranged in a dot pattern (see (c) of FIG. 1A). Then, the laser cutting shown in FIG. 5D by (i) was conducted. Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a dot pattern (see (e2) of FIG. 1B, however, the source-connecting electrodes 4a, which had already been covered with the protective layer 6', were not covered with the insulating film 8).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Referring now to FIGS. 3A to 3C and FIGS. 6A to 6D, hereinafter are described Examples 28 to 36 of the present invention.

Example 28

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A).

Further, a polythiophene solution coating was applied by flexographic printing, followed by baking at 100° C. to thereby form the semiconductor patterns 6 arranged in a stripe pattern (see (c) of FIG. 3A). Then, a fluorinated resin was screen-printed, followed by baking at 100° C. to thereby form the protective layer 6' in a stripe pattern (see (d) of FIG. 3B). Using an image inspection apparatus, the pattern of electrodes and wirings was inspected for disconnections or short circuits. As a result, a disconnection was confirmed in one portion of a source wiring 4'. In the case of a disconnection occurring in a source wiring 4', laser cutting is not necessary. Then, an epoxy resin was screen-printed to form the insulating film 8 in a lattice pattern (see (e2) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 29

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A).

Further, a polythiophene solution coating was applied by flexographic printing, followed by baking at 100° C. to thereby form the semiconductor patterns 6 arranged in a stripe pattern (see (c) of FIG. 3A). Then, a fluorinated resin was screen-printed, followed by baking at 100° C. to thereby form the protective layer 6' in a stripe pattern (see (d) of FIG. 3B). Using an image inspection apparatus, the pattern of electrodes and wirings was inspected for disconnections or short circuits. As a result, a disconnection was confirmed in one portion of a drain-connecting electrode 5a. In the case of a disconnection occurring in a drain-connecting electrode 5a, laser cutting is not necessary. However, the position of the pixel in question was recorded as 1 TFT. Then, an epoxy resin was screen-printed to form the insulating film 8 in a lattice pattern (see (e2) of FIG. 3B).

The p-channel thin-film transistors prepared in this way were provided thereon with an electrophoretic member, for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 30

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A).

Further, a polythiophene solution coating was applied by flexographic printing, followed by baking at 100° C. to thereby form the semiconductor patterns 6 arranged in a stripe pattern (see (c) of FIG. 3A). Then, a fluorinated resin was screen-printed, followed by baking at 100° C. to thereby form the protective layer 6' in a stripe pattern (see (d) of FIG. 3B). Using an image inspection apparatus, the pattern of electrodes and wirings was inspected for disconnections or short circuits. As a result, a short circuit was confirmed in one portion between a source wiring 4' and a drain electrode 5. Then, the laser cutting shown in FIG. 6B by (c) was conducted and at the same time the position of the pixel in question was recorded as 1 TFT. Then, an epoxy resin was screen-printed to form the insulating film 8 in a lattice pattern (see (e2) of FIG. 3B).

The thin-film transistors prepared in this way were provided thereon with an electrophoretic member, for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 31

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A).

Further, a polythiophene solution coating was applied by flexographic printing, followed by baking at 100° C. to thereby form the semiconductor patterns 6 arranged in a stripe pattern (see (c) of FIG. 3A). Then, a fluorinated resin was screen-printed, followed by baking at 100° C. to thereby form the protective layer 6' in a stripe pattern (see (d) of FIG. 3B). Using an image inspection apparatus, the pattern of electrodes and wirings was inspected for disconnections or short circuits. As a result, a short circuit was confirmed in one portion between adjacent source wirings 4', the portion being at a position where the pattern overlapped with a gate electrode 2. Then, the laser cutting shown in FIG. 6B by (d) was conducted and at the same time the position of the pixel in question was recorded as 1 TFT. Then, an epoxy resin was screen-printed to form the insulating film 8 in a lattice pattern (see (e2) of FIG. 3B).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A).

Further, a polythiophene solution coating was applied by flexographic printing, followed by baking at 100° C. to thereby form the semiconductor patterns 6 arranged in a stripe pattern (see (c) of FIG. 3A). Then, a fluorinated resin was screen-printed, followed by baking at 100° C. to thereby form the protective layer 6' in a stripe pattern (see (d) of FIG. 3B). Using an image inspection apparatus, the pattern of electrodes and wirings was inspected for disconnections or short circuits. As a result, a short circuit was confirmed in one portion between adjacent source wirings 4', the portion being at a position where the pattern overlapped with a capacitor wiring 10'. Then, the laser cutting shown in FIG. 6B by (e) was conducted. Then, an epoxy resin was screen-printed to form the insulating film 8 in a lattice pattern (see (e2) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 33

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A).

Further, a polythiophene solution coating was applied by flexographic printing, followed by baking at 100° C. to thereby form the semiconductor patterns 6 arranged in a stripe pattern (see (c) of FIG. 3A). Then, a fluorinated resin was screen-printed, followed by baking at 100° C. to thereby form the protective layer 6' in a stripe pattern (see (d) of FIG. 3B). Using an image inspection apparatus, the pattern of electrodes and wirings was inspected for disconnections or short circuits. As a result, a short circuit was confirmed in one portion between adjacent source wirings 4', the portion being at a position where the pattern did not overlap with a gate electrode 2 or a capacitor wiring 10'. Then, the laser cutting shown in FIG. 6C by (f) was conducted. Then, an epoxy resin was screen-printed to form the insulating film 8 in a lattice pattern (see (e2) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 34

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A).

Further, a polythiophene solution coating was applied by flexographic printing, followed by baking at 100° C. to thereby form the semiconductor patterns 6 arranged in a stripe pattern (see (c) of FIG. 3A). Then, a fluorinated resin was screen-printed, followed by baking at 100° C. to thereby form the protective layer 6' in a stripe pattern (see (d) of FIG. 3B). Using an image inspection apparatus, the pattern of electrodes and wirings was inspected for disconnections or short circuits. As a result, a short circuit was confirmed in one portion between a source wiring 4' and a pixel electrode 7, the portion being at a position where the pattern overlapped with a capacitor wiring 10'. Then, the laser cutting shown in FIG. 6C by (g) was conducted. Then, an epoxy resin was screen-printed to form the insulating film 8 in a lattice pattern (see (e2) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A).

Further, a polythiophene solution coating was applied by flexographic printing, followed by baking at 100° C. to thereby form the semiconductor patterns 6 arranged in a stripe pattern (see (c) of FIG. 3A). Then, a fluorinated resin was screen-printed, followed by baking at 100° C. to thereby form the protective layer 6' in a stripe pattern (see (d) of FIG. 3B). Using an image inspection apparatus, the pattern of electrodes and wirings was inspected for disconnections or short circuits. As a result, a short circuit was confirmed in one portion between a source electrode 4 and a pixel electrode 7. Then, the laser cutting shown in FIG. 6D by (h) was conducted. Then, an epoxy resin was screen-printed to form the insulating film 8 in a lattice pattern (see (e2) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 36

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 3A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 3A).

Further, a polythiophene solution coating was applied by flexographic printing, followed by baking at 100° C. to thereby form the semiconductor patterns 6 arranged in a stripe pattern (see (c) of FIG. 3A). Then, a fluorinated resin was screen-printed, followed by baking at 100° C. to thereby form the protective layer 6' in a stripe pattern (see (d) of FIG. 3B). Using an image inspection apparatus, the pattern of electrodes and wirings was inspected for disconnections or short circuits. As a result, a short circuit was confirmed in one portion between a pixel electrode 7 and a source-connecting electrode 4a. Then, the laser cutting shown in FIG. 6D by (i) was conducted. Then, an epoxy resin was screen-printed to form the insulating film 8 in a lattice pattern (see (e2) of FIG. 3B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Referring now to FIGS. 1A to 1C and FIGS. 5A to 5D, hereinafter are described Examples 37 to 46 of the present invention.

Example 37

First, an Al film 50 nm thick was formed by vapor deposition on PEN serving as the insulating substrate 1, followed by forming the gate electrodes 2 as gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A).

Further, a polythiophene solution coating was applied by flexographic printing, followed by baking at 100° C. to thereby form the semiconductor patterns 6 arranged in a dot pattern (see (c) of FIG. 1A). Using an image inspection apparatus, the pattern of electrodes and wirings was inspected for disconnections or short circuits. As a result, a disconnection was confirmed in one portion of a source wiring 4'. Then, a fluorinated resin was screen-printed, followed by baking at 100° C. to thereby form the protective layer 6' in a stripe pattern (see (d) of FIG. 1B, however, the source-connecting electrodes 4a were not covered with the protective layer 6'). Laser cutting in this case is not necessary. Then, an epoxy resin was screen-printed to form the insulating film 8 in a lattice pattern (see (e3) of FIG. 1C, however, the source-connecting electrodes 4a were also covered with the insulating film 8).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 38

First, an Al film 50 nm thick was formed by vapor deposition on PEN serving as the insulating substrate 1, followed by forming the gate electrodes 2 as gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A).

Further, a polythiophene solution coating was applied by flexographic printing, followed by baking at 100° C. to thereby form the semiconductor patterns 6 arranged in a dot pattern (see (c) of FIG. 1A). Using an image inspection apparatus, the pattern of electrodes and wirings was inspected for disconnections or short circuits. As a result, a disconnection was confirmed in one portion of a drain-connecting electrode 5a. Then, a fluorinated resin was screen-printed, followed by baking at 100° C. to thereby form the protective layer 6' in a stripe pattern (see (d) of FIG. 1B, however, the source-connecting electrodes 4a were not covered with the protective layer 6'). Although laser cutting in this case was not necessary, the position of the pixel in question was recorded as 1 TFT. Then, an epoxy resin was screen-printed to form the insulating film 8 in a lattice pattern (see (e3) of FIG. 1C, however, the source-connecting electrodes 4a were also covered with the insulating film 8).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 39

First, an Al film 50 nm thick was formed by vapor deposition on PEN serving as the insulating substrate 1, followed by forming the gate electrodes 2 as gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A).

Further, a polythiophene solution coating was applied by flexographic printing, followed by baking at 100° C. to thereby form the semiconductor patterns 6 arranged in a dot pattern (see (c) of FIG. 1A). Using an image inspection apparatus, the pattern of electrodes and wirings was inspected for disconnections or short circuits. As a result, a short circuit was confirmed in one portion between a source electrode 4 and a drain electrode 5. Then, a fluorinated resin was screen-printed, followed by baking at 100° C. to thereby form the protective layer 6' in a stripe pattern (see (d) of FIG. 1B, however, the source-connecting electrodes 4a were not covered with the protective layer 6'). Then, the laser cutting shown in FIG. 5B by (c) was conducted and the position of the pixel in question was recorded as 1 TFT. Then, an epoxy resin was screen-printed to form the insulating film 8 in a lattice pattern (see (e3) of FIG. 1C, however, the source-connecting electrodes 4a were also covered with the insulating film 8).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 40

First, an Al film 50 nm thick was formed by vapor deposition on PEN serving as the insulating substrate 1, followed by forming the gate electrodes 2 as gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A).

Further, a polythiophene solution coating was applied by flexographic printing, followed by baking at 100° C. to thereby form the semiconductor patterns 6 arranged in a dot pattern (see (c) of FIG. 1A). Using an image inspection apparatus, the pattern of electrodes and wirings was inspected for disconnections or short circuits. As a result, a short circuit was confirmed in one portion between adjacent wirings 4', the portion being at a position where the pattern overlapped with a gate electrode 2 as a gate wiring 2'. Then, a fluorinated resin was screen-printed, followed by baking at 100° C. to thereby form the protective layer 6' in a stripe pattern (see (d) of FIG. 1B, however, the source-connecting electrodes 4a were not covered with the protective layer 6'). Then, the laser cutting shown in FIG. 5B by (d) was conducted and the position of the pixel in question was recorded as 1 TFT. Then, an epoxy resin was screen-printed to form the insulating film 8 in a lattice pattern (see (e3) of FIG. 1C, however, the source-connecting electrodes 4a were covered with the insulating film 8).

The p-channel thin-film transistors prepared in this way were provided thereon with an electrophoretic member (of a type that turns black, as viewed from the counter electrode side, when the pixel electrodes are plus (+)), for sandwiching with a PET substrate having a transparent electrode. Then, image data with a lightness of 00h-FFh was converted such that the 2-TFT pixels had a lightness of 10h-FFh and the 1-TFT pixel had a lightness of 00h to EFh. As a result of active-matrix driving performed thereafter, a display that conformed to the lightness of inputted data was obtained by the 2-TFT pixels as well as by the 1-TFT portion.

Example 41

First, an Al film 50 nm thick was formed by vapor deposition on PEN serving as the insulating substrate 1, followed by forming the gate electrodes 2 as gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A).

Further, a polythiophene solution coating was applied by flexographic printing, followed by baking at 100° C. to thereby form the semiconductor patterns 6 arranged in a dot pattern (see (c) of FIG. 1A). Using an image inspection apparatus, the pattern of electrodes and wirings was inspected for disconnections or short circuits. As a result, a short circuit was confirmed in one portion between adjacent wirings 4', the portion being at a position where the pattern overlapped with a capacitor electrode 10 as a capacitor wiring 10'. Then, a fluorinated resin was screen-printed, followed by baking at 100° C. to thereby form the protective layer 6' in a stripe pattern (see (d) of FIG. 1B, however, the source-connecting electrodes 4a were not covered with the protective layer 6'). Then, the laser cutting shown in FIG. 5B by (e) was conducted. Then, an epoxy resin was screen-printed to form the insulating film 8 in a lattice pattern (see (e3) of FIG. 1C, however, the source-connecting electrodes 4a were covered with the insulating film 8).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 42

First, an Al film 50 nm thick was formed by vapor deposition on PEN serving as the insulating substrate 1, followed by forming the gate electrodes 2 as gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A).

Further, a polythiophene solution coating was applied by flexographic printing, followed by baking at 100° C. to thereby form the semiconductor patterns 6 arranged in a dot pattern (see (c) of FIG. 1A). Using an image inspection apparatus, the pattern of electrodes and wirings was inspected for disconnections or short circuits. As a result, a short circuit was confirmed in one portion between adjacent wirings 4', the portion being at a position where the pattern did not overlap with a gate electrode 2 as a gate wiring 2' or a capacitor electrode 10 as a capacitor wiring 10'. Then, a fluorinated resin was screen-printed, followed by baking at 100° C. to thereby form the protective layer 6' in a stripe pattern (see (d) of FIG. 1B, however, the source-connecting electrodes 4a were not covered with the protective layer 6'). Then, the laser cutting shown in FIG. 5C by (f) was conducted. Then, an epoxy resin was screen-printed to form the insulating film 8 in a lattice pattern (see (e3) of FIG. 1C, however, the source-connecting electrodes 4a were covered with the insulating film 8).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 43

First, an Al film 50 nm thick was formed by vapor deposition on PEN serving as the insulating substrate 1, followed by forming the gate electrodes 2 as gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A).

Further, a polythiophene solution coating was applied by flexographic printing, followed by baking at 100° C. to thereby form the semiconductor patterns 6 arranged in a dot pattern (see (c) of FIG. 1A). Using an image inspection apparatus, the pattern of electrodes and wirings was inspected for disconnections or short circuits. As a result, a short circuit was confirmed in one portion between a source wiring 4' and a pixel electrode 7, the portion being at a position where the pattern overlapped with a capacitor electrode 10 as a capacitor wiring 10'. Then, a fluorinated resin was screen-printed, followed by baking at 100° C. to thereby form the protective layer 6' in a stripe pattern (see (d) of FIG. 1B, however, the source-connecting electrodes 4a were not covered with the protective layer 6'). Then, the laser cutting shown in FIG. 5C by (g) was conducted. Then, an epoxy resin was screen-printed to form the insulating film 8 in a lattice pattern (see (e3) of FIG. 1C, however, the source-connecting electrodes 4a were covered with the insulating film 8).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 44

First, an Al film 50 nm thick was formed by vapor deposition on PEN serving as the insulating substrate 1, followed by forming the gate electrodes 2 as gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A).

Further, a polythiophene solution coating was applied by flexographic printing, followed by baking at 100° C. to thereby form the semiconductor patterns 6 arranged in a dot pattern (see (c) of FIG. 1A). Using an image inspection apparatus, the pattern of electrodes and wirings was inspected for disconnections or short circuits. As a result, a short circuit was confirmed in one portion between a source wiring 4' and a pixel electrode 7, the portion being at a position where the pattern did not overlap with a capacitor electrode 10 as a capacitor wiring 10'. Then, a fluorinated resin was screen-printed, followed by baking at 100° C. to thereby form the protective layer 6' in a stripe pattern (see (d) of FIG. 1B, however, the source-connecting electrodes 4a were not covered with the protective layer 6'). Then, the laser cutting shown in FIG. 5D by (h) was conducted. Then, an epoxy resin was screen-printed to form the insulating film 8 in a lattice pattern (see (e3) of FIG. 1C, however, the source-connecting electrodes 4a were covered with the insulating film 8).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 45

First, an Al film 50 nm thick was formed by vapor deposition on PEN serving as the insulating substrate 1, followed by forming the gate electrodes 2 as gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A).

Further, a polythiophene solution coating was applied by flexographic printing, followed by baking at 100° C. to thereby form the semiconductor patterns 6 arranged in a dot pattern (see (c) of FIG. 1A). Using an image inspection apparatus, the pattern of electrodes and wirings was inspected for disconnections or short circuits. As a result, a short circuit was confirmed in one portion between a pixel electrode 7 and a source-connecting electrode 4a, the portion being at a position where the pattern did not overlap with a capacitor electrode 10 as a capacitor wiring 10'. Then, a fluorinated resin was screen-printed, followed by baking at 100° C. to thereby form the protective layer 6' in a stripe pattern (see (d) of FIG. 1B, however, the source-connecting electrodes 4a were not covered with the protective layer 6'). Then, the laser cutting shown in FIG. 5D by (i) was conducted. Then, an epoxy resin was screen-printed to form the insulating film 8 in a lattice pattern (see (e3) of FIG. 1C, however, the source-connecting electrodes 4a were covered with the insulating film 8).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 46

First, an Al film 50 nm thick was formed by vapor deposition on PEN serving as the insulating substrate 1, followed by forming the gate electrodes 2 as gate wirings 2', and the capacitor electrodes 10 as the capacitor wirings 10' by photolithography and wet etching (see (a) of FIG. 1A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 1A). Using an image inspection apparatus, the pattern was inspected for disconnections or short circuits. Laser cuttings shown in FIGS. 5A to 5D were conducted and the positions of the respective 1-TFT pixels were recorded.

Further, a polythiophene solution coating was applied by flexographic printing, followed by baking at 100° C. to thereby form the semiconductor patterns 6 arranged in a dot pattern (see (c) of FIG. 1A). Then, a fluorinated resin was screen-printed, followed by baking at 100° C. to thereby form the protective layer 6' in a stripe pattern (see (d) of FIG. 1B, however, the source-connecting electrodes 4a were also covered with the protective layer 6'). Then, an epoxy resin was screen-printed to form the insulating film 8 in a stripe pattern (see (e1) of FIG. 1B).

The thin-film transistors prepared in this way and the transparent counter electrode 12 of the counter substrate 11 made of PET were printed with an oriented film, followed by rubbing treatment.

Then, liquid crystal as the display medium 13 was provided on the transistors, for sandwiching with the counter electrode 12, followed by sealing the perimeter. Then, the retarder 14 and the polarizer 15 were affixed to the counter substrate 11 so as to be located on the opposite side of the counter electrode 12. Then, the resultant object was driven as shown in FIG. 16 and a desirable display with less degradation was obtained.

Referring to FIGS. 7A and 7B and FIGS. 11A to 11D, hereinafter are described Examples 47 to 55 of the present invention.

Example 47

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a disconnection was confirmed in one portion of a source wiring 4'. In this case, laser cutting is not necessary.

Further, a polythiophene solution coating was applied by flexographic printing, followed by baking at 100° C. to thereby form the semiconductor patterns 6 arranged in a dot pattern (see (c) of FIG. 7A). Then, a fluorinated resin was screen-printed, followed by baking at 100° C. to thereby form the protective layer 6' in a stripe pattern (see (d) of FIG. 7B, however, the source-connecting electrodes 4a were also covered with the protective layer 6'). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 48

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a disconnection was confirmed in one portion of a drain-connecting electrode 5a. In this case, the pixel electrode 7 was laser-cut as shown in FIG. 11A by (b).

Further, a polythiophene solution coating was applied by flexographic printing, followed by baking at 100° C. to thereby form the semiconductor patterns 6 arranged in a dot pattern (see (c) of FIG. 7A). Then, a fluorinated resin was screen-printed, followed by baking at 100° C. to thereby form the protective layer 6' in a stripe pattern (see (d) of FIG. 7B, however, the source-connecting electrodes 4a were also covered with the protective layer 6'). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 49

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between a source electrode 4 and a drain electrode 5. In this case, the laser cutting shown in FIG. 11B by (c) was conducted.

Further, a polythiophene solution coating was applied by flexographic printing, followed by baking at 100° C. to thereby form the semiconductor patterns 6 arranged in a dot pattern (see (c) of FIG. 7A). Then, a fluorinated resin was screen-printed, followed by baking at 100° C. to thereby form the protective layer 6' in a stripe pattern (see (d) of FIG. 7B, however, the source-connecting electrodes 4a were also covered with the protective layer 6'). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 50

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between adjacent source wirings 4', the portion being at a position where the pattern overlapped with a gate electrode 2 as a gate wiring 2'. Then, the laser cutting shown in FIG. 11B by (d) was conducted.

Further, a polythiophene solution coating was applied by flexographic printing, followed by baking at 100° C. to thereby form the semiconductor patterns 6 arranged in a dot pattern (see (c) of FIG. 7A). Then, a fluorinated resin was screen-printed, followed by baking at 100° C. to thereby form the protective layer 6' in a stripe pattern (see (d) of FIG. 7B, however, the source-connecting electrodes 4a were also covered with the protective layer 6'). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 51

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between adjacent source wirings 4', the portion being at a position where the pattern overlapped with a capacitor wiring 10'. Then, the laser cutting shown in FIG. 11B by (e) was conducted.

Further, a polythiophene solution coating was applied by flexographic printing, followed by baking at 100° C. to thereby form the semiconductor patterns 6 arranged in a dot pattern (see (c) of FIG. 7A). Then, a fluorinated resin was screen-printed, followed by baking at 100° C. to thereby form the protective layer 6' in a stripe pattern (see (d) of FIG. 7B, however, the source-connecting electrodes 4a were also covered with the protective layer 6'). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode.

As a result of active-matrix driving performed thereafter, a display that conformed to the lightness of inputted data was obtained.

Example 52

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between adjacent source wirings 4', the portion being at a position where the pattern did not overlap with a gate electrode 2 as a gate wiring 2', or a capacitor electrode 10 or a capacitor wiring 10'. Then, the laser cutting shown in FIG. 11C by (f) was conducted.

Further, a polythiophene solution coating was applied by flexographic printing, followed by baking at 100° C. to thereby form the semiconductor patterns 6 arranged in a dot pattern (see (c) of FIG. 7A). Then, a fluorinated resin was screen-printed, followed by baking at 100° C. to thereby form the protective layer 6' in a stripe pattern (see (d) of FIG. 7B, however, the source-connecting electrodes 4a were also covered with the protective layer 6'). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 53

First, an Al film 50 nm thick was formed by vapor deposition on PEN serving as the insulating substrate 1, followed by forming the gate electrodes 2 as the gate wirings 2', the capacitor electrodes 10 and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between a source wiring 4' and a pixel electrode 7, the portion being at a position where the pattern overlapped with a capacitor electrode 10 and a capacitor wiring 10'. Then, the laser cutting shown in FIG. 11C by (g) was conducted.

Further, a polythiophene solution coating was applied by flexographic printing, followed by baking at 100° C. to thereby form the semiconductor patterns 6 arranged in a dot pattern (see (c) of FIG. 7A). Then, a fluorinated resin was screen-printed, followed by baking at 100° C. to thereby form the protective layer 6' in a stripe pattern (see (d) of FIG. 7B, however, the source-connecting electrodes 4a were also covered with the protective layer 6'). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 54

First, an Al film 50 nm thick was formed by vapor deposition on PEN serving as the insulating substrate 1, followed by forming the gate electrodes 2 as the gate wirings 2', the capacitor electrodes 10 and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between a source wiring 4' and a pixel electrode 7, the portion being at a position where the pattern did not overlap with a capacitor electrode 10, and a capacitor wiring 10'. Then, the laser cutting shown in FIG. 11D by (h) was conducted.

Further, a polythiophene solution coating was applied by flexographic printing, followed by baking at 100° C. to thereby form the semiconductor patterns 6 arranged in a dot pattern (see (c) of FIG. 7A). Then, a fluorinated resin was screen-printed, followed by baking at 100° C. to thereby form the protective layer 6' in a stripe pattern (see (d) of FIG. 7B, however, the source-connecting electrodes 4a were also covered with the protective layer 6'). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 55

First, an Al film 50 nm thick was formed by vapor deposition on PEN serving as the insulating substrate 1, followed by forming the gate electrodes 2 as the gate wirings 2', the capacitor electrodes 10 and the capacitor wirings 10' by photolithography and wet etching (see (a) of FIG. 7A).

Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between a pixel electrode 7 and a source-connecting electrode 4a, the portion being at a position where the pattern did not overlap with a capacitor electrode 10, and a capacitor wiring 10'. Then, the laser cutting shown in FIG. 11D by (i) was conducted.

Further, a polythiophene solution coating was applied by flexographic printing, followed by baking at 100° C. to thereby form the semiconductor patterns 6 arranged in a dot pattern (see (c) of FIG. 7A). Then, a fluorinated resin was screen-printed, followed by baking at 100° C. to thereby form the protective layer 6' in a stripe pattern (see (d) of FIG. 7B, however, the source-connecting electrodes 4a were also covered with the protective layer 6'). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Referring to FIGS. 9A and 9B and FIGS. 12A to 12D, hereinafter are described Examples 56 to 64 of the present invention.

Example 56

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A). Using an image inspection apparatus, the pattern was inspected for disconnections or short circuits. As a result, a disconnection was confirmed in one portion of a source wiring.

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). In the case of a disconnection in a source wiring 4', laser cutting is not necessary. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 57

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A). Using an image inspection apparatus, the pattern was inspected for disconnections or short circuits. As a result, a disconnection was confirmed in one portion of a drain-connecting electrode 5a.

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). In this case of a disconnection in a drain-connecting electrode 5a, the pixel electrode 7 was laser-cut as shown in FIG. 12A by (b). Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 58

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A). Using an image inspection apparatus, the pattern was inspected for disconnections or short circuits. As a result, a short circuit was confirmed in one portion between a source wiring 4' and a drain electrode 5.

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Then, the laser cutting shown in FIG. 12B by (c) was conducted and at the same time the position of the pixel in question was recorded as 1 TFT. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 59

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A). Using an image inspection apparatus, the pattern was inspected for disconnections or short circuits. As a result, a short circuit was confirmed in one portion between adjacent source wirings 4', the portion being at a position where the pattern overlapped with a gate electrode 2.

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Then, the laser cutting shown in FIG. 12B by (d) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 60

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A). Using an image inspection apparatus, the pattern was inspected for disconnections or short circuits. As a result, a short circuit was confirmed in one portion between adjacent source wirings 4', the portion being at a position where the pattern overlapped with a capacitor wiring 10'.

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Then, the laser cutting shown in FIG. 12B by (e) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 61

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A). Using an image inspection apparatus, the pattern was inspected for disconnections or short circuits. As a result, a short circuit was confirmed in one portion between adjacent source wirings 4', the portion being at a position where the pattern did not overlap with a gate electrode 2 or a capacitor wiring 10'.

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Then, the laser cutting shown in FIG. 12C by (f) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 62

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A). Using an image inspection apparatus, the pattern was inspected for disconnections or short circuits. As a result, a short circuit was confirmed in one portion between a source wiring 4' and a pixel electrode 7, the portion being at a position where the pattern overlapped with a capacitor wiring 10'.

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Then, the laser cutting shown in FIG. 12C by (g) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 63

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A). Using an image inspection apparatus, the pattern was inspected for disconnections or short circuits. As a result, a short circuit was confirmed in one portion between a source electrode 4 and a pixel electrode 7.

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Then, the laser cutting shown in FIG. 12D by (h) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 64

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A). Using an image inspection apparatus, the pattern was inspected for disconnections or short circuits. As a result, a short circuit was confirmed in one portion between a pixel electrode 7 and a source-connecting electrode 4a.

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Then, the laser cutting shown in FIG. 12D by (i) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Referring now to FIGS. 7A and 7B and FIGS. 11A to 11D, hereinafter are described Example 65 to 73 of the present invention.

Example 65

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 µm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a disconnection was confirmed in one portion of a source wiring 4'.

Further, a polythiophene solution coating was applied by flexographic printing, followed by baking at 100° C. to thereby form the semiconductor patterns 6 arranged in a dot pattern (see (c) of FIG. 7A). In the case of a disconnection occurring in a source wiring 4', laser cutting is not necessary.

Then, a fluorinated resin was screen-printed, followed by baking at 100° C. to thereby form the protective layer 6' in a stripe pattern (see (d) of FIG. 7B). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 66

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a disconnection was confirmed in one portion of a drain-connecting electrode 5a.

Further, a polythiophene solution coating was applied by flexographic printing, followed by baking at 100° C. to thereby form the semiconductor patterns 6 arranged in a dot pattern (see (c) of FIG. 7A). The pixel electrode 7 was laser-cut as shown in FIG. 11A by (b). Then, a fluorinated resin was screen-printed, followed by baking at 100° C. to thereby form the protective layer 6' in a stripe pattern (see (d) of FIG. 7B). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 67

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion of between a source electrode 4 and a drain electrode 5.

Further, a polythiophene solution coating was applied by flexographic printing, followed by baking at 100° C. to thereby form the semiconductor patterns 6 arranged in a dot pattern (see (c) of FIG. 7A). Then, the laser cutting shown in FIG. 11B by (c) was conducted. Then, a fluorinated resin was screen-printed, followed by baking at 100° C. to thereby form the protective layer 6' in a stripe pattern (see (d) of FIG. 7B). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 68

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion of between adjacent source wirings 4', the portion being at a position where the pattern overlapped with a gate electrode 2 as a gate wiring 2'.

Further, a polythiophene solution coating was applied by flexographic printing, followed by baking at 100° C. to thereby form the semiconductor patterns 6 arranged in a dot pattern (see (c) of FIG. 7A). Then, the laser cutting shown in FIG. 11B by (d) was conducted. Then, a fluorinated resin was screen-printed, followed by baking at 100° C. to thereby form the protective layer 6' in a stripe pattern (see (d) of FIG. 7B). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 69

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between adjacent source wirings 4', the portion being at a position where the pattern overlapped with a capacitor wiring 10'.

Further, a polythiophene solution coating was applied by flexographic printing, followed by baking at 100° C. to thereby form the semiconductor patterns 6 arranged in a dot pattern (see (c) of FIG. 7A). Then, the laser cutting shown in FIG. 11B by (e) was conducted. Then, a fluorinated resin was screen-printed, followed by baking at 100° C. to thereby form the protective layer 6' in a stripe pattern (see (d) of FIG. 7B). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 70

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between adjacent source wirings 4', the portion being at a position where the pattern did not overlap with a gate electrode 2 as a gate wiring 2' or a capacitor electrode 10, and a capacitor wiring 10'.

Further, a polythiophene solution coating was applied by flexographic printing, followed by baking at 100° C. to thereby form the semiconductor patterns 6 arranged in a dot pattern (see (c) of FIG. 7A). Then, the laser cutting shown in FIG. 11C by (f) was conducted. Then, a fluorinated resin was screen-printed, followed by baking at 100° C. to thereby form the protective layer 6' in a stripe pattern (see (d) of FIG. 7B). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 71

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between a source wiring 4' and a pixel electrode 7, the portion being at a position where the pattern overlapped with a capacitor electrode 10, and a capacitor wiring 10'.

Further, a polythiophene solution coating was applied by flexographic printing, followed by baking at 100° C. to thereby form the semiconductor patterns 6 arranged in a dot pattern (see (c) of FIG. 7A). Then, the laser cutting shown in FIG. 11C by (g) was conducted. Then, a fluorinated resin was screen-printed, followed by baking at 100° C. to thereby form the protective layer 6' in a stripe pattern (see (d) of FIG. 7B). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 72

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between a source wiring 4' and a pixel electrode 7, the portion being at a position where the pattern did not overlap with a capacitor electrode 10, and a capacitor wiring 10'.

Further, a polythiophene solution coating was applied by flexographic printing, followed by baking at 100° C. to thereby form the semiconductor patterns 6 arranged in a dot pattern (see (c) of FIG. 7A). Then, the laser cutting shown in FIG. 11D by (h) was conducted. Then, a fluorinated resin was screen-printed, followed by baking at 100° C. to thereby form the protective layer 6' in a stripe pattern (see (d) of FIG. 7B). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 73

First, an Al film 50 nm thick was formed by vapor deposition on PEN serving as the insulating substrate 1, followed by forming the gate electrodes 2 as the gate wirings 2', the capacitor electrodes 10, and the capacitor wirings 10' by photolithography and wet etching (see (a) of FIG. 7A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 7A). Using an image inspection apparatus, the pattern was inspected for disconnections or short circuits. As a result, a short circuit was confirmed in one portion between a pixel electrode 7 and a source-connecting electrode 4a, the portion being at a position where the pattern did not overlap with a capacitor electrode 10, and a capacitor wiring 10'.

Further, a polythiophene solution coating was applied by flexographic printing, followed by baking at 100° C. to thereby form the semiconductor patterns 6 arranged in a dot pattern (see (c) of FIG. 7A). Then, the laser cutting shown in FIG. 11D by (i) was conducted. Then, a fluorinated resin was screen-printed, followed by baking at 100° C. to thereby form the protective layer 6' in a stripe pattern (see (d) of FIG. 7B). Then, an epoxy resin was screen-printed to form the insulating film 8 (see (e) of FIG. 7B), followed by screen printing of an Ag paste to thereby form the upper pixel electrodes 9 (see (f) of FIG. 7B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Referring now to FIGS. 9A and 9B and FIGS. 12A to 12D, hereinafter are described Examples 74 to 82 of the present invention.

Example 74

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A).

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Using an image inspection apparatus, the pattern of electrodes and wirings was inspected for disconnections or short circuits. As a result, a disconnection was confirmed in one portion of a source wiring 4. In the case of a disconnection occurring in a source wiring 4', laser cutting is not necessary. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 75

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A).

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Using an image inspection apparatus, the pattern of electrodes and wirings was inspected for disconnections or short circuits. As a result, a disconnection was confirmed in one portion of a drain-connecting electrode 5a. In this case of a disconnection occurring in a drain-connecting electrode 5a, the pixel electrode 7 was laser-cut as shown in FIG. 12A by (b). Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 76

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A).

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Using an image inspection apparatus, the pattern of electrodes and wirings was inspected for disconnections or short circuits. As a result, a short circuit was confirmed in one portion between a source wiring 4' and a drain electrode 5. Then, the laser cutting shown in FIG. 12B by (c) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 77

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A).

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Using an image inspection apparatus, the pattern of electrodes and wirings was inspected for disconnections or short circuits. As a result, a short circuit was confirmed in one portion between adjacent source wirings 4', the portion being at a position where the pattern overlapped with a gate electrode 2. Then, the laser cutting shown in FIG. 12B by (d) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 78

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A).

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Using an image inspection apparatus, the pattern of electrodes and wirings was inspected for disconnections or short circuits. As a result, a short circuit was confirmed in one portion between adjacent source wirings 4', the portion being at a position where the pattern overlapped with a capacitor wiring 10'. Then, the laser cutting shown in FIG. 12B by (e) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 79

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A).

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Using an image inspection apparatus, the pattern of electrodes and wirings was inspected for disconnections or short circuits. As a result, a short circuit was confirmed in one portion between adjacent source wirings 4', the portion being at a position where the pattern did not overlap with a gate electrode 2 or a capacitor wiring 10'. Then, the laser cutting shown in FIG. 12C by (f) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 80

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A).

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Using an image inspection apparatus, the pattern of electrodes and wirings was inspected for disconnections or short circuits. As a result, a short circuit was confirmed in one portion between a source wiring 4' and a pixel electrode 7, the portion being at a position where the pattern overlapped with a capacitor wiring 10'. Then, the laser cutting shown in FIG. 12C by (g) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 81

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A).

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Using an image inspection apparatus, the pattern of electrodes and wirings was inspected for disconnections or short circuits. As a result, a short circuit was confirmed in one portion between a source electrode 4 and a pixel electrode 7. Then, the laser cutting shown in FIG. 12D by (h) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Example 82

First, an Al film 50 nm thick was formed by vapor deposition on PEN serving as the insulating substrate 1, followed by forming the gate electrodes 2, the gate wirings 2', the capacitor electrodes 10, and the capacitor wirings 10' by photolithography and wet etching (see (a) of FIG. 9A). Then, a polyvinyl phenol solution was applied by spin coating and baked at 150° C. to thereby form a polyvinyl phenol gate insulator film 1 μm thick. Further, as the source electrodes 4, the source wirings 4', the source-connecting electrodes 4a, the drain electrodes 5, the drain-connecting electrodes 5a and the pixel electrodes 7, a pattern was formed by offset printing of an Ag ink, followed by baking at 180° C. (see (b) of FIG. 9A).

Further, a polythiophene solution coating was applied by flexographic printing, followed by baking at 100° C. to thereby form the semiconductor patterns 6 arranged in a stripe pattern (see (c) of FIG. 9A). Then, a fluorinated resin was screen-printed, followed by baking at 100° C. to thereby form the protective layer 6' in a stripe pattern (see (d) of FIG. 9B). Using an image inspection apparatus, the pattern of electrodes and wirings was inspected for disconnections or short circuits. As a result, a short circuit was confirmed in one portion between a pixel electrode 7 and a source-connecting electrode 4a. Then, the laser cutting shown in FIG. 12D by (i) was conducted. Then, an epoxy resin was screen-printed to form the insulating film 8 (see (e) of FIG. 9B), followed by screen printing of an Ag paste to thereby form the upper pixel electrodes 9 (see (f) of FIG. 9B).

The thin-film transistors prepared in this way were provided thereon with an electrophoretic member, for sandwiching with a PET substrate having a transparent electrode. As a result of active-matrix driving performed thereafter, a display that conformed to the lightness of inputted data was obtained.

Comparative Example 1

The panel of Example 46 was driven according to the conventional art which did not take account of 1-TFT pixels, instead of being driven as shown in FIG. 16. As a result, pixels showed less color change and thus degradation was recognized.

Comparative Example 2

Comparative examples of the present invention will be described. The panels prepared in Examples 1 to 9 were subjected to active-matrix driving without making corrections to image data. As a result, when the 1-TFT portion was concerned, lightness value L* of black was higher by about five, and the lightness value L* of white was higher by about two. This will not be easily noticed in black-and-white binary display but raises a problem in gradation display.

As can be understood from the above description, the present invention has the following advantageous effects. First, there can be provided a thin-film transistor array and fabrication method therefor, an image display device, and a display method, which is appropriate for repairing various types of short circuits while minimizing the influences of disconnections. Further, there can be provided a thin-film transistor array and fabrication method therefor, an image display device, and a display method, which is able to reduce a change in display after repair.

The present invention has been made in light of the situation of the conventional art and has as its object to provide a thin-film transistor array, fabrication method therefor, an image display device, and a display method, which are suitable for repairing various types of short circuits while minimizing the influence of disconnections and are able to reduce the change in display after repair.

One aspect of the present invention for solving the above problem is a thin-film transistor array including thin-film transistors each having a configuration in which a gate electrode, a gate wiring connected to the gate electrode, a capacitor electrode, and a capacitor wiring connected to the capacitor electrode are provided on an insulating substrate, with a source electrode and a drain electrode having a gap therebetween and including a semiconductor pattern being formed, in a region overlapping with the gate electrode via a gate insulator film, the semiconductor pattern being covered with a protective layer, two such thin-film transistors being independently formed for each pixel, two source electrodes in each pixel being separately connected to two respective source wirings, two drain electrodes being connected to an electrode of the pixel via individual drain-connecting electrodes. The thin-film transistor array includes source-connecting electrodes each connecting between the source electrodes of the two thin-film transistors formed for each pixel. The same drive waveform is applied to two source wirings.

The source-connecting electrode may at least have a portion not overlapping with the gate electrode or the gate wiring.

The protective layer may be in a stripe pattern and arranged along the gate wirings, while covering not only the semiconductor patterns but also the gate wirings.

The thin-film transistor array may further include an insulating film that covers at least the source wirings.

The protective layer may be in a stripe pattern and arranged along the source wirings, while covering not only the semiconductor patterns but also the source wirings.

The thin-film transistor array may further include an insulating film that covers at least the source-connecting electrodes and the gate wirings.

Each pixel electrode may have a first capacitor near the drain electrodes, and a second capacitor remote from the drain electrodes.

The capacitor electrode may have a slit in a region overlapping with at least the pixel electrode, the slit dividing the capacitor electrode into a first capacitor electrode near the drain electrodes, and a second capacitor electrode remote from the drain electrodes.

The first capacitor may be composed of a pixel electrode, a gate insulator film and a first capacitor electrode, and the second capacitor may be composed of a pixel electrode, a gate insulator film and a second capacitor electrode.

The thin-film transistor array may further include: an insulating film having an opening located above the first capacitor portion of the pixel electrode and at least covering the second capacitor portion of the pixel electrode, the source electrodes, the source-connecting electrode, and the source wirings; and an upper pixel electrode provided on the insulating film and connected to the pixel electrode via the opening.

Another aspect of the present invention is a method for fabricating the thin-film transistor array including: a step of forming gate electrodes, gate wirings, capacitor electrodes and capacitor wirings on an insulating substrate; a step of forming a gate insulator film on the gate electrodes, the gate wirings, the capacitor electrodes and the capacitor wirings; a step of forming source electrodes, source wirings, source-connecting electrodes, drain electrodes, drain-connecting electrodes and pixel electrodes on the gate insulator film; a step of inspecting the source electrodes, the source wirings, the source-connecting electrodes, the drain electrodes, the drain-connecting electrodes and the pixel electrodes, for disconnections or short circuits; a step of laser-cutting at least one of the short circuited portions, the source wiring, the source-connecting electrode and the drain-connecting electrode according to results of the inspection; a step of forming semiconductors; and a step of forming a protective layer that protects the semiconductors, wherein: the step of laser-cutting is performed some time after the step of inspection.

The step of inspection for disconnections or short circuits may be an image inspection.

In the step of laser-cutting: 1) when a short circuit occurs between a source electrode and a drain electrode, cutting may be performed in a drain-connecting electrode of a thin-film transistor having the short circuit, at a position not overlapping with a gate electrode, a gate wiring, a capacitor electrode or a capacitor wiring; 2) when a short circuit occurs between adjacent source wirings on a gate electrode or a gate wiring, cutting is performed on at least one source wiring side having the short circuit, in two portions sandwiching the short circuited portion of the source wiring and in a drain-connecting electrode and a source-connecting electrode of a thin-film transistor nearest the short circuited portion, each portion being at a position not overlapping with a gate electrode, a gate wiring, a capacitor electrode or a capacitor wiring; 3) when a short circuit occurs between adjacent source wirings on a capacitor electrode or a capacitor wiring, cutting is performed on at least one source wiring side having the short circuit, in two portions sandwiching the short circuited portion of the source wiring, each portion being at a position not overlapping with a gate electrode, a gate wiring, a capacitor electrode or a capacitor wiring; 4) when a short circuit occurs between adjacent source wirings at a position not overlapping with a gate electrode, a gate wiring, a capacitor electrode or a capacitor wiring, cutting may be performed in the short circuited portion; 5) when a short circuit occurs between a source wiring and a pixel electrode on a capacitor electrode or a capacitor wiring, cutting may be performed in two portions sandwiching the short circuited portion of the source wiring, each portion being at a position not overlapping with a gate electrode, a gate wiring, a capacitor electrode or a capacitor wiring; 6) when a short circuit occurs between a source wiring or a source electrode and a pixel electrode at a position not overlapping with a gate electrode, a gate wiring, a capacitor electrode or a capacitor wiring, cutting may be performed in the short circuited portion; and 7) when a short circuit occurs between a pixel electrode and a source-connecting electrode, cutting may be performed in the short circuited portion, at a position not overlapping with a gate electrode, a gate wiring, a capacitor electrode or a capacitor wiring.

In the step of laser-cutting: 1) when a short circuit occurs between a source electrode and a drain electrode, cutting may be performed in a drain-connecting electrode of a thin-film transistor having the short circuit, at a position not overlapping with a gate electrode, a gate wiring, a capacitor electrode and a capacitor wiring, and cutting may be performed in a pixel electrode, at a position between the first capacitor and the second capacitor; 2) when a short circuit occurs between adjacent source wirings on a gate electrode or a gate wiring, cutting is performed on at least one source wiring side having the short circuit, in two portions sandwiching the short circuited portion of the source wiring and in a drain-connecting electrode and a source-connecting electrode of a thin-film transistor nearest the short circuited portion, each portion being at a position not overlapping with a gate electrode, a gate wiring, a capacitor electrode or a capacitor wiring, and cutting is performed in a pixel electrode, at a position between the first capacitor and the second capacitor; 3) when a short circuit occurs between adjacent source wirings on a capacitor electrode or a capacitor wiring, cutting is performed on at least one source wiring side having the short circuit, in two portions sandwiching the short circuited portion of the source wiring, each portion being at a position not overlapping with a gate electrode, a gate wiring, a capacitor electrode or a capacitor wiring; 4) when a short circuit occurs between adjacent source wirings at a position not overlapping with a gate electrode, a gate wiring, a capacitor electrode or a capacitor wiring, cutting may be performed in the short circuited portion; 5) when a short circuit occurs between a source wiring and a pixel electrode on a capacitor electrode or a capacitor wiring, cutting may be performed in two portions sandwiching the short circuit portion in the source wiring, each portion being at a position not overlapping with a gate electrode, a gate wiring, a capacitor electrode or a capacitor wiring; 6) when a short circuit occurs between a source wiring and a pixel electrode at a position not overlapping with a gate electrode, a gate wiring, a capacitor electrode or a capacitor wiring, cutting may be performed in the short circuited portion; 7) when short circuit occurs between a pixel electrode and a source-connecting electrode, cutting may be performed in the short circuited portion, at a position not overlapping with a gate wiring or a capacitor electrode; and 8) when a disconnection occurs in a drain-connecting electrode, cutting may be performed in a pixel electrode of a thin-film transistor having the disconnection, at a position between the first capacitor and the second capacitor.

The method for fabricating the thin-film transistor array may further include a step of forming an insulating film.

The method for fabricating the thin-film transistor array may further include a step of forming upper pixel electrodes.

Another aspect of the present invention is an image display device including a display medium sandwiched between a thin-film transistor array prepared by the method for fabricating a thin-film transistor array described above, and another substrate having a counter electrode.

Another aspect of the present invention is a display method for the image display device, wherein the display medium is an electrophoretic member, the method including memorizing a position of a pixel in which one of two thin-film transistors has been cut off, and correcting lightness of original data of the pixel.

The display medium may be liquid crystal and the method may include memorizing a position of a pixel in which one of two thin-film transistors has been cut off, and correcting a source voltage at the time when the pixel is driven.

According to the present invention, there is provided a thin-film transistor array and fabrication method therefor, an image display device, and a display method, which are appropriate for repairing various types of short circuits, while minimizing influences of disconnections, and which are able to reduce a change in display after repair.

The present invention can be applied to thin-film transistor arrays used for electrophoretic displays, liquid crystal displays or the like.

DESCRIPTION OF REFERENCE SIGNS

1 Insulating substrate
2 Gate electrode
2' Gate wiring
4 Source electrode
4' Source wiring
4a Source-connecting electrode
5 Drain electrode
5a Drain-connecting electrode
6 Semiconductor pattern
6' Protective layer
7 Pixel electrode
7A First capacitor portion of Pixel electrode
7B Second capacitor portion of Pixel electrode
8 Insulating film
8H Opening of Insulation film
9 Upper pixel electrode
10 Capacitor electrode
10A First capacitor electrode
10B Second capacitor electrode
10' Capacitor wiring
10'A First capacitor wiring
10'B Second capacitor wiring
11 Counter substrate
12 Counter electrode
13 Display medium
14 Retarder
15 Polarizer
21 Disconnection
22 Short circuit
23 Position (laser cutting portion)
31 Cross-bridge
32 Laser-bonded portion Obviously, numerous modifications and variations of the present invention are possible in light of the above teachings. It is therefore to be understood that within the scope of the appended claims, the invention may be practiced otherwise than as specifically described herein.

What is claimed is:

1. A thin-film transistor array, comprising:
a plurality of thin-film transistors each having a configuration in which a gate electrode, a gate wiring connected to the gate electrode, capacitor electrode, and a capacitor wiring connected to the capacitor electrode are provided on an insulating substrate, with a source electrode and a drain electrode having a gap therebetween and including a semiconductor pattern being formed, in a region overlapping with the gate electrode via a gate insulator film, the semiconductor pattern being covered with a protective layer, two thin-film transistors of the plurality of thin-film transistors being independently formed for each pixel, two source electrodes in each pixel being separately connected to two respective source wirings, two drain electrodes each being directly connected to an electrode of the pixel via respective drain-connecting electrodes,
wherein the thin-film transistor array includes source-connecting electrodes each connecting between the source electrodes of the two thin-film transistors formed for each pixel,
wherein the protective layer is in a stripe pattern and formed along the gate wirings such that the protective layer covers the semiconductor patterns and the source wirings,
wherein the protective layer does not cover a portion of the source-connecting electrodes, and
wherein the thin-film transistor array includes an insulating film that covers the source wirings and the portion of the source-connecting electrodes not covered by the protective layer.

2. The thin-film transistor array according to claim 1, wherein the source-connecting electrode has a portion not overlapping with the gate electrode or the gate wiring.

3. The thin-film transistor array according to claim 1, wherein the protective layer is in a stripe pattern and formed along the gate wirings such that the protective layer covers the semiconductor patterns and the gate wirings.

4. The thin-film transistor array according to claim 1, wherein each pixel electrode has a first capacitor near the drain electrodes, and a second capacitor remote from the drain electrodes.

5. The thin-film transistor array according to claim 4, wherein the capacitor electrode has a slit in a region overlapping with the pixel electrode such that the slit divides the capacitor electrode into a first capacitor electrode near drain electrodes, and a second capacitor electrode remote from the drain electrodes,
the first capacitor includes a pixel electrode, a gate insulator film and a first capacitor electrode, and
the second capacitor includes a pixel electrode, a gate insulator film and a second capacitor electrode.

6. The thin-film transistor array according to claim 4, wherein the insulating film includes an opening formed over the first capacitor portion of the pixel electrode, and
wherein an upper pixel electrode is formed on the insulating film and connected to the pixel electrode via the opening.

7. The thin-film transistor array according to claim 1, wherein a portion of each drain electrode is perpendicular to the respective drain-connecting electrode.

* * * * *